(12) United States Patent
Bockstaller et al.

(10) Patent No.: US 10,934,383 B2
(45) Date of Patent: Mar. 2, 2021

(54) COMPOSITE COMPOSITIONS AND MODIFICATION OF INORGANIC PARTICLES FOR USE IN COMPOSITE COMPOSITIONS

(71) Applicant: CARNEGIE MELLON UNIVERSITY, Pittsburgh, PA (US)

(72) Inventors: Michael R. Bockstaller, Pittsburgh, PA (US); Amir Khabibullin, Toronto (CA); Zongyu Wang, Pittsburgh, PA (US); Hangjun Ding, Wexford, PA (US); Guojun Xie, Pittsburgh, PA (US); Krzysztof Matyjaszewski, Pittsburgh, PA (US); Jiajun Yan, Pittsburgh, PA (US); Zhao Lu, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 95 days.

(21) Appl. No.: 16/072,605

(22) PCT Filed: Jan. 24, 2017

(86) PCT No.: PCT/US2017/014723
§ 371 (c)(1),
(2) Date: Jul. 25, 2018

(87) PCT Pub. No.: WO2017/132137
PCT Pub. Date: Aug. 3, 2017

(65) Prior Publication Data
US 2019/0031810 A1    Jan. 31, 2019

Related U.S. Application Data

(60) Provisional application No. 62/388,308, filed on Jan. 25, 2016.

(51) Int. Cl.
    *C08K 3/22* (2006.01)
    *C08K 3/36* (2006.01)
    (Continued)

(52) U.S. Cl.
    CPC ........ *C08F 293/005* (2013.01); *C08F 292/00* (2013.01); *C08K 3/22* (2013.01);
    (Continued)

(58) Field of Classification Search
    None
    See application file for complete search history.

(56) References Cited

U.S. PATENT DOCUMENTS 3,370,017 A    2/1968  Bergn
5,279,645 A    1/1994  Rijkeboer
(Continued)

FOREIGN PATENT DOCUMENTS

WO    WO2015059258 A1    4/2015
WO    WO2017132137 A1    8/2017

OTHER PUBLICATIONS

Bailly, M. et al., "Preparation and characterization of thermoplastic olefin/nanosilica composites using a silane-grafted polypropylene matrix". Polymer 2009, 50(11), 2472-2480. (Year: 2009).*
(Continued)

*Primary Examiner* — Richard A Huhn
(74) *Attorney, Agent, or Firm* — Bartony & Associates, LLC

(57) ABSTRACT

A composition formed by dispersing at least a plurality of first particles within a matrix material and dispersing at least a plurality of second particles within the matrix material, the second particles being different from the first particles, wherein interaction between the at least a plurality of second particles and the at least a plurality of first particles deter-
(Continued)

mines a spatial distribution of the plurality of second particles within the matrix material.

26 Claims, 17 Drawing Sheets

(51) Int. Cl.
<table>
<tr><td>C08F 292/00</td><td>(2006.01)</td></tr>
<tr><td>C08F 293/00</td><td>(2006.01)</td></tr>
<tr><td>C08L 39/00</td><td>(2006.01)</td></tr>
<tr><td>C08L 35/00</td><td>(2006.01)</td></tr>
<tr><td>H01L 33/56</td><td>(2010.01)</td></tr>
<tr><td>C08L 83/04</td><td>(2006.01)</td></tr>
<tr><td>H01L 33/64</td><td>(2010.01)</td></tr>
</table>

(52) U.S. Cl.
CPC ............... *C08K 3/36* (2013.01); *C08L 35/00* (2013.01); *C08L 39/00* (2013.01); *C08L 83/04* (2013.01); *H01L 33/56* (2013.01); *C08F 2438/01* (2013.01); *C08K 2003/2227* (2013.01); *C08K 2003/2296* (2013.01); *C08K 2201/001* (2013.01); *C08K 2201/005* (2013.01); *C08K 2201/014* (2013.01); *C08L 2203/206* (2013.01); *H01L 33/641* (2013.01)

(56) References Cited

U.S. PATENT DOCUMENTS

<table>
<tr><td>5,763,546</td><td>A</td><td>6/1998</td><td>Jung</td></tr>
<tr><td>5,789,487</td><td>A</td><td>8/1998</td><td>Matyjaszewski</td></tr>
<tr><td>5,807,937</td><td>A</td><td>9/1998</td><td>Matyjaszewski</td></tr>
<tr><td>5,945,491</td><td>A</td><td>8/1999</td><td>Matyjaszewski</td></tr>
<tr><td>6,111,022</td><td>A</td><td>8/2000</td><td>Matyjaszewski</td></tr>
<tr><td>6,121,371</td><td>A</td><td>9/2000</td><td>Matyjaszewski</td></tr>
<tr><td>6,124,411</td><td>A</td><td>9/2000</td><td>Matyjaszewski</td></tr>
<tr><td>6,162,882</td><td>A</td><td>12/2000</td><td>Matyjaszewski</td></tr>
<tr><td>6,407,187</td><td>B1</td><td>6/2002</td><td>Matyjaszewski</td></tr>
<tr><td>6,512,060</td><td>B1</td><td>1/2003</td><td>Matyjaszewski</td></tr>
<tr><td>6,538,091</td><td>B1</td><td>3/2003</td><td>Matyjaszewski</td></tr>
<tr><td>6,541,580</td><td>B1</td><td>4/2003</td><td>Matyjaszewski</td></tr>
<tr><td>6,624,262</td><td>B2</td><td>9/2003</td><td>Matyjaszewski</td></tr>
<tr><td>6,627,314</td><td>B2</td><td>9/2003</td><td>Matyjaszewski</td></tr>
<tr><td>6,627,317</td><td>B2</td><td>9/2003</td><td>Matyjaszewski</td></tr>
<tr><td>6,759,491</td><td>B2</td><td>7/2004</td><td>Matyjaszewski</td></tr>
<tr><td>6,790,919</td><td>B2</td><td>9/2004</td><td>Matyjaszewski</td></tr>
<tr><td>6,887,962</td><td>B2</td><td>5/2005</td><td>Matyjaszewski</td></tr>
<tr><td>7,019,082</td><td>B2</td><td>3/2006</td><td>Matyjaszewski</td></tr>
<tr><td>7,049,373</td><td>B2</td><td>5/2006</td><td>Matyjaszewski</td></tr>
<tr><td>7,064,166</td><td>B2</td><td>6/2006</td><td>Matyjaszewski</td></tr>
<tr><td>7,125,938</td><td>B2</td><td>10/2006</td><td>Matyjaszewski</td></tr>
<tr><td>7,157,530</td><td>B2</td><td>1/2007</td><td>Matyjaszewski</td></tr>
<tr><td>7,332,550</td><td>B2</td><td>2/2008</td><td>Matyjaszewski</td></tr>
<tr><td>7,407,995</td><td>B2</td><td>8/2008</td><td>Ok</td></tr>
<tr><td>7,572,874</td><td>B2</td><td>8/2009</td><td>Matyjaszewski</td></tr>
<tr><td>7,678,869</td><td>B2</td><td>3/2010</td><td>Matyjaszewski</td></tr>
<tr><td>7,795,355</td><td>B2</td><td>9/2010</td><td>Matyjaszewski</td></tr>
<tr><td>7,825,199</td><td>B1</td><td>11/2010</td><td>Matyjaszewski</td></tr>
<tr><td>7,893,173</td><td>B2</td><td>2/2011</td><td>Matyjaszewski</td></tr>
<tr><td>7,893,174</td><td>B2</td><td>2/2011</td><td>Matyjaszewski</td></tr>
<tr><td>8,252,880</td><td>B2</td><td>8/2012</td><td>Matyjaszewski</td></tr>
<tr><td>8,273,823</td><td>B2</td><td>9/2012</td><td>Matyjaszewski</td></tr>
<tr><td>8,349,410</td><td>B2</td><td>1/2013</td><td>Huang</td></tr>
<tr><td>8,367,051</td><td>B2</td><td>2/2013</td><td>Matyjaszewski</td></tr>
<tr><td>8,404,788</td><td>B2</td><td>3/2013</td><td>Matyjaszewski</td></tr>
<tr><td>8,445,610</td><td>B2</td><td>5/2013</td><td>Kwak</td></tr>
<tr><td>8,816,001</td><td>B2</td><td>8/2014</td><td>Mehl</td></tr>
<tr><td>8,865,795</td><td>B1</td><td>10/2014</td><td>Xin</td></tr>
<tr><td>8,871,831</td><td>B2</td><td>10/2014</td><td>Huang</td></tr>
<tr><td>8,962,764</td><td>B2</td><td>2/2015</td><td>Matyjaszewski</td></tr>
<tr><td>9,243,274</td><td>B2</td><td>1/2016</td><td>Mehl</td></tr>
<tr><td>9,410,020</td><td>B2</td><td>8/2016</td><td>Matyjaszewski</td></tr>
<tr><td>9,533,297</td><td>B2</td><td>1/2017</td><td>Matyjaszewski</td></tr>
<tr><td>9,644,042</td><td>B2</td><td>5/2017</td><td>Matyjaszewski</td></tr>
<tr><td>2002/0106513</td><td>A1*</td><td>8/2002</td><td>Matyjaszewski ......... C08F 4/00<br>428/404</td></tr>
<tr><td>2009/0130340</td><td>A1*</td><td>5/2009</td><td>Chang ............... G02F 1/133606<br>428/1.1</td></tr>
<tr><td>2014/0275420</td><td>A1</td><td>9/2014</td><td>Matyjaszewski</td></tr>
<tr><td>2015/0005452</td><td>A1</td><td>1/2015</td><td>Matyjaszewski</td></tr>
<tr><td>2015/0014727</td><td>A1</td><td>1/2015</td><td>Tchoul</td></tr>
</table>

OTHER PUBLICATIONS

He, Huating et al., Improving protein resistance of α-Al2O3 membranes by modification with POEGMA brushes, Applied Surface Science, 2011, 258, 1038-1044.

Qiu, J.; Charleux, B.; Matyjaszewski, K., Controlled/living radical Polymerization in Aqueous Media: Homogeneous and Heterogeneous Systems, Prog. Polym. Sci. 2001, 26, 2083-2134.

Davis, K. A.; Matyjaszewski, K., Statistical, Gradient, Block, and Graft Copolymers by Controlled/Living Radical Polymerizations, Adv. Polym. Sci. 2002, 159, 1-168.

Matyjaszewski, K., Controlled Radical Polymerization; ACS Symposium Series 768, 1998, Chapter 1 pp. 2-30, Chapter 16 pp. 258-283.

Matyjaszewski, K. Controlled/Living Radical Polymerization. Progress in ATRP, NMP, and RAFT, ACS Symposium Series 768, 2000, Chapter 1 pp. 1-26, Chapter 24 pp. 347-360 and Chapter 25 pp. 361-371.

Achilleos, Demetra S. et al., End-Grafted Polymer Chains onto Inorganic Nano-Objects, Materials 2010, 3, 1981-2026.

Matyjaszewski, K. et al. Mechanistic Aspects of Atom Transfer Radical Polymerization, ACS Symp. Ser. 1998, 685, 258-283.

Matyjaszewski, K., Bulk Atom Transfer Radical Polymerization, ACS Symp. Ser. 1998, 713, 96-112.

Matyjaszewski, K., et al., Organic-Inorganic Hybrid Polymers from Atom Transfer Radical Polymerization and Poly(dimethylsiloxane), ACS Symp. Ser. 2000, 729, 270-283.

Matyjaszewski, K., et al., The Preparation of Well-Defined Water Soluble-Swellable (Co)Polymers by Atom Transfer Radical Polymerization, ACS Symp. Ser. 2000, 765, 52-71.

Matyjaszewski, K., Comparison and Classification of Controlled/Living Radical Polymerizations, ACS Symp. Ser. 2000, 768, 2-26.

Matyjaszewski, K., Controlled/Living Radical Polymerization: State of the Art in 2002, ACS Symposium Series 2003, 854, 2-9.

Matyjaszewski, K., Controlled Radical Polymerization: State of the Art in 2008, ACS Symp. Ser. 2009, 1023, 3-13.

Matyjaszewski, K., Controlled Radical Polymerization: State-of-the-Art in 2011, ACS Symp. Ser. 2012, 1100, 1-13.

Matyjaszewski, K., et al, Atom Transfer Radical Polymerization, Chem. Rev. 2001, 101, 2921-2990.

Matyjaszewski, K, et al., Macromolecular Engineering by Atom Transfer Radical Polymerization, J. Am. Chem. Soc., 2014, 136, 6513-6533.

Schröder, Kristin et al., Towards sustainable polymer chemistry with homogeneous metal-based catalysts, Green Chemistry 2014, 16, 1673-1686.

Pan, Xiangcheng et al., Photoinduced Metal-Free Atom Transfer Radical Polymerization of Acrylonitrile, ACS Macro Letters 2015, 4, 192-196.

Matyjaszewski, K., et al., Synthesis of Nanocomposite Organic/Inorganic Hybrid Materials Using Controlled/"Living" Radical Polymerization, Chem. Mater. 2001, 13, 3436-3448.

Matyjaszewski, K., Atom Transfer Radical Polymerization (ATRP): Current Status and Future Perspectives, Macromolecules 2012 45 4015-4039.

Epifani, Mauro et al., Synthesis of SnO2 and ZnO Colloidal Nanocrystals from the Decomposition of Tin(II) 2-Ethylhexanoate and Zinc(II) 2-Ethylhexanoate Chem. Mater. 2005, 17, (25), 6468-6472.

Weber, Dennis et al., Functionalized ZnO nanoparticles for thin-film transistors: support of ligand removal by non-thermal methods, J. Mater. Chem. C., 2013, 1 (18) 3098-3103.

(56) References Cited

OTHER PUBLICATIONS

Shiomi, Toru et al., Biomimetic Synthesis of Lysozyme-Silica Hybrid Hollow Particles Using Sonochemical Treatment: Influence of pH and Lysozyme Concentration on Morphology, Chem Mater. 2007, 19, 4486-4493.
Dang, Alei et al., High-Transparency Polymer Nanocomposites Enabled by Polymer-Graft Modification of Particle Fillers, Langmuir 2014, 30, 14434-14442.
Ehlert, Sascha, et al., A General Route to Optically Transparent Highly Filled Polymer Nanocomposites, Macromolecules 2015, 48, (15), 5323-5327.
Ehlert, Sascha et al., Polymer Ligand Exchange to Control Stabilization and Compatibilization of Nanocrystals, ACS Nano 2014, 8, (6), 6114-6122.

* cited by examiner

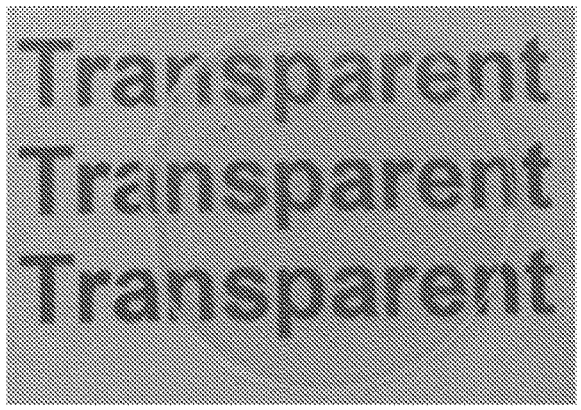
Fig. 9A  Fig. 9B
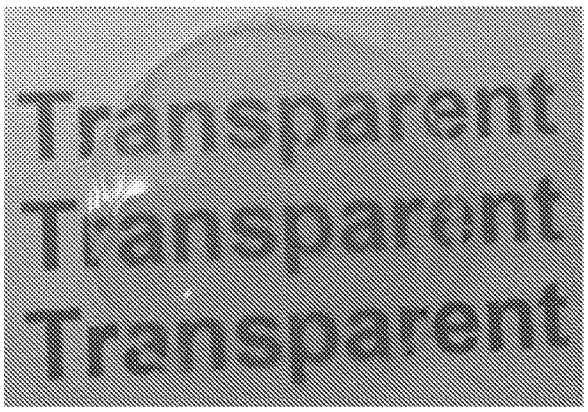
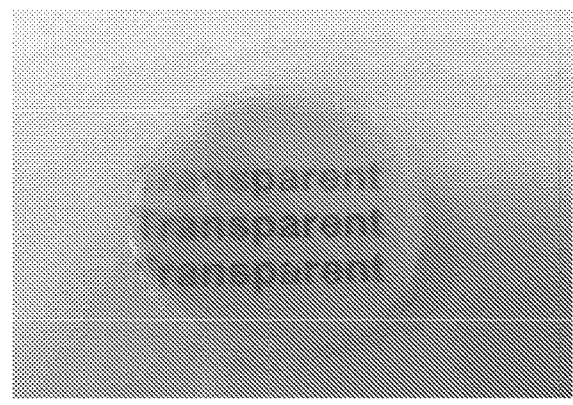
Fig. 9C  Fig. 9D
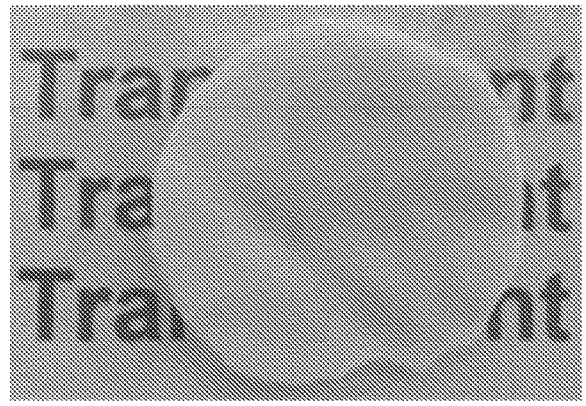
Fig. 9E Amine-functionalized PPMS glycidyl-modified amine-functionalized PPMS PPMS-functionalized alumina
alumina NPs

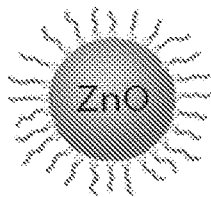 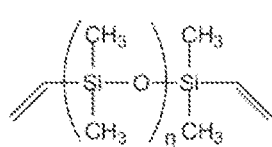 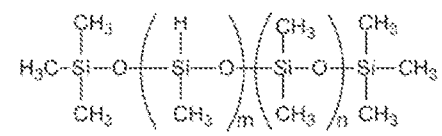
85 wt% ZnO NPs          PDMS matrix precursors
Fig. 16
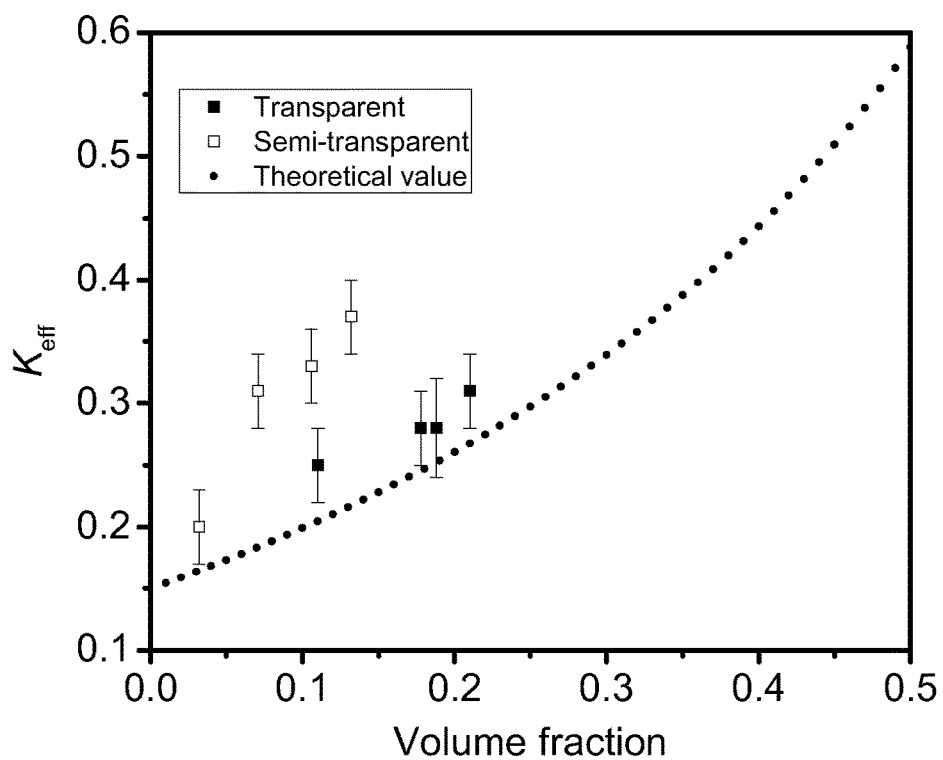
Fig. 17

Fillers:
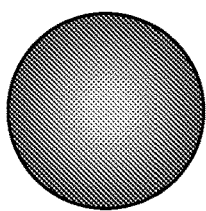
120 mm SiO$_2$ NPs
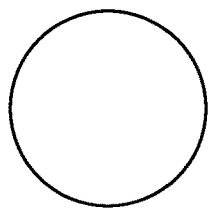
120 mm PDMS NPs
15 mm SiO$_2$ NPs
5 mm OA-capped ZnO NPs
Matrix:
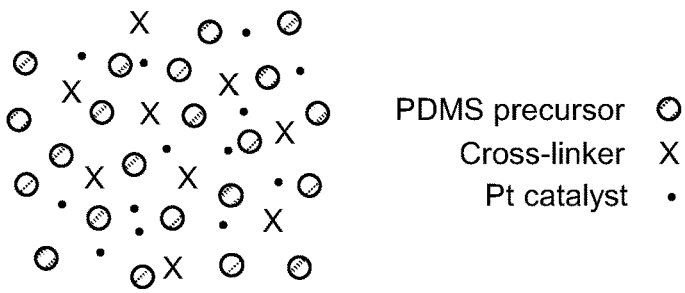
PDMS precursor   ○
Cross-linker   X
Pt catalyst   •
Fig. 19A
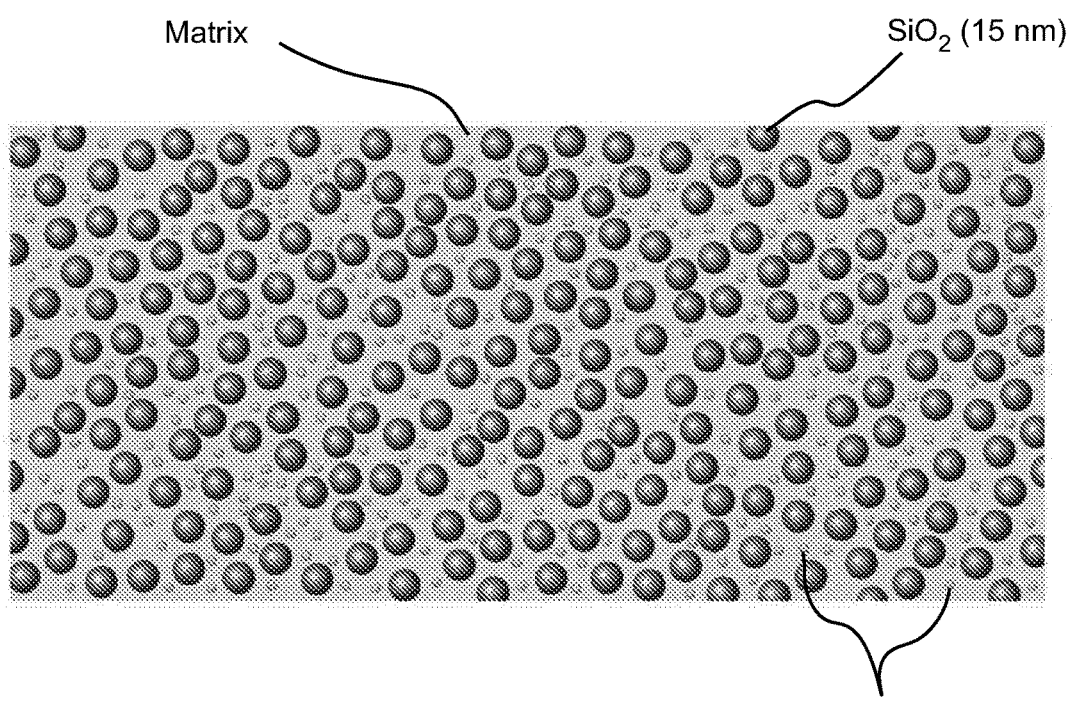
Fig. 19B Functionalized ZnO Matrix Functionalized ZnO (5 nm)

Matrix

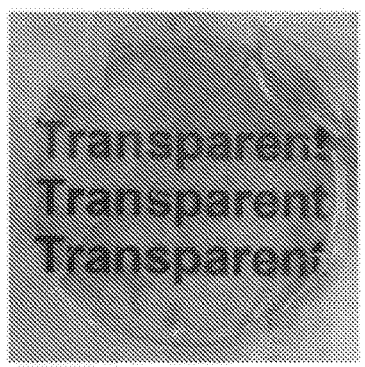

DL-50

Φinorg = 30% vol. 57 wt%
15 mm SiO$_2$:ZnO = 8:1
Thickness 0.57mm

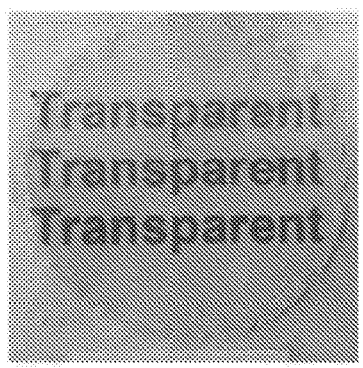

DL-51

Φinorg = 30% vol. 57 wt%
120 mm SiO$_2$:ZnO = 8:1
Thickness 0.50mm

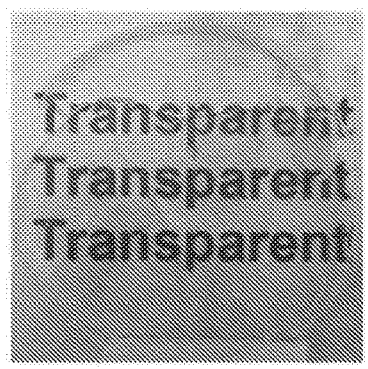

DL-53

Φinorg = 30% vol. 57 wt%
SiO$_2$:ZnO = 8:1
15 mm SiO$_2$:120mm SiO$_2$ = 8:1
Thickness 0.50mm

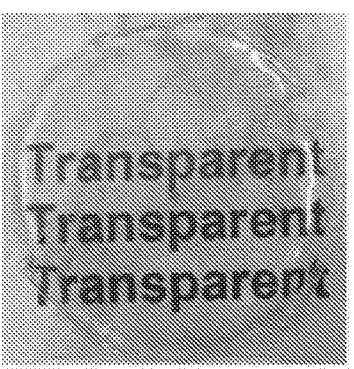

DL-54

Φinorg = 20% vol.
75% 15 mm SiO$_2$ +
25% OA-ZnO
Thickness 0.252 mm

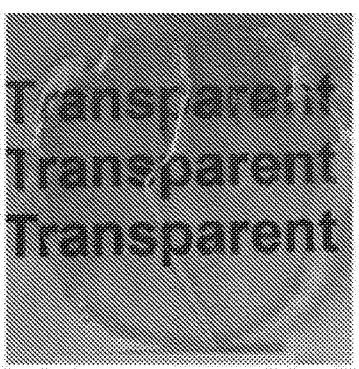

DL-58

Φinorg = 50% vol.,
76.8 wt%
15 mm SiO$_2$ +
ZnO = 10:1
Thickness 0.86 mm

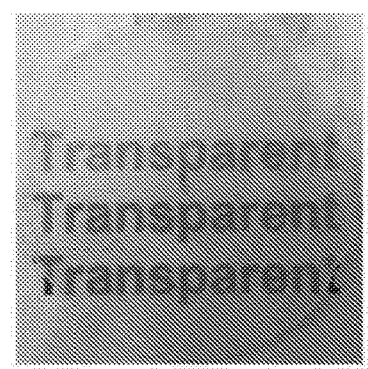

DL-59

Φinorg = 40% vol.,
68.0 wt%
120 mm SiO$_2$:
ZnO = 10:1
Thickness 0.76 mm

Pure OA-capped ZnO
around 50 wt%
Thickness 1.01 mm

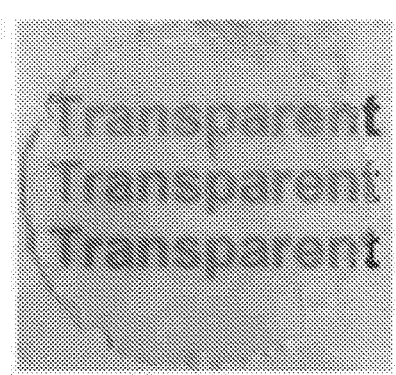

Φinorg = 55% vol, 79.3 wt%
120 mm SiO$_2$:ZnO = 10:1
Thickness 0.70mm

Fig. 20

COMPOSITE COMPOSITIONS AND MODIFICATION OF INORGANIC PARTICLES FOR USE IN COMPOSITE COMPOSITIONS

GOVERNMENTAL INTEREST

The invention was made with government support under grant numbers DMR 1501324 and DMR 1436219 from the National Science Foundation, grant number EE 0006702 from the Department of Energy and grant number 2014/14/A/ST5/0020 from the National Science Center. The United States Government has certain rights in the invention.

CROSS-REFERENCE TO RELATED APPLICATIONS

This application is a US National Phase of the International PCT patent application number: PCT/US2017/014723 filed on Jan. 24, 2017, which claims benefit of U.S. Provisional Patent Application Ser. No. 62/388,308, filed Jan. 25, 2016, the disclosures of which are incorporated herein by reference.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding of the technologies or the background thereof. The disclosure of all references cited herein are incorporated by reference.

The tremendous growth of nanotechnology has led to wide-scale use of functional nanocomposites in many applications. The utility of nanomaterials can be attributed, at least in part, to their small size, producing large surface area to volume ratios and increased reactivity of particles with the surrounding environment. Oligo/polymer nanocomposites comprising surface modified-inorganic hybrid materials have attracted increasing levels of interest, for example, as a result of enhanced optical properties including, UV adsorption, and refractive index, in addition to controlling biological, mechanical, thermal, optical, electronic, photocatalytic and magnetic properties relative to conventional organic materials. These properties expand the utility of the formed composite materials in numerous applications, thereby opening new areas of application including cosmetic products, electronic sensors, food products and cancer theranostics.

Continued developments in the field of advanced photonic devices require further advances in procedures for preparation of optically transparent polymer materials with high refractive index (RI). A promising strategy to address this challenge is incorporation of high RI nanoparticles (NPs) into a polymer matrix. However, because of the inherent incompatibility and aggregation induced scattering effects of typical non-functionalized NPs, organic-inorganic hybrid composite materials usually suffer from significant loss of optical properties, and inferior mechanical properties. These problems arise from the difference in refractive index between particle fillers and the matrix polymer. Scattering losses that increase with the size of particles and are increased as a result of particle aggregation or the formation of concentration gradients of the NP filler incorporated into host polymer matrices. Non-homogeneous dispersions result in creation of many defects in the final composite material, leading to suboptimal mechanical and optical properties, as well as premature failure of the formed composite material.

Two exemplary inorganic particles that have potentially high values for improving thermal conductivity in polymer matrices are aluminum oxide or alumina ($Al_2O_3$) and zinc oxide (ZnO). Unfortunately, both solid alumina and ZnO particles have surfaces that are relatively inert, resulting in difficulty in functionalizing such surfaces for improving dispersability.

Gamma/delta ($\gamma,\delta$-)alumina nanoparticles are widely used as components for nanocomposites. The advantages of alumina include low cost, high chemical resistance and good mechanical, optical and thermal properties. The density and thermal conductivity of $\alpha$-, $\gamma$- and $\delta$-forms of alumina are approximately 3.5 $g/cm^3$ and approximately—20 W/K*m respectively, which would be very acceptable for numerous applications if dispersability was improved. Indeed, surface-functionalized $\alpha$-alumina is of particular interest as an additive to improve mechanical and thermal properties of polymeric materials comprising alumina nanocomposites.

Pristine $\alpha$-alumina nanoparticles are difficult to evenly disperse in a polymer matrix as a result of their high surface free energy and hydrophilicity. In most cases, the alumina surface is not compatible with an organic polymer matrix, resulting in phase separation between the alumina particles and the polymer and aggregation of the alumina particles. Attaining a degree of compatibility between the particle and the matrix is essential for achieving reasonable dispersion of nanoparticles in a preformed polymer matrix and preparation of a good nanocomposite material or, dispersion in and reaction with the precursors of a polymer (for example, a thermoset) matrix. However $\alpha$-alumina is at the same time, the most chemically resistant highly crystalline form of alumina.

Several routes have been employed to enhance miscibility of alumina particles in targeted polymer matrices. For example the surface of lower purity $\gamma/\delta$-alumina nanoparticles have been coated with surfactants or modified with small molecules, such as silanes, phosphonates or carboxylic acids to improve dispersability. It was observed that when the particle surface contains sufficient functional groups, the tethered polymer brushes could be attached to nanoparticle surface and were proven to reduce aggregation and provide improved particle distribution throughout the polymer matrix. However, $\alpha$-alumina particles have not been functionalized to a useful degree, as a result of the inherent low levels of hydroxyl functionality present on the surfaces of pristine $\alpha$-alumina. The chemical inertness and low concentration of surface hydroxyl groups on normal $\alpha$-alumina particles mean that polymer brushes cannot be grafted from the surface of $\alpha$-alumina with a sufficiently high grafting density to avoid aggregation.

$\alpha$-alumina particles are essentially inert to most common acids and bases and tend to agglomerate in the presence of most liquids. Surface activation is required for $\alpha$-alumina nanoparticles as the natural particles do not have sufficient amount of surface hydroxyl groups for effective initiator attachment, which leads to low grafting density of polymer brushes. In one study of grafting from the surface of $\alpha$-alumina, *Applied Surface Science*, 2011, 258, 1038, the reaction was grafting from an $\alpha$-alumina membrane (AM), which is essentially just an aggregation of alumina particles, using SI-ATRP in an attempt to provide protein resistance. A high density of tethered chains was not required, as the low concentration of high-molecular weight chains could collapse on the surface forming mushroom-shaped polymeric domains that provided sufficient coverage to repel "large" protein molecules. It was concluded that fouling of the AM-POEGMA (poly(oligo(ethylene glycol) methyl ether methacrylate)) was easier to remove than fouling of an unmodified AM as a result of the action of POEGMA brushes. Therefore, the problems associated with dispersing α-alumina particles were not addressed. Dispersion of the particles forming the AM was not required as the "membrane", formed from aggregated α-alumina particles, was directly functionalized (only to a low degree) in situ.

ZnO nanoparticles also exhibit high thermal conductivity, UV absorption, high refractive index, high chemical stability, low absorption in the visible range, high photo-catalytic activity, and effective antibacterial and bactericide properties. ZnO also acts as a scavenger for several compounds, such as hydrogen sulfide ($H_2S$) that are detrimental to the stability and performance of optoelectronic devices by degrading optical components. ZnO nano-fillers have thus attracted interest in applications ranging from solar cells, organic light-emitting diodes (OLED), UV-shielding materials, field-emission displays, and optical sensors. These unique properties have also resulted in evaluation of ZnO in a number of other applications, including cosmetic products, electronic sensors, food products, or cancer theranostics To fully exploit the potential of ZnO-based and other nanocomposite materials, methodologies to achieve optically transparent polymer/particle blends with high inorganic content and polymer-like mechanical properties and formability are needed. The scattering cross section of particle fillers depends approximately on the square of the particle volume and dielectric contrast ($C^{sca} \sim V_p^2(\varepsilon_m - \varepsilon_p)^2$, wherein $\varepsilon_m$ and $\varepsilon_p$ represent the dielectric constant of embedding medium and the particle filler, respectively), which translates into the need for uniform/controlled dispersion of filler particles in the matrix polymer.

Understanding the governing parameters that control formation of uniform polymer/particle mixtures has therefore been a central objective in nanocomposite research. Tethering polymers that form miscible blends with the prospective matrix polymer has been shown to be particularly effective in stabilizing particle dispersions, even at high inorganic volume fractions. Tethering such polymers to inorganic particles requires development of viable techniques to control the composition and architecture (that is, the grafting density and degree of polymerization) of tethered chains for the development of high-performance particle/polymer blends.

Reversible-Deactivation Radical Polymerization (RDRP) procedures, formerly referred to as controlled radical polymerization (CRP) procedures, include, for example, Nitroxide Mediated Polymerization (NMP), Atom Transfer Radical Polymerization (ATRP), and Reversible Addition Fragmentation Transfer (RAFT) and others (including cobalt mediated transfer) that have evolved over the last two decades. RDRP provide access to polymer and copolymers comprising radically polymerizable/copolymerizable monomers with predefined molecular weights, compositions, architectures and narrow/controlled molecular weight distributions. Because RDRP processes can provide compositionally homogeneous well-defined polymers, with predicted molecular weight, narrow/designed molecular weight distribution, and high degrees of α- and ω-chain end-functionalization, they have been the subject of much study, as reported in several review articles and ACS symposia. See, for example, Qiu, J.; Charleux, B.; Matyjaszewski, K., *Prog. Polym. Sci.* 2001, 26, 2083; Davis, K. A.; Matyjaszewski, K. *Adv. Polym. Sci.* 2002, 159, 1; Matyjaszewski, K., Ed. Controlled Radical Polymerization; ACS: Washington, D.C., 1998; ACS Symposium Series 685. Matyjaszewski, K., Ed.; Controlled/Living Radical Polymerization. Progress in ATRP, NMP, and RAFT; ACS: Washington, D.C., 2000; ACS Symposium Series 768; and Matyjaszewski, K., Davis, T. P., Eds. Handbook of Radical Polymerization; Wiley: Hoboken, 2002, the disclosures of which are incorporated herein by reference.

A growing number of researchers have used RDRP procedures to prepare hybrid nanostructured particles by grafting from the surface of particles functionalized with agents to control the selected RDRP procedure, particularly if it is of importance to control grafting density, molecular weight and composition of the tethered polymer/copolymer chain. Matyjaszewski and coworkers disclosed the fundamental four component ATRP process, comprising the addition, or in situ formation, of an initiator, in this case a molecule with a transferable atom or group that is completely incorporated into the final product, a transition metal and a ligand that forms, at least a partially soluble transition metal complex that participates in a reversible redox reaction with the added initiator or a dormant polymer to form the active species to copolymerize radically polymerizable monomers, in 1995.

The basic ATRP process and a number of improvements to the basic ATRP process have been described in a number of commonly assigned patents and patent applications including, for example, U.S. Pat. Nos. 5,763,546; 5,807,937; 5,789,487; 5,945,491; 6,111,022; 6,121,371; 6,124,411; 6,162,882; 6,624,262; 6,407,187; 6,512,060; 6,538,091; 6,541,580; 6,624,262; 6,627,314; 6,759,491; 6,790,919; 6,887,962; 7,019,082; 7,049,373; 7,064,166; 7,125,938; 7,157,530; 7,332,550; 7,407,995; 7,572,874; 7,678,869; 7,795,355; 7,825,199; 7,893,173; 7,893,174; 8,252,880; 8,273,823; 8,349,410; 8,367,051; 8,404,788; 8,445,610; 8,816,001; 8,865,795; 8,871,831; 8,962,764; 9,243,274; 9,410,020; Ser. Nos. 13/993,521; 14/239,181; 14/379,418; the disclosures of which are incorporated herein by reference.

ATRP has also been discussed in numerous publications with Matyjaszewski as co-author and reviewed in several book chapters. See, for example, Matyjaszewski, K. et al. *ACS Symp. Ser.* 1998, 685, 258-283; *ACS Symp. Ser.* 1998, 713, 96-112; *ACS Symp. Ser.* 2000, 729, 270-283; *ACS Symp. Ser.* 2000, 765, 52-71; *ACS Symp. Ser.* 2000, 768, 2-26; *ACS Symposium Series* 2003, 854, 2-9; *ACS Symp. Ser.* 2009, 1023, 3-13; *ACS Symp. Ser.* 2012, 1100, 1, and *Chem. Rev.* 2001, 101, 2921-2990, the disclosures of which are incorporated herein by reference. These publications, for example, provide information on the range of suitable transition metals that can participate in the redox reaction and suitable ligands for the different transition metals to form transition metal complexes of differing activities suitable for polymerizing broad range of exemplified polymerizable (co)monomers in various solvents and under different activation procedures. See also *J. Am. Chem. Soc.*, 2014, 136, 6513-6533; and *Green Chemistry* 2014, 16, 1673, the disclosures of which are incorporated herein by reference.

ATRP is the most efficient RDRP method for the preparation of pure segmented copolymers, since, generally, unlike RAFT it does not require addition of a standard free radical initiator to continuously form new polymer chains that do not contain the desired α-functional group in a blocking from or a grafting from reaction thereby producing purer segmented or hybrid products. In addition, unlike NMP, ATRP does not require high temperatures to generate the active species by homolytic cleavage of the dormant chain end, which precludes direct formation of bioconjugates, in addition to possessing the capacity to copolymerize a much broader range of radically copolymerizable monomers than NMP.

ATRP allows the synthesis of α, ω-homo and heterotelechelic multi-segmented copolymers with a predetermined degree of polymerization, narrow molecular weight distribution (low $M_w/M_n$), incorporating a wide range of functional monomers and displaying controllable macromolecular structures under mild reaction conditions. ATRP generally requires addition or formation of an alkyl halide or (pseudo)halide as an initiator (R—X) or dormant polymer chain end ($P_n$—X), and a partially soluble transition metal complex (Cu, Fe or Ru, for example) capable of undergoing a one electron redox reaction as a catalyst (although metal free ATRP procedures have recently been developed). See, for example, *ACS Macro Letters* 2015, 4, 192-196, the disclosure of which is incorporated herein by reference.

The generally accepted mechanism of an ATRP reaction is shown below

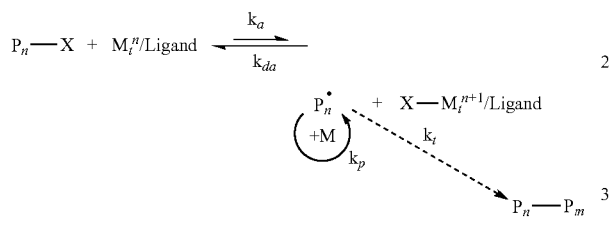

Surface-initiated ATRP (SI-ATRP), a representative example of which is illustrated in FIG. 1, is one the most robust and widely used RDRP techniques for grafting a broad range of polymer chains, commonly called brushes, from various solid surfaces. See, for example, Chem. Mater. 2001, 13, 3436, the disclosure of which is incorporated herein by reference.

An important advantage of SI-ATRP is its applicability to various substrate surface geometries (for example, flat surfaces, nanoparticles (see FIG. 1), inside the pores of porous materials) and from different surface compositions, including, for example, metals and metal oxides, silicon, organic polymers, natural products, etc. To introduce polymer brushes via SI-ATRP onto a specific surface, the substrate surface must be initially modified with a suitable polymerization initiator, preferably evenly distributed throughout the surface, although patterned functionalization has also been exemplified. The attachment of alkyl halide-based initiators for SI-ATRP onto various substrates has been reported, including silica, polymer substrates, and bio-species. In many cases the initiator is anchored to the substrate via reaction with surface hydroxyl groups.

SI-ATRP is of particular utility as a result of its simple experimental setup with readily available initiators and catalysts that can be used in a range of solvents under a broad spectrum of reaction conditions. See, for example, J Am Chem Soc 2014, 136 6513 and Macromolecules 2012 45 4015, the disclosures of which are incorporated herein by reference. SI-ATRP allows for controlled macromolecular engineering of grafted polymer brushes and for control over all parameters, including brush length and molecular weight distribution, as well as brush grafting density. See, for example, Chem. Mater. 2014, 26, 745.]

While examining, the role of an alkyl-spacer between the tethering group and initiator functionality, it was discovered that a novel functional ATRP initiator, 12-(2-bromoisobutyramido)dodecanoic acid (BiBADA; see below) could be used as a reliable tetherable initiator with, for example, sub-10 nm magnetite nanoparticles. Moreover, the tetherable initiator with inherent high initiation efficiency (attributable to the "long" spacer between the tetherable group and initiating functionality) could be further expanded to other metal/metal oxide surfaces, resulting in an increase in grafting density of the formed composite nanoparticles, including limited grafting from α-alumina. It was determined that BiBADA could be considered to be a "universal" ATRP initiator, and other metal/metal oxide surfaces including MgO, $TiO_2$, $ZrO_2$, $Mn_2O_3$, $Co_3O_4$, NiO, $Y_2O_3$, $In_2O_3$, $Sb_2O_3$, $La_2O_3$, and $CeO_2$, were functionalized for grafting from polymerizations. Methyl methacrylate (MMA), as an exemplary radically polymerizable monomer, was grafted from the surface of all the listed metal oxides forming hybrid particles with $M_n$ of the tethered poly(methyl methacrylate) (PMMA) chains ranging from $6.73 \times 10^3$ to $3.66 \times 10^5$ and $M_w/M_n$ generally between 1.23 and 1.35 for most grafted from polymers.

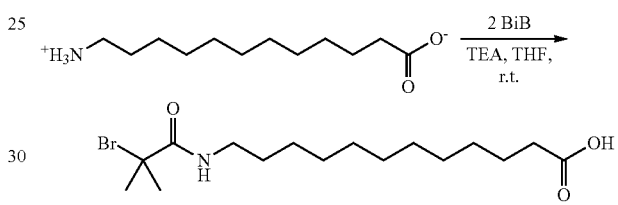

BRIEF DESCRIPTION OF DRAWINGS

FIGS. 9A through 9E illustrate photographs of pure PMMA, PSAN-capped ZnO/PMMA and OA-capped ZnO/PMMA hybrid bulk films, respectively: A) Pure PMMA (thickness: 666 μm); B) PSAN-capped ZnO/PMMA-1 (10 wt % ZnO, 570 μm); C) PSAN-capped ZnO/PMMA-2 (18 wt % ZnO, 646 μm); D) PSAN-capped ZnO/PMMA-2 (27 wt % ZnO, 685 μm); and E) OA-capped ZnO/PMMA (10 wt % ZnO, 590 μm), wherein the image areas are 9 cm$^2$.

FIG. 16 illustrates a representative embodiment of preparation of ZnO dispersions in a PDMS matrix.

FIG. 17 illustrates a plot of predicted effective thermal conductivity vs. ZnO content, wherein the square dots are the measured thermal conductivity of transparent films and spherical dots are the measured thermal conductivity of semi-transparent films (the results show measurement error bars).

FIG. 19A illustrates schematically a representative embodiment of binary particle dispersants including 5 nm OA-capped ZnO with either 15 or 200 nm SiO$_2$ particles.

FIG. 19B illustrates schematically a representative embodiment of binary particle dispersants including 15 nm SiO$_2$ particles and 5 nm OA-capped ZnO particles within a matrix material including precursors for forming PDMS.

FIG. 20 illustrates photographs of PDMS films containing different ratios of different sizes of binary mixtures of SiO$_2$ particles and 5 nm OA-capped ZnO nanoparticles.

SUMMARY

Figure 1:
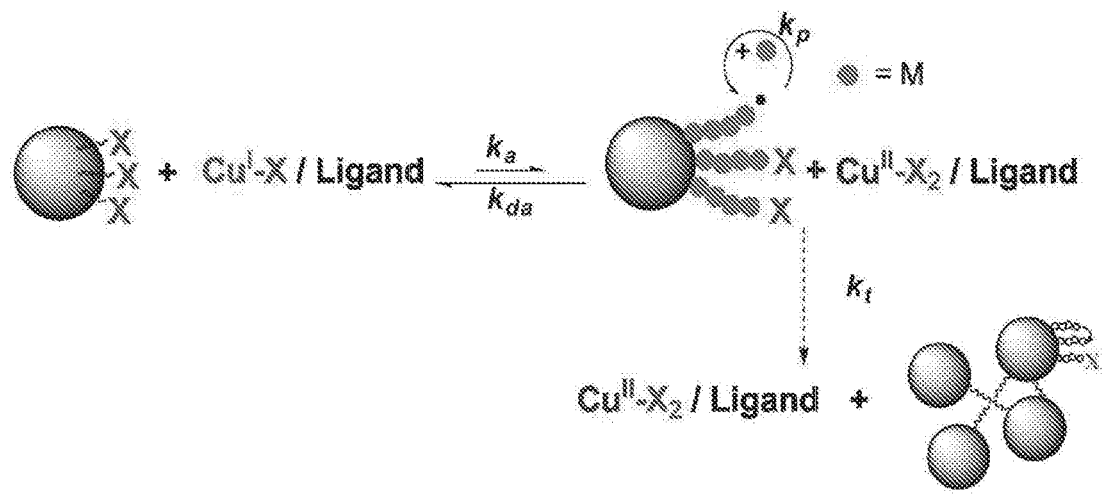
FIG. 1 illustrates schematically the introduction of polymer brushes onto the surface of a nanoparticle via SI-ATRP.

A composition formed by dispersing at least a plurality of first particles within a matrix material and dispersing at least a plurality of second particles within the matrix material, the second particles being different from the first particles, wherein interaction between the at least a plurality of second particles and the at least a plurality of first particles determines a spatial distribution of the plurality of second particles within the matrix material. The matrix material may, for example, be a polymeric material or a precursor for the polymeric material. The first particles may, for example, include an inorganic material or an organic material. In a number of embodiments, the second particles include an inorganic material. The second particles may, for example, include a metal oxide, a metal or silica.

In a number of embodiments, each of the plurality of the second particles includes a core, including the metal oxide, the metal or silica, and a plurality of groups tethered to the core. The plurality of groups tethered to the core may, for example, be selected to increase dispersability of the second particle within the matrix material as compared to the unmodified core or may include functionality to react with at least one component of the matrix material.

In a number of embodiments, the plurality of first particles interact with the plurality of second particles via at least one of volume exclusion or repulsion. Repulsion may, for example, arise from interaction between the groups tethered on the second particle and one or more groups tethered on a core of each of the plurality of first particles or as a result of charge. In a number of embodiments, the plurality of first particles interacts with the plurality of second particles via volume exclusion, and each of the plurality of second particles is positioned with the matrix material within interstitial space defined by the plurality of the first particles.

The composition may further include at least a plurality of third particles within the matrix material. The third particles are different from the first particles and the second particles.

In a number of embodiments, interaction between the at least a plurality of second particles and the at least a plurality of first particles and the at least a plurality of third particles determines a spatial distribution of the plurality of second particles within the matrix material. The plurality of first particles may, for example, interact with the plurality of second particles and the plurality of third particles via at least one of volume exclusion or repulsion.

The cores of each of the plurality of second particles may, for example, include at least one of titanium, zirconium, silicon, iron, lead, zinc, gold, silver, platinum, tin, aluminum, barium, cadmium, calcium, copper, magnesium, selenium, antimony, lanthanum, ytterbium, tungsten, indium, cerium or iridium or an oxide thereof. In a number of embodiments, at least one of the cores of each of the plurality of first or cores of each of the plurality of second particles includes at least one of aluminum oxide, titanium oxide, zirconium oxide, silicon dioxide, iron oxide, or zinc oxide. The core of the second particles may, for example, include α-alumina or zinc oxide. In a number of embodiments, the cores of each of the plurality of second particles has a thermal conductivity (k) greater than 1, greater than 5, greater than 10 or even greater that 15 W/mK.

In a number of embodiments, an average diameter of the plurality of first particles is greater than 20 nm, optionally greater than 25 nm or optionally greater than 50 nm and an average diameter of the plurality of second particles is less than 20 nm, optionally less than 15 nm or optionally less than 10 nm. Such ranges of particle size are, for example, suitable for use in optically transparent compositions.

In a number of embodiments, the groups tethered on the cores of the second particles are alkylamino groups. That is, a group including both an alkyl group (or groups) and an amino group or groups. The amino group(s) may be primary, secondary or tertiary amino groups. In a number of embodiments, the amino groups are primary or secondary. The amino groups may, for example, be substituted with alkyl groups. The groups tethered on the cores of the second particles may, for example, be $C_3$-$C_{18}$ alkylamino groups or $C_3$-$C_7$ alkylamino groups. The groups tethered on the second particles may also be $C_3$-$C_{18}$ alkylsilane groups, $C_3$-$C_{18}$ alkyl phosphonate groups, or $C_3$-$C_{18}$ alkylcarboxylic acid groups. The groups tethered on the cores of the second particles alkylsilane groups, alkyl phosphonate groups or $C_3$-$C_{18}$ alkylcarboxylic acid groups. In a number of embodiments, the groups tethered on the cores of the second particles are selected from the group consisting of octylamine, hexylamine, butylamine or dihexylamine. Alkylsilanes for use herein may have the general formula $HSi(R^1R^2R^3)$ wherein $R^1$, $R^2$ and $R^3$ are independently H or an alkyl group, and at least one of $R^1$, $R^2$ and $R^3$ is an alkyl group. Alkylphosphonates for user herein may, for example, have the general formula $R^7P(O)(OR^5)(OR^6)$, wherein $R^5$ and $R^6$ are independently an alkyl group or H, and at least one of $R^5$ and $R^6$ is H. $R^7$ is an alkyl group. Alkylcarboxylic acid groups for use herein may, for example, have $R^8C(O)OH$, wherein $R^8$ is an alkyl group. Alkylamines suitable for use herein may. for example, have the general formula $HN(R^9R^{10})$, wherein $R^9$ and $R^{10}$ are independently an alkyl group or H, and at least one of $R^9$ and $R^{10}$ is an alkyl group.

The tethered groups tethered on the core of the second particles may, for example, include a copolymer compatible the targeted matrix material to enhance dispersion of particles therein or reactive with (at least one component of) the targeted matrix material.

The second particles may, for example, be formed via formation of the core of the second particles within a plurality of chains of the copolymer via reaction of a precursor reactable to form a metal oxide and which bonds to at least one of the plurality of chains of the copolymer via one or more functional groups on the plurality of chains of the copolymer chains. The precursor may for example, be reactable to form the metal oxide via hydrolysis, thermolysis, chemical/electrochemical redox reaction and/or photolysis. The copolymer may, for example, include a phase separated macromolecule wherein one phase can interact with the precursor. In a number of embodiments, the copolymer comprises an inner segment interactive with the precursor of the inorganic core and an outer segment compatible or reactive with the target matrix. The chains of the copolymer may, for example, be extending chains of a star macromolecule, a linear brush macromolecule or a branched brush macromolecule. In a number of embodiments, the second particles comprise a corona of one of the chains of the copolymer grafted to the core.

The second particles may, for example, have a dimension or average diameter in the range of 2.5 to 500 nm, or optionally 2.5 to 100. The first particles have a dimension or average diameter in the range of 10 nm to 10 μm, optionally 25 nm to 500 nm.

In the case of an α-alumina core, the surface of core is formed by functionalization of α-alumina in a strong acid, a saturated solution of a base or a molten base. The particles of α-alumina may, for example, be functionalized by treatment with a saturated aqueous solution of MOH or molten MOH to increase the concentration of hydroxyl groups on a surface thereof or through reaction with molten $M_2S_2O_7$, to form sulfate groups on the surface thereof, which are then converted to hydroxyl groups, and the hydroxyl groups are subsequently converted to a functionality capable of initiating a polymerization to form grafted polymer chains, wherein M is a group 1 or group 2 metal atom. The surface hydroxyl groups may, for example, be reacted with reagents including one or more groups reactive with the hydroxyl groups and further comprising functionality to initiate a reversible deactivation radical polymerization.

In a number of embodiments, the core of the second particles includes a core of a metal oxide and groups are tethered on a surface of the core of the metal oxide via a grafting from process, a grafting to process, or a ligand exchange process. The core may, for example, include zinc oxide, alumina oxide or titanium oxide. In a number of embodiments, the core includes zinc oxide.

In a number of embodiments, at least one of the first particles and the third particles includes at least one of a solid inorganic particle or a polymeric particle having a glass transition temperature lower than 25° C.

In a number of embodiments hereof, the composite composition is optically transparent or optically translucent. The first particles and the third particles have a refractive index that is within 20% 10% or even 5% of the refractive index of the matrix material or a polymeric material formed from the matrix material. The matrix material may, for example, be a precursor material for a siloxane polymer or a precursor for an acrylic polymer. In a number of embodiments, the polysiloxane polymer is a phosphor-base pigment. The matrix material may, for example, be a precursor material for a siloxane polymer or a thermoplastic polymer. At least one of the first particles or the third particles may, for example, include $SiO_2$, polydimethylsiloxane, poly(styrene-acrylonitrile) or a poly(alkyl methacrylate). At least one of the first particles the third particles have a core including $SiO_2$ and one or more groups tethered to the core.

In a number of embodiments, the second particles are present in a sufficient volume fraction to achieve a thermal conductive greater than 0.5 W/mK in the composition. The composition may, for example, be adapted for use in an encapsulant for an LED-based solid state lighting.

In another aspect, a method of forming a composition includes dispersing at least a plurality of first particles within a matrix material and dispersing at least a plurality of second particles with the matrix, the second particles being different from the first particles, wherein interaction between the at least a plurality of second particles and the at least a plurality of first particles determines a spatial distribution of the plurality of second particles within the matrix material. The particles and the matrix material may be further defined as described above.

In another aspect, a method of forming a composition including copolymer chains tethered on a metal oxide core, comprising loading a precursor which is reactable to form the metal oxide core within a plurality of the copolymer chains and reacting the precursor within the plurality of copolymer chains to form the metal oxide. The copolymer chains may, for example, include a phase separated copolymer wherein an inner segment of the copolymer interacts with the precursor and an outer segment of the copolymer is selected to interact with or react with a matrix material into which the composition is to be dispersed. The copolymer may, for example, include an inner hydrophilic segment and an outer hydrophobic segment. The copolymer chains into which the precursor is loaded may, for example, be extending chains of a star macromolecule, a linear brush macromolecule or a branched brush macromolecule. The star macromolecule, the extending chains of linear brush macromolecule or the branched brush macromolecule may, for example, be formed via reversible deactivation radical polymerization.

In another aspect, a composition includes copolymer chains tethered on a metal oxide core, formed by loading a precursor which is reactable to form the metal oxide core within a plurality of the copolymer chains and reacting the precursor within the plurality of copolymer chains.

In another aspect, a composition includes a particle including one or more $C_3$-$C_7$ alkylamino groups, $C_3$-$C_7$ alkylsilane group, $C_3$-$C_7$ alkyl phosphonate groups, or $C_3$-$C_7$ alkylcarboxylic acid groups tethered to a core comprising a metal or a metal oxide.

In another aspect, a composition includes a plurality particles, wherein each of the plurality of particles comprises one or more $C_3$-$C_{18}$ alkylamino groups, $C_3$-$C_{18}$ alkylsilane group, $C_3$-$C_{18}$ alkyl phosphonate groups, or $C_3$-$C_{18}$ alkylcarboxylic acid groups tethered to a core comprising a metal or a metal oxide, and a matrix material including a polymeric material or a precursor for the polymeric material in which the plurality of the particles is dispersed. The matrix material may, for example, include a polymer or precursor reagents for a polymer (for example, a polysiloxane or precursor reagents for a polysiloxane). In a number of embodiments, the alkylamino groups are selected from the group consisting of octylamine, hexylamine and butylamine.

In a further aspect, a method of forming a composition includes tethering one or more of $C_3$-$C_{18}$ alkylamino groups, $C_3$-$C_{18}$ alkylsilane group, $C_3$-$C_{18}$ alkyl phosphonate groups, or $C_3$-$C_{18}$ alkylcarboxylic acid groups to each of a plurality of cores core including a metal or a metal oxide to form a plurality of functionalized particle and dispersing the plurality of the functionalize particles within a matrix material comprising a polymeric material or a precursor for the polymeric material. The matrix material may, for example, include a polymer or precursor reagents for a polymer (for example, a polysiloxane or precursor reagents for a polysiloxane).

In still a further aspect, a method of functionalizing α-alumina particles includes contacting α-alumina with a strong acid, a saturated base or a molten base. The α-alumina particles may, for example, be contacted with a saturated aqueous solution of MOH or molten MOH to increase the concentration of hydroxyl groups on a surface thereof or are contacted with molten $M_2S_2O_7$, to form sulfate groups on the surface thereof, which are then converted to hydroxyl groups, wherein M is a group 1 or group 2 metal atom. The hydroxyl groups may, for example, be subsequently converted to a functionality capable of initiating a polymerization to form grafted polymer chains. The functionality capable of initiating a polymerization may, for example, include a group to initiate a reversible deactivation radical polymerization. The hydroxyl groups may, for example, be reacted with reagents including a group reactive with the hydroxyl group and further including the functionality to initiate a reversible deactivation radical polymerization.

The present devices, systems, methods and compositions, along with the attributes and attendant advantages thereof, will best be appreciated and understood in view of the following detailed description taken in conjunction with the accompanying drawings.

DETAILED DESCRIPTION

Abbreviations

Reversible-Deactivation Radical Polymerization RDRP
Controlled Radical Polymerization CRP
Nitroxide Mediated Polymerization NMP
Atom Transfer Radical Polymerization ATRP
Reversible Addition Fragmentation Transfer RAFT
Surface-initiated atom transfer radical polymerization SI-ATRP
Initiator for Continuous Activator Regeneration ATRP ICAR ATRP
Activator Generated by Electron Transfer ATRP AGET ATRP
Activator ReGenerated by Electron Transfer ATRP ARGET ATRP
Methyl methacrylate MMA
Poly(methyl methacrylate) PMMA
Styrene S
Acrylonitrile AN
Poly(styrene/acrylonitrile) PSAN
2-Trimetylsiloxy)ethyl methacrylate HEMA-TMS
tert-butyl acrylate tBA
Poly(acrylic acid) PAA
Poly(divinyl benzene) PDVB
Poly(oligo(ethylene glycol) methyl ether methacrylate POEGMA
Sodium Hydroxide NaOH
Triethylamine TEA
Tetrahydrofuran THF
Dimethylformamide DMF
Copper (II) chloride $CuCl_2$
Copper (I) chloride CuCl
2-Bromoisobutyryl bromide 2-BiB
Ethoxyisobutyryl bromide EBiB
12-(2-bromoisobutyramido)dodecanoic acid BiBADA
Macroinitiator MI
Aluminum Oxide or Alumina $Al_2O_3$
α-alumina membrane AM zinc oxide ZnO
Zinc 2-Ethylhexanoate $Zn(EH)_2$
Zinc Nitrate $Zn(NO_3)_2$
Zinc Acetate $Zn(OAc)_2$
Zinc hydroxide $Zn(OH)_2$
Potassium hydroxide KOH
Octylamine OA
Hexylamine HA
Butylamine BA
Titanium dioxide $TiO_2$
Silica Dioxide $SiO_2$
Potassium disulfate $K_2S_2O_7$
Alumina sulfate $Al_2(SO_4)_3$
4-(Dimethylamino)pyridine DMAP
N,N,N',N'',N''-Pentamethyldiethylenetriamine PMDETA
Tris[2-(dimethylamino)ethyl]amine $Me_6TREN$
Tin(II) 2-ethylhexanoate $Sn(EH)_2$
Trifluoroacetic acid TFA
Methylene chloride DCM
Lithium aluminum hydride $LiAlH_4$
Polymethylphenylsiloxane PPMS
Polymethylhydroxysiloxane PHSO
Polytetrafluoroethylene PTFE
Deuterated chloroform $CDCl_3$
Hydrogen Chloride HCl
Hydrogen Fluoride HF
Hydrogen Sulfide $H_2S$
Nitrogen $N_2$
Thermal gravimetric analysis TGA
Gas phase chromatography GPC
Dynamic light scattering DLS
Size exclusion chromatography SEC
Dynamic Mechanical Analysis DMA
Transmission electron microscopy TEM
Nuclear magnetic resonance NMR
Lower critical solution temperature LCST
X-ray diffraction XRD
Organic light-emitting diode OLED
Light-emitting diode LED
Refractive Index RI
Ultraviolet UV
Nanoparticle NP It will be readily understood that the components of the embodiments, as generally described and illustrated in the figures herein, may be arranged and designed in a wide variety of different configurations in addition to the described representative embodiments. Thus, the following more detailed description of the representative embodiments, as illustrated in the figures, is not intended to limit the scope of the embodiments, as claimed, but is merely illustrative of representative embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a particle" includes a plurality of such particles and equivalents thereof known to those skilled in the art, and so forth, and reference to "the particle" is a reference to one or more such particles and equivalents thereof known to those skilled in the art, and so forth. Recitation of ranges of values herein are merely intended to serve as a shorthand method of referring individually to each separate value falling within the range. Unless otherwise indicated herein, and each separate value, as well as intermediate ranges, are incorporated into the specification as if individually recited herein. All methods described herein can be performed in any suitable order unless otherwise indicated herein or otherwise clearly contraindicated by the text.

The term "polymer" refers generally to a molecule which may be of high relative molecular mass/weight, the structure of which includes repeat units derived, actually or conceptually, from molecules of low relative molecular mass (monomers). The term "copolymer" refers to a polymer including two or more dissimilar repeat units (including terpolymers—comprising three dissimilar repeat units—etc.). The term "oligomer" refers generally to a molecule of intermediate relative molecular mass, the structure of which includes a small plurality of units derived, actually or conceptually, from molecules of lower relative molecular mass (monomers). In general, a polymer is a compound having >1, and more typically >10 repeat units or monomer units, while an oligomer is a compound having >1 and <20, and more typically leas than ten repeat units or monomer units. As used herein, the term "nanoparticle" refers to a particle having a dimension in the range of 1 to 100 nanometers (nm).

Conventional approaches to uniformly dispersing inorganic nanoparticles within a polymer matrix utilize matrix-compatible polymer ligands attached to nanoparticle surfaces. The sometimes-called "polymer brush" approach shields the nanoparticle surfaces from each other and prevents agglomeration while assisting in entropic or enthalpic dispersion in selected matrices. However, with certain materials, such as commonly used polysiloxane or silicone encapsulants, this shielding effect can be problematic because the surface-modified inorganic nanoparticles tend not to wet the host silicone, eventually leading to precipitation of the nanoparticles. Furthermore, the presence of a polymer brush places a limitation on the loading factor for the inorganic core.

In a number of representative embodiments hereof, the preparation of functional particles/nanoparticles (for example, with high thermal conductivity) is set forth. Functionalized particles hereof may, for example, include tethered groups (such as polymer/copolymer chains and/or relatively low molecular weight groups), which allow dispersion in targeted matrices. The tethered functionality may also enable direct reaction with, or dispersion in, matrix forming chemicals or precursors.

To provide, for example, controlled loading volumes/weights, incorporate specific physical properties and a desired structure within composite compositions hereof, systems, methods and compositions hereof may, for example, include a plurality of first particles dispersed within a matrix material and a plurality of second particles dispersed with the matrix material. The second (functionalized) particles are different from the first particles in size or composition or both size and composition and may, for example, be inorganic particles or organic particles. When the particles differ in size interaction between the second particles and the first particles determines a spatial distribution of the second particles within the matrix material. The first particles thus provide a "template" for the spatial distribution of the second particles with in the matrix media.

Synthetic routes for the preparation of functionalized inorganic particles with enhanced activation of the surface are first discussed herein. Such enhanced activation may provide for uniform dispersion of the functionalized particles in a polymeric or other matrix. The synthetic procedures include, for example, direct synthesis of functional particles, preparation of functionalized nanoparticles by grafting from, grafting to, ligand exchange, and synthesis of polymeric templates for controlled synthesis of inorganic particles within segments of phase separated copolymers. In each of these synthetic routes, uniform, dispersible surface functionalized inorganic particles of controlled dimensions are formed for dispersion in and/or reaction with targeted matrices.

The functional particles hereof may be incorporated within matrix materials (which may, for example, be a polymer matrix or unreacted precursors of a polymer matrix), to affect or to improve determined properties of the final composite composition. The procedures for surface modification of nanoparticles (for example, with tethered oligo/polymer chains or relatively low molecular weight chains) assist in preventing nanoparticle fillers from agglomeration and achieve better dispersability, both in solution and in selected target matrices. In a number of representative embodiments, thermal properties of polymeric matrices are significantly improved in, for example, encapsulants materials for light-emitting diode (LED) applications.

In a number of embodiments hereof, methods of preparing a dispersion of stable nanoparticles (for example, ZnO nanoparticles) in a precursor of a polysiloxane-based matrix allows uniform incorporation of the nanoparticles into the matrix, thereby allowing control over the refractive index and thermal conductivity of the formed polysiloxane composite. Preparation and functionalization of metals and metal oxides hereof (exemplified by alumina, ZnO and $TiO_2$) provide stable composite structures displaying, among the several improved properties, improved thermal conductivity, while retaining/controlling optical properties. Achieving improved thermal conductivity will allow development of more efficient LEDs accompanied by a reduction in accumulation of waste energy resulting from overheating. Upon study of the properties of the composite materials hereof it was determined that physiochemical properties might further be improved by the addition of a second particle (or further) species that alter(s) the distribution of the first particle within the matrix material and thereby alters the properties of the ultimate composite composition.

Although representative embodiments are discussed for use in, for example, a polysiloxane matrix and other polymers or polymer precursors for LED encapsulants, one skilled in the art appreciates that the functionalized particles hereof and the methodologies for dispersion of such particles are widely applicable to, for example, many target thermoplastic and thermoset matrices. In all embodiments hereof, particles used in target matrices may be spherical, generally spherical, rod-like or, as illustrated below for alumina particles, have a more irregular shape.

A. Increasing Functionality on the Surface of α-Alumina

As described above, γ-δ-alumina nanoparticles are more reactive than α-alumina, and polymer brushes can be grafted from their surface with a grafting density of, for example, 0.05 chains/$nm^{-2}$ without additional surface pretreatment. PMMA functionalize γ-δ-alumina nanoparticles were prepared in studies to provide a standard for evaluation purposes as the thermal conductivity of γ-δ alumina nanoparticles are lower than α-alumina particles. In a number of embodiments hereof, the surface of α-alumina particles, the least reactive of all alumina forms, are activated under what could be considered relatively harsh conditions to increase the number of hydroxyl groups on the surface. This increased surface activation leads to an increase in the grafting density of polymer brushes compared to non-activated particles of α-alumina or particles activated under the relatively mild conditions previously employed for surface activation of alumina particles. In a number of studies hereof, activation routes included treatment with a saturated MOH solution, as well as treatment with fused MOH or $M_2S_2O_7$, wherein M is a metal in groups 1 and 2 of the periodic table. In a number of representative examples hereof, M was selected to be sodium and potassium. The grafting density achieved was sufficient to allow dispersion of the functionalized alumina in targeted matrices.

In a number or representative studies, PMMA and poly (styrene/acrylonitrile) (PSAN) brushes were grafted from the surface of α-alumina with improved grafting density. The methodologies hereof will expand the number of applications for α-alumina nanoparticles in polymer nanocomposites, as the higher grafting density (via, for example, grafting from or grafting to procedures) prevents particle aggregation and can provide good dispersion of the particles in specific targeted polymer matrices. For example, improved functionalization allows for dispersion of the α-alumina hybrid particles in selected thermoplastic polymer matrices or allows direct reaction with one or more components of, for example, a thermoset forming matrix. In a number of studies hereof, these results are exemplified by entropic or enthalpic interactions with an exemplary PMMA matrix. Incorporating α-alumina particles within the matrix improved thermal conductivity and mechanical properties of the composite material while retaining optical properties.

As described above, several relatively severe chemical procedures were employed to activate the surface of α-alumina particles. Commercial α-alumina particle surfaces have very few native hydroxyl functional surface groups. In one study, the particles were activated by treatment with 2M sodium hydroxide (NaOH) solution or 48 wt % hydrogen fluoride (HF) solution at 70° C. for 12 hours. A more aggressive activation including subjecting the particles to a saturated (approximately 20M) aqueous solution of NaOH, which was carried out in a stainless steel cup at 70° C. for 12 h. A further aggressive functionalization step included activation of the particles in molten NaOH or molten potassium disulfate ($K_2S_2O_7$)) which was carried out in stainless steel cup at 500° C. for different time periods of 15, 30, 60 and 180 min. The particles were collected via centrifugation and washed via repetitive centrifugation and sonication cycles with 2M hydrogen chloride (HCl) solution, 2M NaOH solution and distilled water (×3). The particles were air dried overnight.

The particles were then further modified by reacting the higher concentration of hydroxyl groups present on the activated particle surfaces with an ATRP initiator, initially exemplified by 2-bromoisobutyryl bromide (2-BiB), by stirring a slurry of the particles in dry tetrahydrofuran (THF) in presence of triethylamine (TEA), 2-BiB and catalytic amounts of 4-(dimethylamino)pyridine (DMAP) at room temperature for 12 h. The particles were collected via centrifugation, washed with THF and methanol (×3) via repetitive centrifugation and sonication cycles, and air dried overnight.

After alumina activation and surface modification with an ATRP initiator, PMMA brushes were successfully grafted from the surface of the particles. A successful grafting from polymerization was confirmed using thermal gravimetric analysis (TGA) and gas phase chromatography (GPC) data. The corresponding grafting density of PMMA brushes on the particles was calculated providing the results listed in Table. 1.

TABLE 1

The parameters of PMMA-modified alumina nanoparticles activated with different agents under different conditions.

| Activation | Monomer conv. % | wt % organic | MW, g/mol | Graft density, $nm^{-2}$ |
|---|---|---|---|---|
| -none | 25 | 2.5 | 45,600 | 0.018 |
| 2M NaOH, 70° C. | 74 | 6.5 | 130,000 | 0.015 |
| HF, 48% 70° C. | 65 | 6.75 | 162,000 | 0.015 |
| conc NaOH, 70° C. | 35 | 7.6 | 62,000 | 0.043 |
| NaOH, melt, 15 min | 30 | 6.3 | 49,000 | 0.048 |
| $K_2S_2O_7$, melt, 15 min | 32 | 7.1 | 54,700 | 0.045 |

The grafting density of PMMA brushes on the alumina surface was calculated using the molecular weight of free polymer obtained from GPC and the organic fraction in polymer-modified particles obtained by TGA. To simplify the calculation, the particles were assumed to be spherical and the particle sizes provided by the supplier was taken as the average diameter of the spheres, namely 80 nm for α- and 20 nm for γ-δ alumina particles. The density of α-alumina was taken as 4.02 g/cm³, and the density of γ-δ alumina was taken as 3.5 g/cm³. The grafting density was calculated as follows:

The surface of single pristine particle was calculated as:

$$S_{pristine\,particle} = 4\pi r^2 \,[nm^2].$$

In the above equation, r is the radius of the pristine particle. The volume of single pristine particle was calculated as:

$$V_{pristine\,particle} = 4/3\pi r^3 \,[cm^3].$$

Then, the mass of single pristine particle is:

$$m_{pristine\,particle} = V_{pristine\,particle} d_{pristine\,particle} \,[g].$$

In the above equation, d is the density of the pristine particle. Knowing organic weight fraction in polymer-modified particle [wt %] from TGA, the mass of polymer on the surface of single particle is calculated as:

$$m_{polymer} = \frac{m_{prisstine\,particle}\,wt\,\%_{polymer}}{wt\,\%_{pristine\,particle}} \,[g].$$

Knowing molecular weight of polymer M from GPC, the number of moles of polymer on a single particle is estimated as:

$$n_{polymer} = \frac{m_{polymer}}{M_{polymer}} \,[mole].$$

Then the number of polymer brushes on the particle surface is calculated using Avogadro's number as follows:

$$N_{brushes} = n_{polymer} N_A.$$

Next, the grafting density is calculated as number of polymer brushes on a single particle divided by a particle surface area:

$$\text{graft density} = \frac{N_{brushes}}{S_{pristine\,particle}} \,[nm^{-2}].$$

Figure 2:
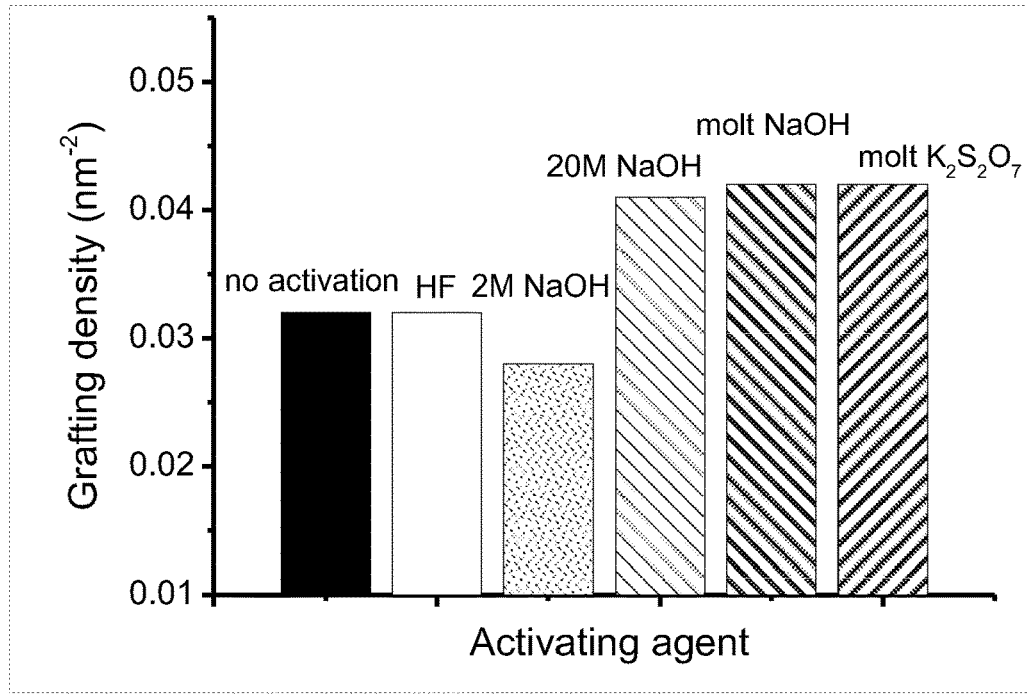
FIG. 2 illustrated the grafting density of PMMA brushes on α-alumina surfaces as a function of surface activation by various agents.

The grafting density of PMMA brushes as a function of activating agent is shown in FIG. 2. Activation with molten NaOH and molten $K_2S_2O_7$ was carried out for 15 min, while activation with other agents was carried out for 12 hours. The grafting density values FIG. 2 can be divided into two clearly identifiable groups. The first group includes particles with low grafting density, with average value of approximately 0.016 brushes/$nm^{-2}$, indicating that activation of alumina surface by exposure to either dilute base or concentrated acid does not significantly increase the grafting density compared to non-activated particles. The second group in FIG. 2 represents particles with grafting density values approximately 2.5 to 3 times higher than that of the first group. Activation of α-alumina under what would normally be considered harsh conditions, saturated aqueous solution of a base, molten base or strong acid at high temperature leads to a significant increase in the concentration of surface hydroxyl groups, with less than 10% loss in weight. As used herein, a "strong acid" is one with pKa<−1.74 which equals the pKa value of hydronium ions. Such acids essentially fully dissociate in aqueous media. Concentrated solution typically refers to concentrations >1 M. Without limitation to any mechanism, the higher number of surface hydroxyl groups may, for example, result from partial dissolution of non-crystalline alumina surfaces by, for example, a concentrated solution of molten NaOH or $K_2S_2O_7$, leading to formation of sodium aluminates and aluminum sulfate respectively. The later functional groups can be converted to hydroxyl groups, if desired, by subsequent treatment with acids or base. These processes lead to a higher grafting density of the polymer brushes on the surface. Activation with molten base and acid was carried out for 15 min only, and led to an approximate trifold increase in grafting density of grafted PMMA brushes.

To study the effect of the time of activation, α-alumina samples were activated with molten NaOH for 15, 30, 60, and 180 min respectively, and later PMMA brushes were grafted from the surface of the activated alumina particles. The results are summarized in Table 2.

TABLE 2

The parameters of PMMA-modified alumina nanoparticles activated in molten NaOH for 15, 30, 60, and 180 min.

| Activation time, min | Monomer conv. % | wt % org | MW, g/mol | D | Graft density, $nm^{-2}$ |
|---|---|---|---|---|---|
| 15 | 30 | 6.3 | 49,000 | 1.14 | 0.048 0.045 [a] |
| 30 | 28 | 7.4 | 46,500 | 1.11 | 0.054 0.061 [a] |
| 60 | 19 | 11 | 98,000 | 1.17 | 0.040 0.063 [a] |
| 180 | 75 | 12 | 95,000 | 2.2 | 0.045 0.057 [a] |

[a] Repeat analysis

The average grafting density of the PMMA brushes does not change significantly upon increasing activation time. Similar behavior is observed in case of alumina activation in molten potassium disulfate ($K_2S_2O_7$) (see Table 3), although it there may be a further ~20% increase in surface functionality with reaction time greater than or equal to 1 hour.

TABLE 3

The parameters of PMMA-modified alumina nanoparticles activated in molten $K_2S_2O_7$ for 15, 30, 60, and 180 min.

| Activation time, min | Monomer conv. % | wt % org | MW, g/mol | Đ polymer | Graft density $nm^{-2}$ |
|---|---|---|---|---|---|
| 15 | 32 | 7.1 | 54,700 | 1.10 | 0.045 |
| 30 | 30 | 5.5 | 45,000 | 1.11 | 0.042 |
| 60 | 25 | 6 | 39,000 | 1.07 | 0.053 |
| 180 | 29 | 6 | 40,000 | 1.09 | 0.051 |

The grafting density of PMMA brushes on α-alumina surface as a function of time of activation in molten $K_2S_2O_7$ was calculated and while there appears to be a slight increase in surface functionality with time, it can be seen from Table 3 that the grafting density of PMMA does not significantly increase upon longer activation in molten $K_2S_2O_7$.

Because it was speculated that the success of the severe activation treatments may be a result of partial dissolution of the surface layers of the α-alumina particle it was verified that the average size of α-alumina nanoparticles remains approximately the same before and after activation. Size determination by transmission electron microscopy (TEM) showed that the pristine α-alumina particles were of irregular shape and the actual size was greater than the 80 nm set forth by the supplier. The size distribution was also very broad. For simplicity, it was assumed that the particles had a spherical shape and 80 nm diameter when calculating the grafting density. The pristine particles tended to agglomerate to form large chunks, and individual particles are hard to distinguish. TEM images of α-alumina nanoparticles activated in molten $K_2S_2O_7$ for 15 min and 30 min, and the α-alumina nanoparticles activated in molten NaOH for 60 min., appeared to have the same size and shape as pristine particles, but the composite/functionalized particles are dispersible with reduced agglomeration as a consequence of grafting PMMA from the particle surfaces. This is also true for the PMMA modified γ-δ alumina particles.

While the PMMA brushes are grafted from the surface of the nanoparticles, they are not observed in the TEM images taken under the given conditions. Nevertheless, it can be concluded from the TEM images that activation under harsh conditions does not lead to a degree of dissolution that significantly changes particle shape or size. Further, grafting polymer brushes from the surface of the particles significantly reduces agglomeration of particles and provides better dispersability of individual particles compared to pristine α-alumina.

In general, the grafting density in the range of 0.04-0.05 chains/$nm^{-2}$ is not very high for grafting from the surface of inorganic nanoparticles by SI-ATRP. However, the estimated grafting density results from the assumption that the supplied α-alumina particles are spherical and 80 nm in diameter. As set forth above, the pristine particles are significantly larger (approximately. 130 nm and more) and have a very irregular shape as determined in TEM imaging. The actual grafting density of PMMA brushes on alumina surface may thus be significantly higher than the estimated value of 0.045-0.05 chains/$nm^{-2}$. Although the actual grafting density cannot be estimated more precisely, the grafting density was calculated in a similar way for all of the studied samples, thereby obtaining an internally consistent estimate for the increase of the grafting density upon alumina activation under harsh conditions (a 200 to 300% increase in the present studies). The activation methodologies disclosed herein can increase the number of hydroxy groups linked to the α-alumina surface by greater than 50%, greater than 100% or greater than 200%, creating a higher fraction of functional groups, including functional groups that can be converted into initiators for RDRP procedures, tethered to the surface. Optionally the increased number of functional groups can be reacted with difunctional molecules, wherein one functional group may link the molecule to the higher fraction of hydroxyl groups on the surface, and the other functional group allows interaction with or reaction with matrix-forming reagents.

The average diameter of the Nanoarc γ-δ alumina particles was set forth by the supplier, Alfa Aesar, to be 20 nm. TEM imaging showed the pristine Nanoarc γ-δ alumina particles had a regular spherical shape, but the particle size was not very uniform. PMMA-modified γ-δ alumina nanoparticles were more dispersible, compared to pristine particles, but the size and shape of particles remain unchanged. Under the same reaction conditions as set forth above, PMMA brushes can be grafted from the surface of γ-δ alumina nanoparticles (which exhibit a lower thermal conductivity than α-alumina particles), with grafting density of 0.05 chains/$nm^{-2}$ without preliminary surface treatment. The higher grafting density of PMMA brushes on the surface of γ-δ alumina is possible because of a larger number of readily available hydroxyl groups on the surface of γ-δ alumina compared to the more crystalline α-alumina. Under certain conditions the grafting density of polymer brushes introduced to γ-δ alumina surface via SI-ATRP can be as high as 0.1 chains/$nm^{-2}$.

This is the first report known to the inventors of relatively dense grafting polymer brushes from α-alumina surfaces. Increased grafting density allows, for example, dispersion of the functionalized particles in a targeted matrix or the formation of a coherent film comprising the functionalized particles in a matrix forming reaction with one or more reagents comprising reactive groups with complementary functionality. It is envisioned that increased graft density, or reactivity with precursors of a thermoset matrix, will, for example, enhance the thermal conductivity of a matrix/composition including the dispersed composite particle as the free volume of the tethered chains will be reduced and a condensed brush regime created.

B. Functionalization of Particles Via Grafting-from, Grafting-onto, Ligand Exchange and Polymer Template Methodologies As noted above, another representative material that exhibits a high value for thermal conductivity is ZnO. As also noted above, a major drawback of the grafting from functionalization procedure is the requirement of the presence of suitable coupling agents for each surface. Because of the relative inertness and weak nature of the bonding functionality present on standard ZnO surfaces, finding a suitable coupling agent to achieve efficient functionalization of ZnO, has been a significant challenge. Although modifications of ZnO surfaces through thiol, carboxylic acid, and silane coupling agents have be reported, none of the reported methods produced readily-dispersible ZnO products for nanoparticle composite systems.

In an alternative approach, the "grafting-to" or "grafting-onto" approach, polymers are formed separately from a particle and subsequently tethered thereto. The grafting onto approach allows a high degree of control of composition and architecture of the grafted polymer, as these properties can be more easily controlled in untethered polymers. Moreover, dispersability will be attained if grafting density is sufficiently high. Additionally, grafting-onto approach does not require a separate step for incorporation of a tethered initiator and further reduces overall synthetic expenses. Linear polymer chains used in a grafting-onto method can be attached to NP surface via covalent or non-covalent interactions between functional end-groups/blocks on the polymer chain with the particle surface. However, similar to the grafting-from approach, finding an appropriate combination of functional groups and formation of reactive surfaces remains a significant challenge. In addition, high grafting density is typically hard to achieve in a grafting-onto reaction because of steric repulsion between formed tethered polymer brushes.

Another efficient method to control steric stabilization and interaction of nanoparticles with polymer matrices is ligand exchange. In this method, it is possible to achieve high grafting densities, >1 chain/nm$^2$. Ligand exchange is based on the exchange of nanocrystal surface ligands with suitably functionalized telechelic copolymers. Pre-synthesized NPs may, for example, be stabilized by alkyl phosphine, silane, amine or carboxylic acids. The exchange of these surface ligands with polymer chains provides a robust route for a versatile and flexible polymer attachment procedure. However, the bonding in other polymer ligand/nanocrystal combinations has been found to be much weaker.

A block copolymer template method is another way to prepare inorganic particle/polymer hybrids. Nanoparticles may be prepared by reducing precursors immobilized within the functional block via a specific bonding. However stable micelles are difficult to retain during complex formation and in situ chemical reactions.

A star polymer is a stable polymer architecture containing multiple linear arms connected at a central crosslinked core. In a number of studies hereof, star polymers were used for the synthesis of inorganic materials because they are essentially thermodynamically stable unimolecular micelles. Star polymer templates may be used for the formation of a range of encapsulated metal oxide nanoparticles, including, for example, representative ZnO and titanium dioxide (TiO$_2$) hybrid nanoparticles. The methodologies hereof may be expanded, using the same or similar procedures, to include inorganic particles comprising titanium, zirconium, silicon, iron, lead, zinc, gold, silver, platinum, tin, aluminum, barium, cadmium, calcium, copper, magnesium, selenium, cerium or iridium. Furthermore, the template, nanoreactor procedure may be extended to include bottlebrush copolymers, wherein the linear functional segmented arms are tethered to functional groups along the backbone of a linear copolymer, thereby forming linear of branched inorganic particles within the functional brush macromolecule.

Notwithstanding difficulties in previously reported studies, all four methods for the synthesis of ZnO/polymer nanocomposites (grafting from, grafting onto, ligand exchange, and polymer templating) were shown to stabilize, for example, ZnO NPs with different sizes and shapes in both solvent and polymer matrix systems.

i. Grafting-onto Functionalization

Figure 3:
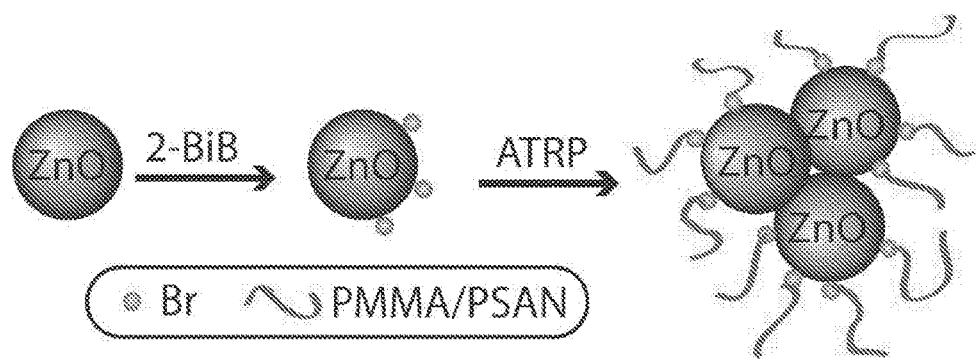
FIG. 3 illustrates schematically a representative embodiment of the synthesis of polymer brush grafted ZnO NPs by a "grafting from" method.

ZnO particles are another inorganic material of interest for formation of composite materials with improved thermal conductivity. As with α-alumina particles the most challenging part of that task effectively functionalizing the surface of pristine ZnO NPs with ATRP initiators or other functional groups that can interact directly with the targeted matrix materials to assist in dispersability. Pristine ZnO NPs with a 25 nm diameter were reacted with 2-BiB to introduce —Br functionalities onto the surface as ATRP initiators in a first step for synthesis of polymer grafted ZnO NPs by the "grafting-from" method. Impurities and byproducts were removed by washing the particles with methanol and after functionalization, the ZnO—Br particles were dried in air for 24 h to remove all solvents, and a brown powder was obtained. Because of the limited functionalization, ZnO—Br nanoparticles were partially dispersed but not fully dissolved in anisole as illustrated schematically in FIG. 3.

Activator ReGenerated by Electron Transfer ATRP (ARGET) ATRP, with a low concentration of copper, was employed for the grafting from polymerization instead of conventional ATRP, because of the facile setup and simplified catalyst removal process. Two kinds of particle brushes were synthesized: PMMA-g-ZnO and PSAN-g-ZnO NPs as each graft chain is compatible with a PMMA matrix. Because of the low degree of functionalization with ATRP initiators, large amounts of pristine ZnO NPs were removed from the formed hybrid particles by centrifugation after polymerization. Comparing the weight of centrifuged particles from the centrifuge tube and the mass of pristine ZnO NPs added into the reaction, we found that about 70 wt % ZnO NPs were not successfully functionalized. Nevertheless after polymerization and purification, the resulting hybrid nanoparticle product was soluble in THF and formed stable dispersions. Rather than seeing monodispersed NP brush systems, characterization of both particle brush systems showed NP clusters of 150-300 nm; PMMA-g-ZnO 260 nm, PSAN-g-ZnO 180 nm. However, compared to pristine ZnO NPs, these clusters could be dispersed in THF without significant further agglomeration.

It is possible that only a fraction of the surface for each ZnO nanoparticle was functionalized because of pre-functionalization aggregation. In such a case, during the polymerization, polymer brushes grow from those sites and started to dissolve in the solutions. While the bare surface parts stacked with other bare NPs and formed clusters in the solution, the grafted polymer brushes acted as surfactants and formed a shell to prevent further aggregation and precipitation. After purification, clear solutions were dried under air to remove THF, and products were obtained as white powder, which were later evaluated by TGA. ZnO was etched by HCl in a mixture of THF/water and the resulting former polymer brushes were precipitated from methanol and studied by size exclusion chromatography (SEC).

The results are shown in Table 4, and indicate that the grafted chains have a relatively high MW. Because of the covalent nature of the high MW polymer chains a grafting density >0.15 nm$^{-2}$, the grafted chains would be sufficient to stabilize these clusters in solutions. While some degree of agglomeration in dispersible particles may reduce optical properties, this may not be a limitation in composites targeting improved thermal conductivity provided by the distributed particles in a matrix as particle-particle interactions can improve thermal conductivity.

TABLE 4

Summary of PMMA/PSAN-g-ZnO nanoparticles prepared by "grafting-from"

| Identity | Polymer brush M$_n$ (g/mol)$^a$ | Inorganic fraction$^b$ | Grafting density (nm$^{-2}$)$^c$ | Average diameter (nm)$^d$ |
|---|---|---|---|---|
| PMMA-g-ZnO | 169,700 | 34% | 0.16 | 260 |
| PSAN-g-ZnO | 98,100 | 44% | 0.18 | 180 |

$^a$Determined by SEC;
$^b$determined by TGA;
$^c$calculated from inorganic fraction and polymer molar mass assuming all nanoparticles are spherical;
$^d$z-average hydrodynamic diameter in THF determined by dynamic light scattering (DLS)

ii. Grafting-onto Functionalization

Figure 4:
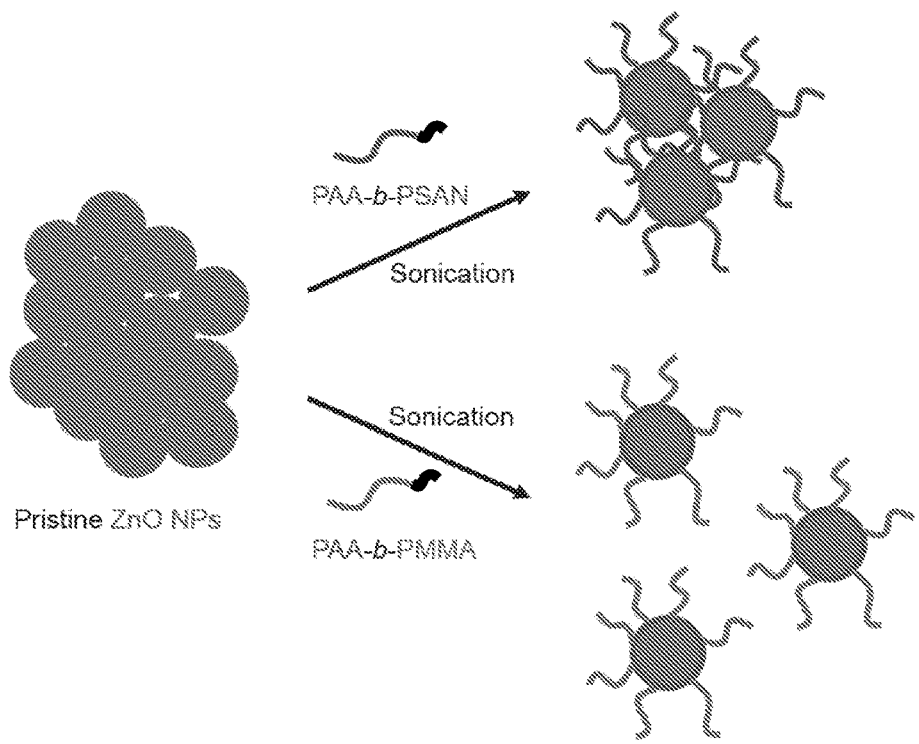
FIG. 4 illustrates schematically a representative embodiment of the synthesis of PSAN/PMMA-b-PAA-capped ZnO by "grafting-onto" method

The grafting-onto approach is one of the most widely used methods to fabricate polymer grafted NPs. The grafting of PMMA or PSAN brushes onto ZnO NPs was accomplished via the strong affinity of carboxylate functionality present on the ZnO surfaces as illustrated schematically in FIG. 4.

TABLE 5

Summary of PSAN/PMMA-capped ZnO by "grafting-onto" method

| Inorganic filler | Polymer[a] | Inorganic fraction[b] | Grafting density (nm$^{-2}$)[c] | Average diameter (nm)[d] |
|---|---|---|---|---|
| ZnO[e] | PAA$_{12}$-b-PSAN$_{62}$ | 93% | 0.11 | 160 |
| | PMMA$_{59}$-b-PAA$_{12}$ | 92% | 0.13 | 122 |

[a]Determined by SEC before hydrolysis;
[b]determined by TGA;
[c]calculated from inorganic fraction and polymer molar mass assuming all nanoparticles are spherical;
[d]z-average hydrodynamic diameter in THF determined by DLS;
[e]supplied by US Research Nanomaterials as dry powders, diameter 18 nm as claimed by the supplier.

As shown in Table 5 above, two diblock copolymers including a short poly(acrylic acid) (PAA) block were synthesized via ATRP and hydrolysis of the initial incorporated t-butyl acrylate block. In the case of preparing the PAA-b-PSAN block copolymer a short poly(tert-butyl acrylate (P(tBA)) block was initially synthesized via Initiator for Continuous Activator Regeneration (ICAR) ATRP followed by chain extension with an azeotropic mixture of styrene (S) and acrylonitrile (AN). In the case of the PAA-b-PMMA, a PMMA-Br macroinitiator was synthesized first to avoid inefficient initiation from an acrylate chain end in the chain extension polymerization. The tert-butyl group was hydrolyzed by reaction with 10 vol % trifluoroacetic acid (TFA) in methylene chloride (DCM).

In both cases, the NPs were first dispersed in THF with a probe sonicator to sufficiently expose the surface of the particles to the carboxylic acids. After that, the reaction mixture was sonicated at 50° C. for 48 h. No residual sediment was observed in the resulting dispersion. However, the two samples displayed two distinctly different results. In the case of PSAN grafted ZnO, a low level of aggregation of NPs, of approximately 150 nm, was observed by both dynamic light scattering (DLS) and TEM. This observation may, for example, be ascribed to the affinity of the relatively polar PSAN block to the ZnO surface. As a result, PAA-b-PSAN may "glue" the NPs together. In contrast, PMMA-capped ZnO displayed significantly smaller sized aggregates.

iii. Ligand Exchange Functionalization

Figure 5:
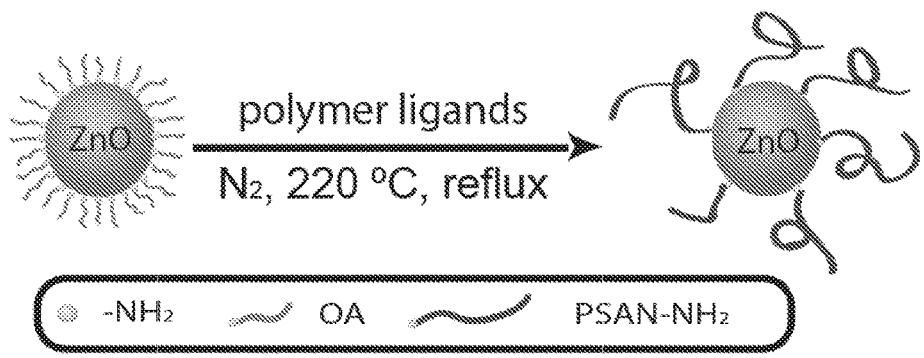
FIG. 5 illustrates a representative embodiment of the synthesis of PSAN-capped ZnO nanoparticles by a "ligand exchange" method.
Figure 6A:
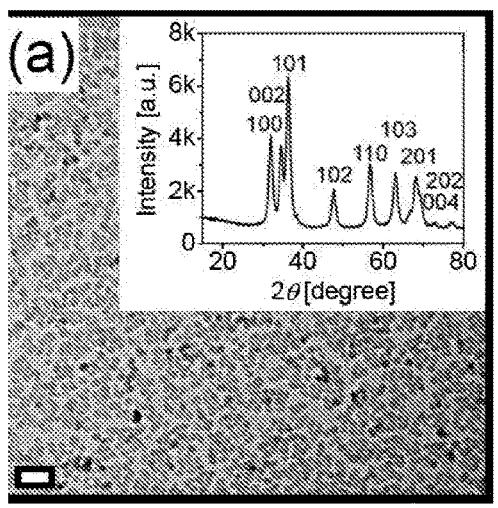
FIG. 6A illustrates a TEM image of OA-capped 5 nm ZnO NPs, wherein the insert depicts representative XRD pattern of OA-capped ZnO, and reflections correspond to the (100), (002), (101), (102) and (110) planes.
Figure 6B:
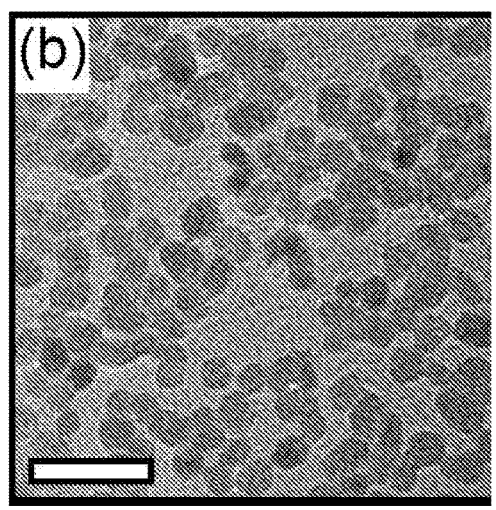
FIG. 6B illustrates an enlarged TEM images of OA-capped 5 nm ZnO NPs.
Figure 6C:
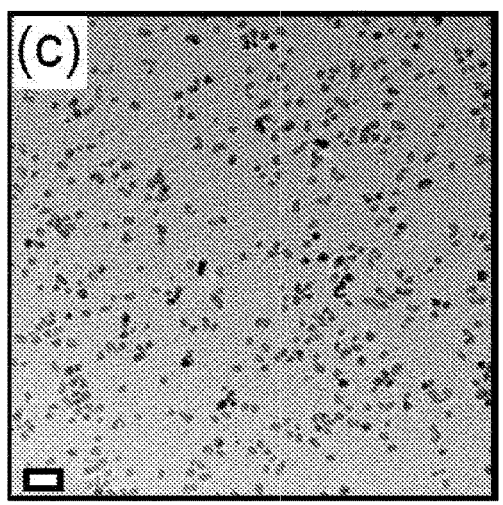
FIG. 6C illustrates a TEM image of PSAN-capped 5 nm ZnO NPs, $M_n=2300$, $M_w/M_n=1.13$.
Figure 6D:
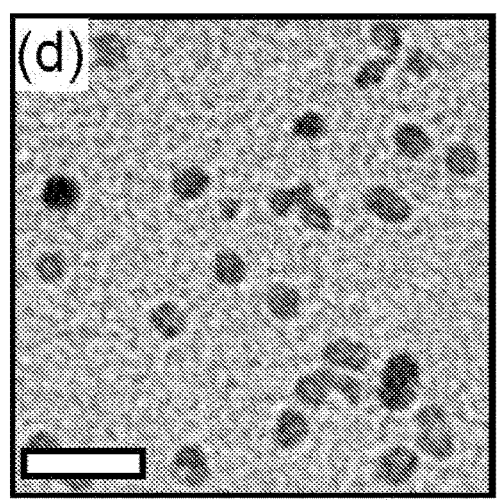
FIG. 6D illustrates an enlarged TEM images of PSAN-capped 5 nm ZnO NPs, $M_n=2300$, $M_w/M_n=1.13$, wherein the scale bars are 20 nm in the TEM images of FIGS. 6A through 6D.
Figure 6E:
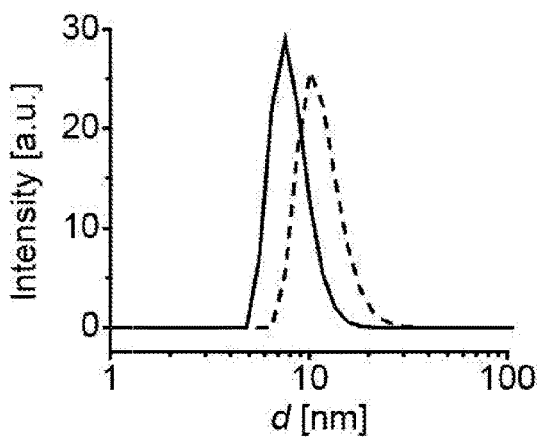
FIG. 6E illustrates size distribution of OA/PSAN-capped ZnO NPs measured by DLS in THF solution (intensity-average particle size: OA-capped ZnO NPs, 7.5 nm, PSAN-capped ZnO NP, 10.1 nm).

Ligand exchange functionalization was studied via the synthesis of PSAN-capped ZnO by the ligand exchange method illustrated schematically in FIG. 5. In several representative studies, octylamine(OA)-capped ZnO nanoparticles were synthesized via controlled decomposition of zinc 2-ethylhexanoate (Zn(EH)$_2$) in the presence of octylamine. See, for example, Chem. Mater. 2005, 17, (25), 6468. Octylamine (OA) was chosen as ligand for the formation of the ZnO nanoparticles because of its boiling point of 175° C. prevents rapid evaporation during thermolysis of Zn(EH)$_2$. Ligand exchange of OA with PSAN-NH$_2$ was performed in diphenyl ether (DPE) at T=180° C. to concurrently drive the replacement reaction and remove unbound OA from the reaction mixture. The replacement reaction gave rise to a distinctive change in solubility characteristics. Whereas OA-capped ZnO NPs were stable in THF or hexane, PSAN-capped ZnO NPs formed after ligand exchange precipitated in hexane. Thus, free PSAN-NH$_2$ was removed by applying "selective precipitation, centrifugation, dissolution" cycles. FIGS. 6A and 6B are TEM images of OA-capped 5 nm ZnO NPs, and the inset in FIG. 6A is the X-ray diffraction (XRD) pattern of OA-capped ZnO. FIGS. 6C and 6D are TEM images of PSAN-capped 5 nm ZnO NPs, $M_n$=2300, $M_w/M_n$=1.13; scale bars=20 nm. FIG. 6E shows the size distribution of OA/PSAN-capped ZnO NPs measured by DLS in THF solution, intensity-average particle size: OA-capped ZnO NPs, 7.5 nm, PSAN-capped ZnO NP, 10.1 nm. The functionalized NPs were stable in THF/hexane for weeks without any aggregation or precipitation. Dispersion samples were characterized by TEM and DLS, which showed narrow particle size distribution (average size was 5 nm). The crystallinity of ZnO nanoparticles was characterized by X-ray diffraction (XRD) of dried samples.

Figure 6F:
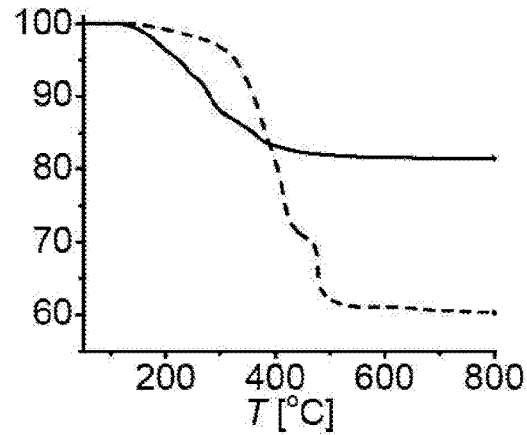
FIG. 6F illustrates TGA traces of OA/PSAN-capped ZnO NPs. Black line: OA-capped ZnO, red line: PSAN-capped ZnO.

Nanoparticles were also studied by TGA and the results are shown in FIG. 6F. The weight loss was measured while heating from room temperature up to 800° C. The ZnO content was 17-18%. With a mean diameter of the nanoparticles of 5 nm and a bulk density of ZnO nanoparticles of 5.6 g/cm$^3$, the molecular weight of OA and the weight fraction of amine ligands from the TGA measurement allowed a grafting density of 4.4 nm$^{-2}$ to be calculated for the OA-capped ZnO.

PSAN-NH$_2$ ligands were synthesized via ARGET ATRP. Several reactions were carried out with different target degrees of polymerization (DPs) and reaction times. The conditions and sample information are listed in Table 6 below. Products were studied by SEC and $^1$H NMR. In an attempt to avoid leaving free polymers in the product, a limited number of PSAN-NH$_2$ ligands were initially added into the reactions. The highest molar ratio of PSAN-NH$_2$: OA ligand was around 1:6; e.g. 1 g OA-capped ZnO to 300 mg PSAN-NH$_2$ ligands with $M_n$=1,300 g/mol. After the ligand exchange reaction, an obvious change in properties was that the product could be precipitated by addition of the reaction medium to hexane, which is a good solvent for OA-capped ZnO. The PSAN-capped ZnO NPs product could thus be purified simply by removing excess unreacted OA-capped ZnO in the hexane solution used to precipitate the desired product. After removing the unreacted OA, yellow powders were obtained and were characterized with TEM, DLS and TGA.

TABLE 6

Results of Synthesis of PSAN-NH$_2$ polymer ligands

| Entry | Monomers | DP$_{target}$[b] | $M_n$[a] (g/mol) | DP | $M_w/M_n$[a] |
|---|---|---|---|---|---|
| 1 | S & AN | 40 | 1300 | 15 | 1.32 |
| 2 | S & AN | 40 | 2000 | 23 | 1.20 |
| 3 | S & AN | 80 | 3800 | 45 | 1.29 |
| 4 | S & AN | 240 | 8000 | 94 | 1.21 |

[a]Molecular weights and molecular weights distribution was measured by THF SEC using linear PS standards as calibration;
[b]Reaction conditions: Initiator/S/AN/CuBr$_2$/Me$_6$TREN/Sn(EH)$_2$ = 1/0.63DP$_{target}$/ 0.37DP$_{target}$/0.005/0.1/0.1, T = 60° C., in anisole (25 vol-%), dimethylformamide (DMF) (2.5 vol-%).

PSAN was selected again as a representative polymer tether for ligand exchange because PMMA/PSAN constitutes a miscible polymer blend with lower critical solution temperature (LCST) behavior that shows reversible transition between miscible and phase separated states provided that the molar ratio x=n(AN):n(S) is within the miscibility window $0.09 < x < 0.38$. The interaction parameter of the PSAN/PMMA system depends on both the constitution of PSAN as well as the composition of the blend. In the present studies, the molar composition of the random co-polymer was S:AN=3:1, and the corresponding interaction parameter was $\chi_{MMA/SAN} \approx -0.15$ (at T≈25° C.).

To understand the role of PSAN modification on particle/matrix interactions, the thermomechanical properties of films were examined as well as their microstructure. Heat flow curves of pristine and ZnO-PSAN filled PMMA revealed an increase of the glass transition temperature with particle filling content from $T_g$=104° C. (for pristine PMMA) to $T_g$~115° C. (for $f_{ZnO}$=0.18). The increase of $T_g$ supports previous reports on PMMA composites with PSAN-modified silica particle fillers and can be interpreted as a consequence of the attractive interactions between PSAN tethers and the PMMA matrix. The $T_g$ of ZnO-PSAN/PMMA composites leveled off at a ZnO filling fraction of $f_{ZnO}$~0.18 (in fact a small reduction in $T_g$ was observed for $f_{ZnO}$~0.27). This trend may, for example, be a consequence of the large specific surface area of 5 nm ZnO fillers that implies the saturation of surface-segment interactions at rather low particle filling fractions.

Figure 7:
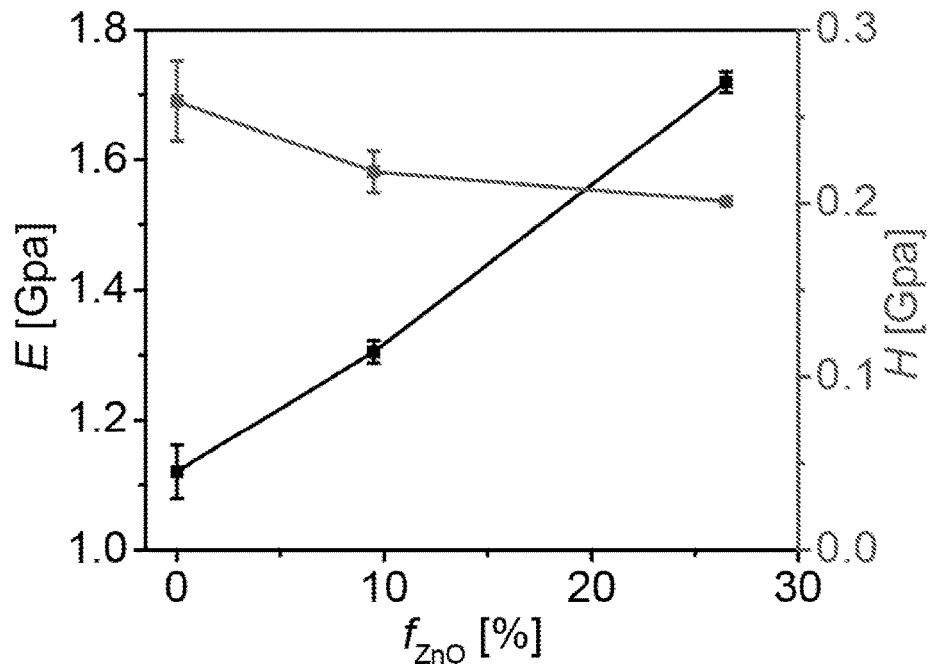
FIG. 7 illustrates nanoindentation measurements of PSAN-capped ZnO in PMMA with different ZnO content.

The favorable interactions between ZnO-PSAN particle fillers and the PMMA matrix were confirmed by evaluation of the elastic modulus of composite films that was measured using nano-indentation of ~500 µm thick films. FIG. 7 summarizes the elastic moduli and hardness values that were determined for the distinct ZnO-PSAN/PMMA systems. FIG. 7 reveals an increase of the elastic modulus from 1.12 GPa for pure PMMA to 1.31 GPa for 10 wt % PSAN-capped ZnO and 1.72 GPa when the inorganic content was 27 wt %. Since the resistance to elastic deformation directly depends on the bonding strength in materials, the 55% increase as compared to pristine PMMA provides support for increased dispersion interactions in the miscible PSAN/PMMA system. Nanoindentation was chosen primarily because of the ability to evaluate the mechanical properties of small material volumes. Because the mechanical characteristics are deduced from indentation rather than stress-strain experiments the absolute values often differ from bulk values by up to 20%. However, trends were correctly reproduced.

Figure 8A:
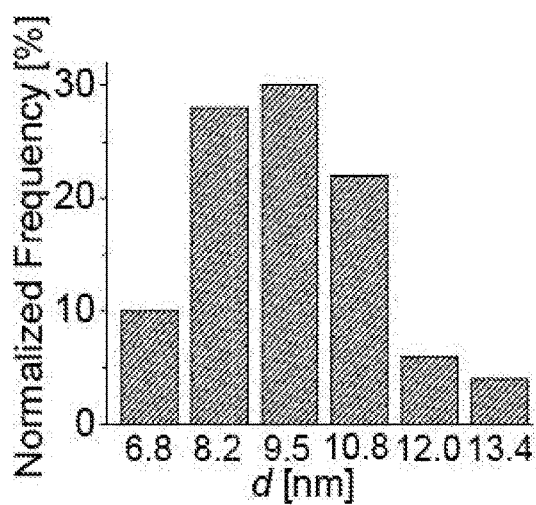
FIG. 8A. illustrates size distributions of ZnO nanocomposite in the matrix PSAN-capped ZnO/PMMA bulk films with 10 wt % ZnO content
Figure 8B:
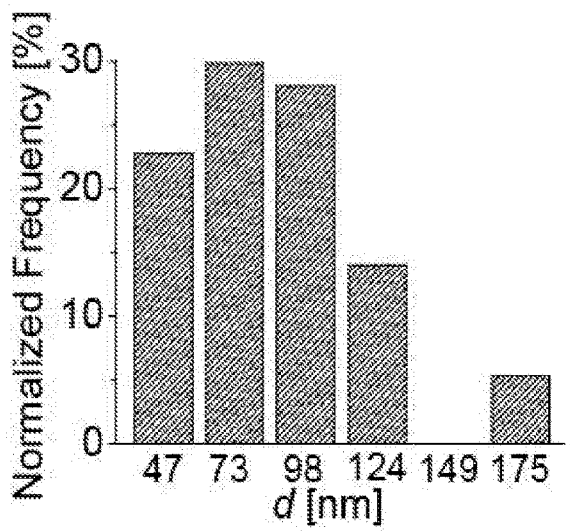
FIG. 8B illustrates size distributions of ZnO nanocomposite in the matrix OA-capped ZnO/PMMA bulk films with 10st % ZnO content.

Characterization of the microstructure of PMMA/ZnO-PSAN composites by transmission electron microscopy (TEM) confirmed the randomly dispersed morphology expected for miscible blends. TEM images were taken on micro-sections of bulk films of PMMA filled with PSAN and OA tethered ZnO particles at $f_{ZnO}$~0.1. Image analysis of micrographs revealed an average particle distance in the PMMA/ZnO-PSAN system is $\langle d_{p-p} \rangle$=1.06 nm, approximately equal to the expected particle distance of randomly dispersed structures $d_{th}=(V/N_p)^{1/3}$=0.96 nm (with $N_p/V$ denoting the volume density of particles). A further indicator of a thermodynamically stable particle dispersion is the particle size distribution shown in FIG. 8A and the average particle diameter $\langle d \rangle$=10.1 nm that closely matched one of the pristine ZnO-PSAN particles. This is in contrast to the microstructure observed in PMMA/ZnO-OA systems that revealed the formation of aggregates with an average size of $\langle d_{aggr} \rangle$=99.3 nm (FIG. 8B). The formation of aggregates is indicative of a phase separating system in which dynamics and thermodynamic driving forces determine the respective aggregate dimension. The different dispersion characteristics of ZnO-PSAN and ZnO-OA particle fillers have a profound impact on the optical properties of PMMA composite films.

FIGS. 10A through 10E provide photographs of films with systematic variation of ZnO content with and without PSAN modification. FIGS. 10B and 10C reveal that optical transparency in ZnO-PSAN based composites is comparable to pristine PMMA (FIG. 9A). Significant loss of transparency is incurred upon dispersion of ZnO-OA particles in PMMA (FIG. 9E) despite the significantly lower inorganic content. The opacity of ZnO-OA based composite films may, for example, be a direct consequence of the aggregation behavior that was discerned from photomicrographs.

As described above, the scattering cross-section of particle fillers depends on the square of the particle volume and hence on the sixth power of the particle size ($C^{sca} \sim V_p^2 \sim r_p^6$) as described above. The clustering of ZnO particles observed in the immiscible PMMA/ZnO-OA system thus dramatically raises the scattering losses in phase separating polymer/particle blend system. ZnO-containing particle films exhibited a weak yellowish coloration, which may, for example, be attributed to partial oxidation of excess amine ligands (which can be removed by purification) as well as to the preferential scattering of short wavelengths of small particle fillers. This behavior is in stark contrast to the behavior discussed below for dispersions of ZnO-OA in the precursor of a PDMS matrix which resulted in a transparent product.

The yellow color was not present when two reactions were conducted at a lower reaction temperature −140 degrees. The yield of this reaction was as high as high temperature reaction. However, when the samples were characterized the DLS showed the average particles size is around 12-20 nm. Also, TEM showed small particles that had partially aggregated, also not fully crystallized. In this situation, it may, for example, be that the oxidation of amine would only occur at high temperature, or maybe the high crystallized ZnO would give some yellow color itself. These reactions however indicate that the color problem is strongly related to the high reaction temperature.

Figure 10:
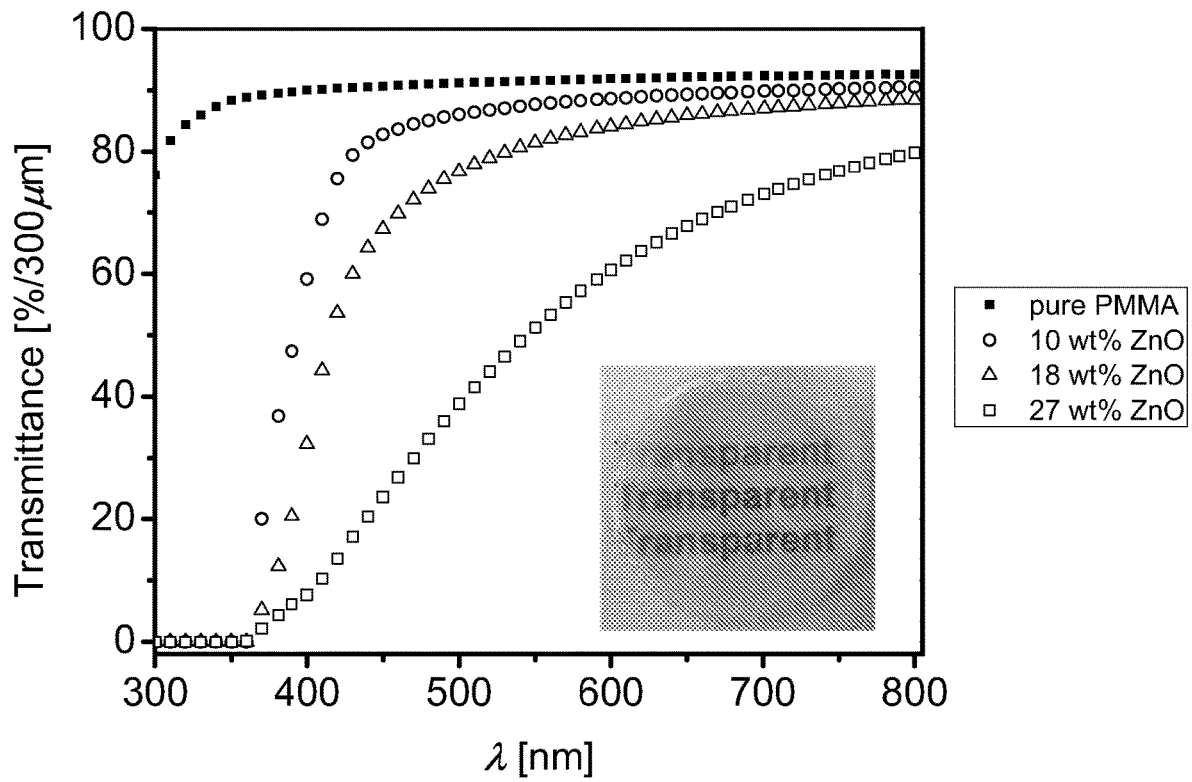
FIG. 10 illustrates transmission vs wavelength plots of pure PMMA film with a 338 μm thickness, and hybrid bulk films of similar thickness including three different concentrations of PSAN-capped ZnO nanoparticles, wherein the insert is a photograph of PSAN-capped ZnO/PMMA bulk films with 27 wt % ZnO (370 μm).

The transparency of the bulk films was quantitatively measured using UV-vis spectroscopy. Since each film had a different thickness, the measured data was normalized to equal film thickness. FIG. 10 depicts the normalized (to equal film thickness) transmission curves for pristine PMMA and ZnO-PSAN/PMMA blend materials. FIG. 10 reveals that optical transparency in excess of 0.8/length$^{-1}$ is retained for wavelengths λ >500 nm up to particle loadings of $f_{ZnO}$=0.18. An optical transmission of 0.8 is commonly considered to be the threshold for a material to be recognized as transparent "to the eye". All transmission curves shown in FIG. 10 indicate a dependence that is characteristic for scattering losses (in the limit of Rayleigh scattering x=4). As expected, scattering losses increase with particle loadings. However, even at $f_{ZnO}$=0.27, a transparency T~0.6 (length)$^{-1}$, at λ =500 nm, is retained. For all systems, the transmittance vanished in the 300-365 nm range, as a result of absorption. The observed UV-blocking coincides with the absorption edge of 5 nm ZnO NPs that is estimated to be at 3.37 eV (or 369 nm). The high transparency in the visible range combined with a complete UV-cutoff renders PMMA/ZnO-PSAN composites interesting candidate materials for applications of transparent UV filters.

An intriguing application of low-scattering ZnO-particle fillers is in the fabrication of high refractive index polymer glasses that play an important role as optical materials. This is because ZnO exhibits a refractive index of $n_{ZnO}$=1.973–

2.105 in the visible range. Tethering polymer chains alter the refractive index of particle fillers. The effective refractive index of ZnO-PSAN core-shell particles can be estimated using homogenization models such as Maxwell Garnett theory as:

$$n_{eff,p}^2 = n_{shell}^2 \left[1 + \frac{3\phi x}{1 - \phi x}\right] \quad (1)$$

where $$x = \frac{n_{core}^2 - n_{shell}^2}{n_{core}^2 + 2n_{shell}^2};$$

$n_{shell}$ and $n_{core}$ represent the refractive index of the shell and core, respectively; and $\Phi = v_{core}/(v_{core}+v_{shell})$ is the relative core volume. In this study, the $n_{ZnO}$ and $n_{PSAN}$ were 1.989 and 1.558 (corresponding to a wavelength $\lambda$ =632 nm), respectively. Using the compositional values as determined from TGA measurements, the effective refractive index of PSAN-capped ZnO was calculated to be $n_{eff,p}$=1.650. The use of low MW polymer tethers is an important prerequisite to enable high $n_{eff,p}$ of particle fillers since it facilitates a high inorganic content of the core-shell particles.

The effective refractive index of PMMA/ZnO-PSAN of composites formed with different concentrations of PSAN-capped ZnO in a PMMA matrix measured using ellipsometry at $\lambda$ =632 nm on thin film samples that were fabricated by spin coating of particle/polymer solutions. Table 7 summarizes the results, revealing that the effective index of PMMA/ZnO-PSAN composites increases to ~1.53 at $f_{ZnO}$=0.27. Further increase of the particle concentration allows to realize $n_{eff}$~1.64 at the maximum achievable inorganic loading.

TABLE 7

Compositions, RI and calculated RI of pure PMMA and PMMA/PSAN-capped ZnO thin films

| Sample ID | $f_{ZnO}^a$ | $f_{PSAN}^b$ | $f_{PMMA}^b$ | RI$^c$ | RI (theoretical) |
|---|---|---|---|---|---|
| Pure PMMA | 0 | 0 | 100 | 1.485 | 1.488 |
| ZnO/PMMA-1 | 10 | 6.7 | 83.3 | 1.502 | 1.504 |
| ZnO/PMMA-2 | 18 | 12 | 70.0 | 1.517 | 1.518 |
| ZnO/PMMA-3 | 27 | 18 | 55.0 | 1.531 | 1.537 |
| ZnO/PMMA-4 | 38 | 25.3 | 37.7 | 1.557 | 1.566 |
| Pure PSAN-capped ZnO | 60 | 40 | 0 | 1.640 | 1.650 |

Figure 11:
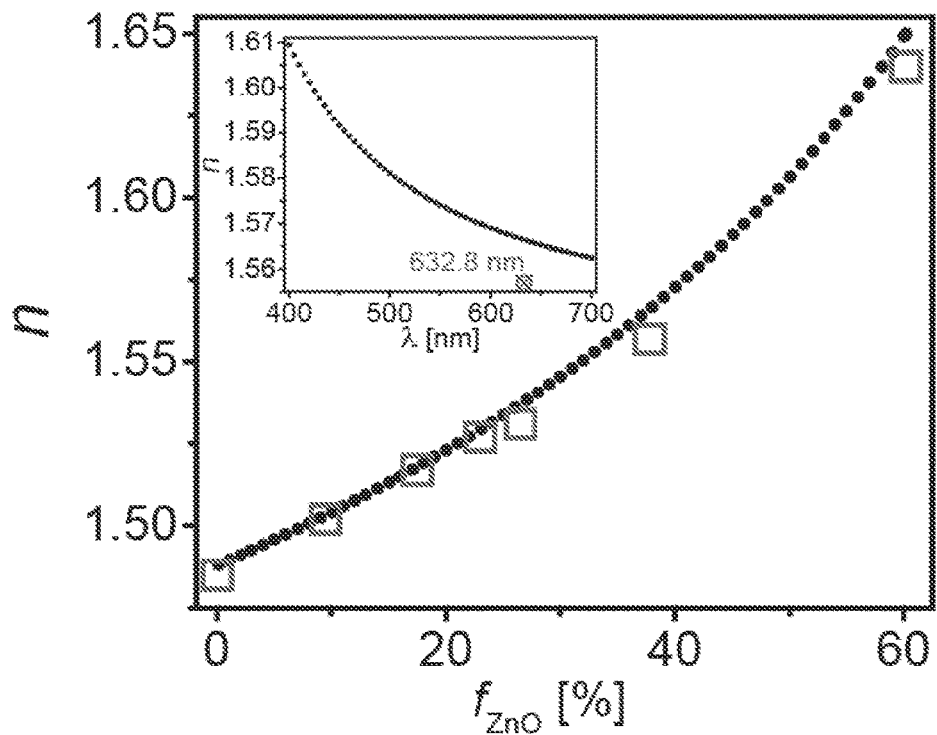
FIG. 11 illustrates a plot of RI vs. ZnO content in hybrid thin films wherein the measured data are shown as squares while the dash line shows the theoretical value, wherein the inset shows the refractive index of ZnO/PMMA hybrid bulk film (38 wt % ZnO content) at different wavelengths.

$^a$Determined by TGA;
$^b$calculated according to TGA data;
$^c$determined by ellipsometer There was a good agreement with the theoretically predicted values. It is known that the material's refractive index significantly depends on the applied wavelength. In the visible light range, a lower wavelength will result in a higher refractive index. According to our prediction, the refractive index (RI) of PSAN-capped ZnO in PMMA matrix with a ZnO content of 38 wt % was 1.610 at the wavelength of 400 nm (see the inset of FIG. 11). The increase of the RI of PMMA with the inorganic content illustrated in FIG. 11 broadens its utility in applications requiring high RI.

In a number of studies, well-defined PSAN-capped 5 nm ZnO NPs were synthesized through a ligand exchange method. The initial surfactant OA ligands were efficiently replaced by PSAN-NH$_2$ polymer ligands at elevated temperatures. ZnO/PMMA hybrid bulk and thin films were prepared by solvent and spin casting, respectively. The transparency, mechanical properties, and RI of these hybrid materials were evaluated. After dispersing PSAN-capped ZnO polymer nanocomposite in PMMA matrix, both the T$_g$ and moduli of the hybrid materials increased, which indicated the favorable interactions between the filler and the matrix. The scattering effect was insignificant because of the small size of the NPs, and the bulk film displayed high transparency even after the ZnO content was increased to 27 wt %. Additionally, the RI of the hybrid materials increased from 1.485 to 1.640 as the ZnO content increased. This work broadens the methodology applied to synthesis of nanofillers for polymer nanocomposites and provide for future advanced applications in optical materials.

iv. Functionalization in Star and Brush Polymer Templates

Figure 12:
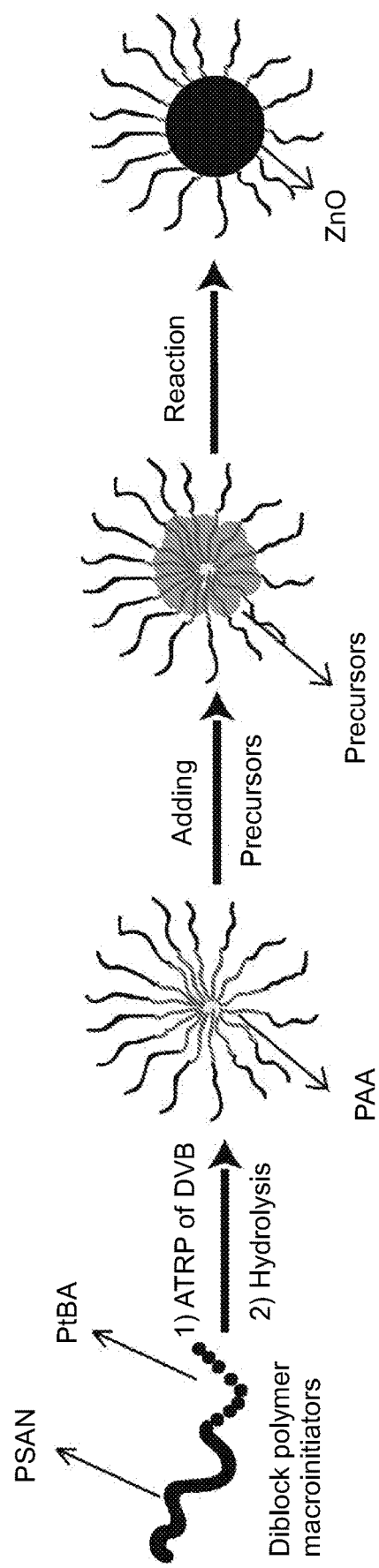
FIG. 12 illustrates schematically an embodiment of representative method for hybrid ZnO nanoparticle formation using PSAN-PAA-PDVB star polymer templates.

FIG. 12 illustrates another embodiment of a method or procedure hereof to prepare well defined inorganic nanoparticles with a shell of functional polymer chains suitable for compatible interactions with a specific matrix. The method of FIG. 12 can be considered a "star first" procedure, in which an "arm-first" method was applied to synthesize PSAN-PAA-PDVB star polymers, which can be used as a stable soft template for the fabrication of ZnO hybrid nanomaterials.

ARGET ATRP was used for both the preparation of the multifunctional macroinitiator (MI) and linkage of the arms by chain extension with divinyl benzene (DVB). Initially, a PSAN-Br macroinitiator, with M$_n$=5,800 g/mol and M$_w$/M$_n$=1.12 and high chain end functionality was synthesized via ARGET ATRP. The macroinitiator was chain extended with a second monomer, (tBA), to form PSAN-b-PtBA-Br diblock polymer. The SEC curves of the product shifted to higher molecular weight, indicating the formation of diblock copolymers. Finally, DVB was employed to chain extend and cross-link the PSAN-b-PtBA-Br MIs to form the PSAN-PtBA-PDVB star polymer. A timed-feeding method was used in the reaction to control the concentration of activator in the system forming a PSAN-PtBA-PDVB star block polymer (M$_n$=67,800 g/mol, M$_w$/M$_n$=1.88). After deprotection with trifluoroacetic acid (TFA), the PSAN-PAA-PDVB star polymer was obtained. The SEC curves show decreasing signal corresponding to the unreacted MIs and increasing peak at higher molecular weight region which suggests formation of star polymers.

The PSAN-PAA-PDVB star polymers were used as templates to load with Zn(EH)$_2$, given that Zn(EH)$_2$ is inexpensive, air-stable, and nontoxic. Star templates were designed (see samples 1, 2 and 3 in Table 8) with different DP of PAA chain lengths, 40, 70 and 90, respectively, to study the effect of changes in the size of the star templates on the structure of the ZnO NPs. Retaining an equal DP of PSAN of the star templates facilitated better comparison of the amount of inorganic loading in the PAA core, as shown in Table 8. TGA determined the weight of ZnO in the star templates increased from 11.7 wt % with DP 40 of PAA to 27.5 wt % with DP 90 of PAA, thereby confirming that longer PAA chains were able to load more Zn(EH)$_2$ precursors into the core, since the mobility and free volume space of these chains increased with increasing length of PAA chains.

TABLE 8

Results of PSAN-PAA-PDVB star polymer templates

| Entry | composition | $M_{n,\ PSAN}^{a}$ (g/mol) | $M_{n,\ PAA}^{a}$ (g/mol) | $M_{n,\ star}^{a}$ (g/mol) | $M_w/M_n^a$ | $D_{h,\ star}^{b}$ (nm) | $D_{h,\ star+ZnO}^{c}$ (nm) | Amount of ZnO$^d$ | Diameter ZnO (nm)$^e$ |
|---|---|---|---|---|---|---|---|---|---|
| 1 | PSAN$_{70}$-PAA$_{40}$-PDVB | 5,800 | 11,000 | 67,800 | 1.88 | 16 ± 1.8 | 20 ± 2.2 | 11.7% | 3-5 |
| 2 | PSAN$_{70}$-PAA$_{70}$-PDVB | 5,300 | 13,000 | 60,600 | 3.0 | 18 ± 2.0 | 22 ± 1.8 | 17.2% | 3-5 |
| 3 | PSAN$_{70}$-PAA$_{90}$-PDVB | 6,000 | 17,000 | 61,300 | 3.0 | 20 ± 2.2 | 24 ± 2.3 | 27.5% | 3-5 |

$^a$Molecular weights and molecular weights distribution was measured by THF SEC using linear PS standards as calibration;
$^b$D$_h$ of PSAN-PAA-PDVB star polymer in DMF measured by DLS;
$^c$D$_h$ of PSAN-PAA-PDVB star polymer loading with ZnO NPs in DMF measured by DLS;
$^d$the amount of inorganic ZnO NPs of hybrid materials measured by TGA;
$^e$the diameter of ZnO NPs measured by TEM.

The hydrophilic PAA blocks inside the core of the star block copolymer induce preferential incorporation of Zn(EH)$_2$ into the interior space of the star via strong coordination bonding between the metal moiety of the precursors and the functional groups of PAA(—COOH) segments, whereas the outer PSAN corona does not form a complex with Zn(EH)$_2$ and remained unloaded. To ensure that PAA cores were completely filled with precursors, excess amounts of Zn(EH)$_2$ were sequentially loaded into the star template solutions. The hybrid nanomaterials in dimethylformamide (DMF) were then refluxed at 180° C. for complete hydrolysis of Zn(EH)$_2$, forming ZnO NPs inside of the star templates upon hydrolysis. The shell of the formed nanoparticles remained intimately and permanently connected to the hydrophobic PSAN blocks. The presence of a PSAN corona was necessary to avoid intermolecular cross-linking upon hybrid formation and to solubilize the ZnO hybrid NPs in organic solvents, such as toluene, THF, chloroform, DCM, DMF, etc., to form a stable and transparent solution. There was some free ZnO NPs formed from the presence of excess precursors in the solution, which could be easily removed by precipitation from the solvent.

After infiltration and thermal hydrolysis of Zn(EH)$_2$ within the star templates, the chains of PAA compartment were stretched and the average diameter of the star increased to 25 nm compared to the 18 nm of the pristine unloaded star templates, which was determined by DLS. TEM images of thermally hydrolyzed ZnO hybrid NPs showed that ZnO NPs were homogeneously dispersed inside the core of the star polymer with no free ZnO NPs in the background. The ZnO NPs had good uniformity with diameter of 3-5 nm. TEM images of inorganic particles formed from the precipitates of free ZnO NPs formed in the solution show aggregation of nanostructures indicating that the presence of hydrophobic PSAN blocks was crucial to ensure the miscibility of NPs with the host matrix by preventing them from aggregation.

XRD patterns confirmed the formation of crystalline ZnO from different Zn-precursors. The XRD pattern included diffraction peaks corresponding to the reflections from (100), (002), (101), (102) and (110) planes of a wurtzite ZnO crystal. Peak broadening suggested that the individual crystalline NPs were quite small. TGA determined the weight of ZnO inside the star templates with 40 repeating units of PAA to be 11.7 wt %. Whereas the measured diameter of ZnO is the same as 3-5 nm from the Zn(EH)$_2$ precursors, indicating that the observed size of ZnO NPs is, to some degree, independent of the PAA core of star templates, TGA does indicate a higher loading with increased DP of the PAA segment.

To further study the effect of the Zn precursors on the size and structure of the ZnO NPs, three different zinc compounds, Zn(EH)$_2$, zinc nitrate (Zn(NO$_3$)$_2$), and zinc acetate (Zn(OAc)$_2$) were used as precursors to complex with SAN$_{70}$-b-AA$_{40}$-star templates. TEM analysis was carried out to determine the morphology, size and crystalline nature of the synthesized ZnO crystals. PSAN-capped ZnO nanoparticles were synthesized using different star polymer templates and Zn(EH)$_2$ precursors: (a) PSAN$_{70}$-PAA$_{40}$-PDVB star polymer, (b) PSAN$_{70}$-PAA$_{70}$-PDVB star polymer, and (c) PSAN$_{70}$-PAA$_{90}$-PDVB star polymer. TGA studies of PSAN-PAA-PDVB ZnO nanoparticles DLS studies of PSAN-PAA-PDVB ZnO nanoparticles in DMF solutions were also carried out. The diameter of ZnO NPs was observed to be approximately 8, 4-5 and 3 nm for the precursors Zn(NO$_3$)$_2$, Zn(EH)$_2$ and Zn(OAc)$_2$, respectively. ZnO NPs formed from Zn(NO$_3$)$_2$ had a higher contrast than those formed from Zn(EH)$_2$ and Zn(OAc)$_2$, but the yield of the NPs was not as high. It could be observed from TEM images that there were some free ZnO NPs aggregated in the background. This can be attributed to the fact that potassium hydroxide (KOH) is a strong base and can efficiently react with Zn(NO$_3$)$_2$ to form Zn(OH)$_2$. The hydrolysis of Zn(OH)$_2$ is much faster than the decomposition of an organic acid based zinc, such as Zn(EH)$_2$ and Zn(OAc)$_2$. The base (KOH) forms a complex with Zn$^{2+}$ more quickly than the PAA, resulting in the formation of Zn(OH)$_2$ in the solution which will form free ZnO NPs and is the reason for the low yield of ZnO NPs. ZnO could be directly obtained from Zn(EH)$_2$ and Zn(OAc)$_2$ after reflux in DMF as a result of the metal-oxygen bond in organometallic precursors. These ZnO NPs dispersed well in solution with good uniformity. The diameter of ZnO NPs formed from Zn(OAc)$_2$ was 3 nm smaller than that of the nanoparticles formed from Zn(EH)$_2$. All samples were identified by XRD as wurtzite ZnO crystals containing diffraction peaks corresponding to the reflections from (100), (002), (101), (102) and (110). These results demonstrate that the size of ZnO NPs was dependent on the composition of the zinc precursors.

The purified hybrid ZnO NPs were redissolved in DMF and then an additional excess of Zn(EH)$_2$ precursors was added to the solution. The hybrid nanomaterials in DMF were then refluxed at 180° C. to ensure complete hydrolysis of the Zn(EH)$_2$ precursors. TEM showed the size of ZnO NPs increase greatly from 5 nm to 20 nm after sequential loading. DLS also showed DH of star polymers containing ZnO NPs increased from 20 nm to 45 nm with increase of inorganic content from 11.7 wt % to 30 wt % measured by TGA. These results demonstrated that the initially encapsulated ZnO NPs could be used as seeds to grow larger NPs through sequential loading of Zn(EH)$_2$ precursors.

Figure 13:
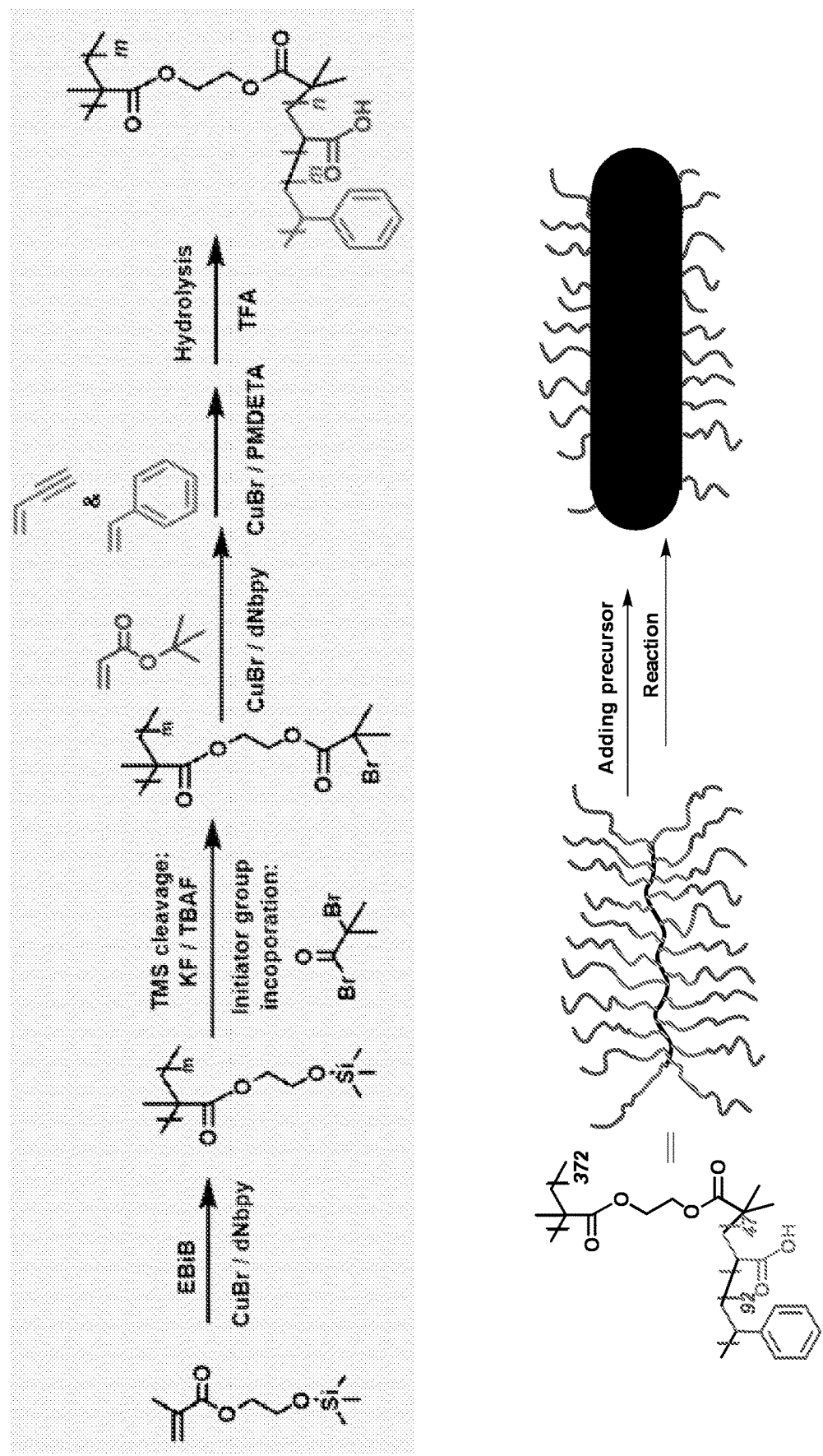
FIG. 13 illustrates schematically an embodiment of representative method for loading inorganic particles within a brush macromolecule.

An additional, related procedure to form dispersible macromolecular structures with high mole fractions of in situ synthesized ZnO is the formation of ZnO/PS-b-PAA brush copolymers as illustrated in FIG. 13. This embodiment was exemplified by preparation of a linear $PS_{92}$-b-$PtBA_{47}$-brush macromolecule as the functional segmented copolymer for loading with a ZnO precursor, exemplified below by Zn(EH)$_2$, which can be loaded within the extended linear core of the PS-b-PAA brush copolymer. The formed ZnO particles were encapsulated by the outer PS-shell and each particle was in close contact with the neighboring particles thereby providing interparticle connectivity while retaining a shell structure that can be dispersed in a selected matrix copolymer or even form a coherent film by intra-brush connectivity of the shell segments. Structural characteristics of star and brush templates such as anisotropy and branches were found to be effectively transferred into hybrid nanocomposites.

The structure of nanoparticles was confirmed by TEM, showing that the shape characteristics of templates, including anisotropy and branches, are well preserved after loading inorganic content. The diameter of worm-like nanoparticles were found to be constant in templates with similar length of PAA but different PS length, indicating that the boundary of a nanoparticle is defined by the interface between two incompatible blocks. Polymeric properties (such as processability) contributed to the material by the polymer side chains on the nanoparticle provide for multiple applications based on the hybrid material.

The general nature of this procedure was demonstrated by repeating the process with titanium (IV) 2-ethylhexanoate as the inorganic precursor. TEM imaging showed the anisotropic structure of the inorganic-polymer hybrids, indicating that the shape of the brush templates was preserved upon loading with the inorganic materials. For bottlebrushes with longer backbone ($L_{372}AA_{47}S_{92}$ and $L_{202}AA_{51}S_{105}$), anisotropic nanoparticles with a worm-like structure were observed in TEM images. Good control over both width and length was established by the statistical analysis of TEM images. All particles showed the same diameters within the error (about 10 nm) as a result the similar DPs of PAA blocks, while the inorganic content was evenly distributed along the backbone. On the other hand, the length of nanoparticles increased from 55 nm to 77 nm as the DP of backbone in templates increase from 202 to 372.

C. Functionalization of Nanoparticles with Matrix-Reactive Functional Groups

Another approach to forming materials with improved thermal conductivity is incorporation of functional inorganic nanoparticles into a thermoset forming composition. OE-6630 is a commercially available silicone LED (light emitting diode) encapsulant supplied by Dow Corning® that is designed to meet the challenging needs of the LED market, including high adhesion, high purity, moisture resistance, thermal stability and optical transmittance. Silicone based matrix materials can absorb stresses caused by thermal cycling inside the package, protecting the chip and the bonding wires and since the electronics industry is quickly moving toward lead-free processing, silicone encapsulants, with their demonstrated, excellent stability at reflow temperatures, are a natural fit for LED applications.

Two functionalized alumina particles were evaluated as components of novel transparent phosphor conversion matrix materials that were evaluated by specifically measuring the thermal conductivity, targeting next generation of LED-based solid state lighting, to confirm the improvement expected from use of alpha alumina which could be up to 75% higher at the same loading of inorganics.

Figure 15:
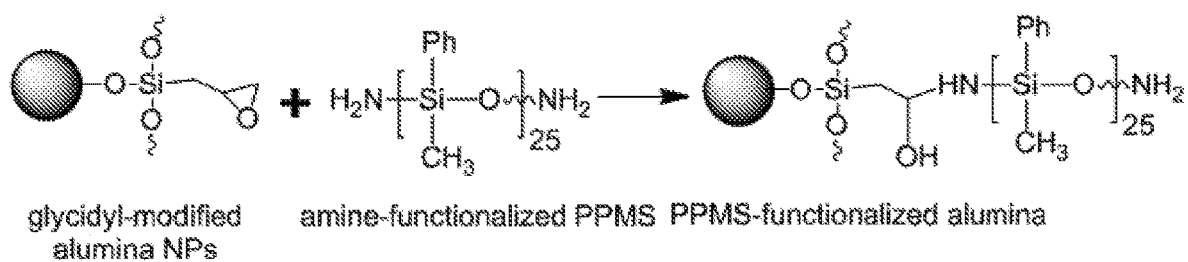
FIG. 15 illustrates a representative embodiment of a procedure for grafting an amine functionalized polymer onto the surface of an alumina particle by reaction with a glycidyl group incorporated of the surface.

As noted above, commercially available γ-δ alumina nanoparticles are more reactive compared to α-alumina, and PMMA brushes can be grafted from their surface with a density of 0.05 chains/$nm^{-2}$ without additional surface pretreatment. A series of hybrid particles were prepared and evaluated to provide a standard for evaluation of other thermal conductivity enhancers. γ-δ alumina nanoparticles can also be employed as model materials in chemical reactions to provide information on functionalization and grafting from/grafting to/reaction with procedures for preparation of composite materials suitable for dispersion in different matrices or materials possessing good nanocomposite film forming capability either as sole constituents of the film or as reactive agents in a film forming chemical reaction. FIGS. 15 and 16 show schematic procedures that illustrate only a single functional group on the surface of a particle, but this is solely for the sake of clarity. In all instances, multiple functional groups are present on all particles, allowing multiple opportunities for incorporation of functional groups to assist in dispersion/interaction of the particles with different classes of matrix forming materials exemplified, in this instance, by the representative example of substituted siloxanes that form a polysiloxane matrix.

Figure 14:
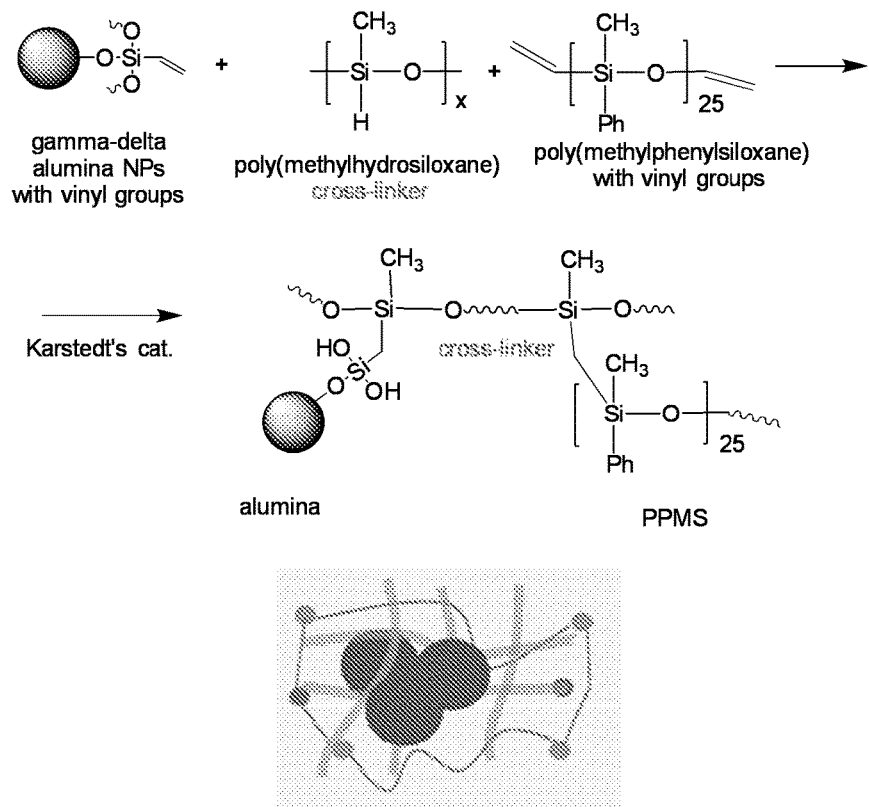
FIG. 14 illustrates a representative embodiment of a procedure for encapsulation of alumina particles by crosslinking vinyl-functionalized δ-alumina with polymethylhydrosiloxane (PHSO) and divinyl-polyphenylmethylsiloxane (PPMS) with Karstedt catalyst forming encapsulated alumina particles.

FIG. 14 illustrates a procedure that can be employed to incorporate alumina particles into a crosslinked shell with tethered linear chains suitable for forming a coherent film/article through application of a bulk fabrication procedure. In FIG. 15, a glycidyl modified particle undergoes a ring opening reaction with an amino functionalized polymer to tether the polymer chain to the particle surface. Indeed, there are a number of high yield reactions that glycidyl groups can undergo to incorporate a range of functionality into/onto a solid particle/material. Other inorganic nanoparticles were also evaluated to determine if they could also provide improved thermal properties in PPMS composites including ZnO, $TiO_2$ and silica.

D. Dispersion of Nanoparticles in Representative Polysiloxane Matrices

Procedures for preparation of materials suitable for exemplifying preparation of composite materials included functionalized NP with improved properties, such as improved thermal conductivity, were also examined. In a number of studies, polysiloxanes were chosen as a representative matrix material, exemplified by a poly(phenyl methylsiloxane).

In a number of embodiments hereof, novel polysiloxane- or silicone-based composite compositions display high refractive index, high thermal conductivity, and transparency, while providing UV adsorption. High refractive index, high thermal conductivity, and transparency, and UV adsorption are provided by functionalized particles such as zinc oxide nanoparticles. Such compositions may, for example, be useful for preparing light emitting diodes. In a number of studies hereof, stable, uniform dispersions of functional zinc oxide nanoparticles in a representative mixture of precursors of a thermosetting polydimethylsiloxane (PDMS) matrix were prepared which allowed the nanoparticles to become an integral part of the formed film/coating, thereby enhancing predetermined or desired properties. Increased demand for energy-efficient lighting is accelerating the broad adoption of LED-based lighting products, and the LED industry continues to pursue even greater operating efficiency. At the LED package level, LED operating efficiency can be increased by incorporating encapsulants with the improved properties described herein.

i. Tethered Polymer Chains

The initial approach to forming ZnO nanoparticles for dispersion in a PDMS matrix comprised forming a ZnO nanoparticle with attached PDMS chains or siloxane based ligands formed via ligand exchange with the first formed OA-capped ZnO nanoparticles. As the solids content increased from 10% to 30%, it was concluded that by imbedding PDMS-capped ZnO in PDMS matrix it is possible to cast solid and robust films. TEM/DLS confirmed that particles were uniformly dispersed in solution. In an initial series of experiments, however, the transparency of the films dropped significantly when the fraction of inorganic nanoparticles became higher. The morphology of particle assembly structures on electron micrographs indicated that the PDMS grafting density was low, in agreement with limited miscibility of particles in PDMS matrix that is observed in blending experiments. Table 9 lists the inorganic content, both weight and volume fractions are included, and thermal conductivity of PDMS-capped ZnO in the PDMS matrix.

TABLE 9

Inorganic content and thermal conductivity of composite film from PDMS and OA-capped ZnO in PDMS matrix.

| Sample | ZnO content (wt %) | ZnO content (volume %) | K W/m*K | Transparency |
|---|---|---|---|---|
| LZ-40(PDMS capped ZnO) | 15.5 | 3.2 | 0.2 | |
| LZ-46 (PDMS capped ZnO) | 30 | 7.1 | 0.31 | |
| LZ-54 | 40 | 10.6 | 0.33 | |
| LZ-58 | 46 | 13.2 | 0.37 | |
| LZ-69 | 60 | 21 | 0.31 | |
| LZ-99 | 41 | 11.02 | 0.25 | |
| LZ-118 | 56.5 | 18.80 | 0.28 | |
| LZ-119 | 54.8 | 17.77 | 0.28 | |

The results show that the thermal conductivity increased as the inorganic content increased, indicating that to further increase thermal conductivity one should increase the inorganic content of the mixture. However, as a result of the long PDMS chains on the surface of the PDMS modified ZnO nanoparticle, the inorganic content of PDMS-capped ZnO was limited to 57 wt %.

ii. Tethered Alkylamino Chains

A surprising result was obtained when the OA-capped ZnO were dispersed in the precursor of the PDMS matrix to provide a standard, as was done in the case for the OA-capped ZnO dispersion in PMMA, FIG. 9E. In this instance, a transparent film was obtained. This result opened up the possibility that dispersions of the OA-capped ZnO could reach as high as 85 wt % solids (see FIG. 16), while still providing transparency. Additional studies focused on developing conditions for dispersion of alkylamine-capped ZnO in the precursor of the exemplary PDMS matrix with high inorganic content, casting, then curing the mixture to prepare a film which would be suitable for the application as an LED encapsulant. In that regards, the transparency of the film should be maintained even at high filling fraction, thereby improving thermal conductivity, which was limited to K<0.5 W/m*K as a consequence of limited inorganic content, but there was no continuous trend in thermal conductivity k and volume fraction φ.

Octylamine-capped ZnO NPs were synthesized using $Zn(EH)_2$ as a ZnO NP precursor. The existence of large amount of excess OA in the solution prevented the aggregation of ZnO NPs and resulted in uniform size distribution (~5 nm). The synthesis was successful with high yield, high inorganic content (~85 wt %, measured by TGA) and high surface grafting density, calculated as 4.4/nm². The high inorganic content in the matrix materials should result in an increase in thermal conductivity. The small particle size should reduce scattering loss and increase dispersability of the nanocomposites in the matrix. However, the small nanoparticle size may result in large interfacial area which could reduce thermal conductivity of composites. After synthesis, the purified OA-capped ZnO NPs were dispersed in THF and then added to a mixture of specific amounts of PDMS precursor and crosslinker dissolved in THF. Finally, Karstedt's catalyst, diluted in THF was added into the solution and mixed prior to the solution being poured into a TEFLON mold and solvent allowed to evaporate at a low evaporation rate at room temperature over 96 h.

The inorganic content and thermal conductivity of OA-capped ZnO in PDMS matrix are reported in Table 9 (specific samples are identified as LZ-99, LZ-118 and LZ-119 etc. wherein the numbers correspond to experimental numbers). Representative free-standing samples that were obtained from the experiment with high inorganic content, up to 60 wt %. The overall transparency was significantly improved in samples via an improved purification process after the synthesis. TGA analysis (as set forth in J. Mater. Chem. C., 2013, 1 3098) indicated the presence of two classes of octylamine ligand in the product formed in this synthesis. A loosely bound fraction observable at the boiling point of octylamine, 182° C. and a more coordinately bound ligand that decomposed at 333° C.

It was determined that it was desirable to consistently prepare pure OA-capped ZnO nanoparticles as free ligands caused problems during the polymerization of the PDMS precursors and with thermal stability, measured by formation of color, of the resulting composite material. The thermal conductivity of the films was measured using the same instrument and same parameter settings. Table 9 shows the results that were obtained from thermal conductivity measurement and the corresponding inorganic content. The data indicate that the thermal conductivity increased to 0.28 W/m*K when the filling fraction is 56.5 wt %. However, when these results were compared with previous data, it appeared that that there was no trend between filling fraction and thermal conductivity. For previous samples, the thermal conductivity is 0.37 W/m*K when φ is 13.2%, which has lower filling fraction and higher thermal conductivity. These results deviate significantly from a prediction of thermal conductivity as a function of inorganic content using the Maxwell Garnett Model, which can be expressed as:

$$k_{eff} = k_m \left[ \frac{k_p + 2k_m + 2f(k_p - k_m)}{k_p + 2k_m + f(k_m - k_p)} \right]; \quad (2)$$

wherein $k_{eff}$ is the thermal conductivity of composites; $k_p$ is the thermal conductivity of particle, for ZnO is 34 W/m*K; $k_m$ is the thermal conductivity of matrix (which, for PDMS, is 0.15 W/m*K); and f is the volume fraction of spherical particles.

FIG. 17 illustrates a plot of predicted effective thermal conductivity vs. ZnO content. Compared to experimental results, square dots for transparent films and circular dots for semi-transparent films, the semi-transparent films have a significantly higher thermal conductivity at same filling fraction. Indeed, all the measured values are higher than the predicted value, indicating that the results were reasonable as increased thermal conductivity could be the result of bare particle to bare particle interactions which would also result in a reduction of transparency.

To achieve higher thermal conductivity, it was necessary to further increase the filling fraction of inorganic content.

An OA-capped ZnO in PDMS matrix with 70 wt % inorganic content (which was confirmed by TGA) was transparent, which was surprising when this result was compared to the opaque composite film resulting when OA-capped ZnO was dispersed in a PMMA matrix (see FIG. 9E). Although the film was transparent, it was brittle, indicating the need to improve/optimize the composition of the siloxane precursor mixture to improve the mechanical properties.

To further study the difference in thermal conductivity for transparent and semi-transparent films with same filling fraction, TEM images were taken on micro-sections of each bulk films and the images showed the distribution of the nanofillers in the matrices. The NPs in the transparent film had an average size of 34.708±6.33 nm, while NPs in the semi-transparent film had a bimodal distribution. The small NPs in the semi-transparent film had an average size of 35.93±7.93 nm, which was the same as the NPs in the transparent film. However, there was also a large amount of aggregation resulting in particles with an average size of 175.38±22.00 nm existing in the film, which resulted in the decrease of total interfacial areas of NPs in PDMS matrix. This result indicated that solubility depended upon the actual ZnO batch and explained why the thermal boundary resistance would have less effect on the reduction of thermal conductivity. That explains why the semi-transparent film has higher thermal conductivity than the transparent film with the same filling fraction.

To fabricate transparent films with high inorganic content, consistent transparency indicated that smaller diameter particles (for example, 5 nm ZnO NPs) should be the foundation of the hybrid material. Moreover, shorter graft ligands, such as butylamine or hexylamine instead of octylamine may be used to increase the inorganic content and increase the thermal conductivity. In a number of embodiments for the formation of ZnO particles with a size ~3-30 nm, alkylamines having 3-18 carbons (corresponding to the range of commonly available amines) may be used as graft ligand. In the examples alkylamines with a terminal amine group are used, but alkylamines with an amine group within that alkylchain, such as dihexylamine, can also be employed. The alkylamines may be linear or branched.

While, HA and BA have even lower b.p. than OA, OA (octylamine) (~130° C.), HA (hexylamine) (~110° C.), BA (butylamine) (~80° C.). In several studies, the same ratio of reagents and a lower reaction temperature was employed for the reactions (especially in the case of BA, wherein 190° C. was used instead of 220° C.). However, an even more important parameter was consistent production of a pure stable alkylamine stabilized ZnO nanoparticle. In addition to optical transparency and good thermal conductivity, a nanocomposite LED encapsulant should also exhibit a relatively high refractive index, good photo and thermal stability, and adequate mechanical properties.

In that regard, the refractive index affects the path length that light takes to transit through the encapsulant. The higher the RI, the shorter path length, and the less heat would be generated inside the encapsulant. Therefore, increasing the refractive index of the encapsulated material may be as important as increasing the thermal conductivity. The refractive index of OA-capped ZnO was measured using AutoEL-II Automatic Ellipsometer equipped with a helium-neon laser ($\lambda$=632.8 nm). The angle of incidence was fixed at 70°. A two homogeneous layer film model (silica+ nanocomposite) was utilized for the analysis, and 5 different spots were measured. The average RI was 1.615±0.003. When OA-capped ZnO is imbedded into the PDMS matrix, the refractive index may be estimated by Maxwell Garnett theory for a binary system. The theory is expressed as shown in equation 1 above. Using equation 1, the refractive index of the film with 60 wt % ZnO (about 18 volume percent) is about 1.52, much higher than PDMS matrix itself, indicating that higher refractive index can be attained by increasing inorganic filling fraction. The upper limit of RI would be 1.615, the RI of pure OA-capped ZnO. However by applying shorter ligand, the RI of the NPs is increased and the material's RI may also increase. Alkylamine ligands such as hexylamine and butylamine may thus further increase the refractive index of the dispersion of the nanoparticles in a matrix forming mixture of chemicals as they provide a thinner shell on the formed nanoparticles.

A further extension of the utilization of alkylamines to form metal oxide nanoparticles was the preparation and use of an unsaturated amine to form nanoparticles that may act as crosslinking agents when dispersed in the precursor of a PDMS or other matrix. Synthesis of a representative functional alkylamine, 10-undecenecarboxyamide, is shown below. The amide group was reduced to an amine by reaction with Lithium aluminum hydride (LiAlH$_4$).

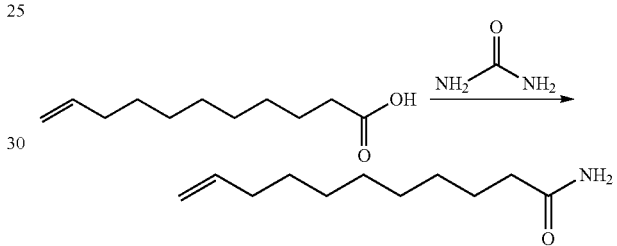

Apart from the refractive index, the thermal and photo stability of the materials are important properties for optical application of composite films (for example, as LED encapsulants). In a number of thermal stability studies, optically transparent films of OA-capped ZnO in a PDMS matrix (10 wt %) were heated at 60° C. under vacuum for 24 h after heating at 150° C. under vacuum for 24 h.

In the series of studies to determine photo-thermal stability, PDMS/ZnO-particle composite films were deposited on a transparent hot plate kept at 150° C. Film stability was assessed by measuring the time required for film transparency to decrease below 0.8 during continuous irradiation with blue LED emitting at 450 nm with a light intensity of 34 W/cm$^2$. The films remained transparent for a length of time in excess of 200 hours.

Figure 18A:
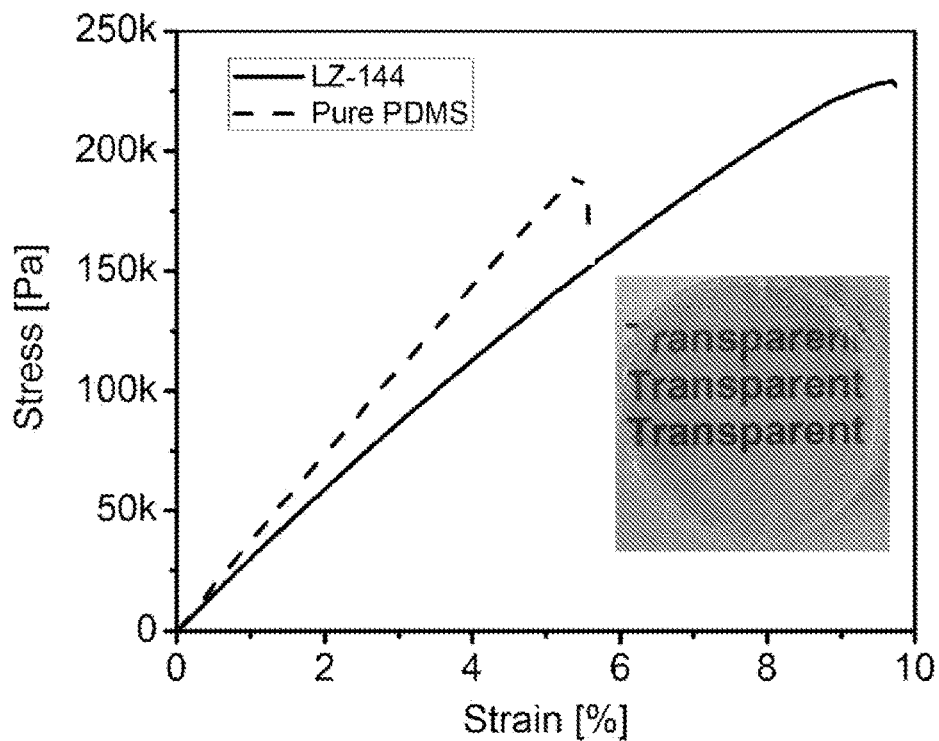
FIG. 18A illustrates a plot of stress/strain curves obtained from tensile test of pure PDMS matrix and OA-capped ZnO imbed in PDMS matrix, wherein the inset is a photograph of the OA-capped ZnO in PDMS matrix with 10 wt % ZnO used in tensile test.

Based on the geometry, thickness and roughness of the film, it was determined that the best option for study of mechanical properties was to conduct a tensile test on dynamic mechanical analysis (DMA) samples. FIG. 18A shows the tensile test results of pure PDMS matrix and OA-capped ZnO in a PDMS matrix. Both films fail immediately after extension beyond the elastic region. There is no obvious plastic region and yield point in the test. As further discussed below addition of a compatible copolymer with a low Tg can provide toughness to the matrix while additionally providing a physical process for increased inter-nanoparticle interactions.

Figure 18B:
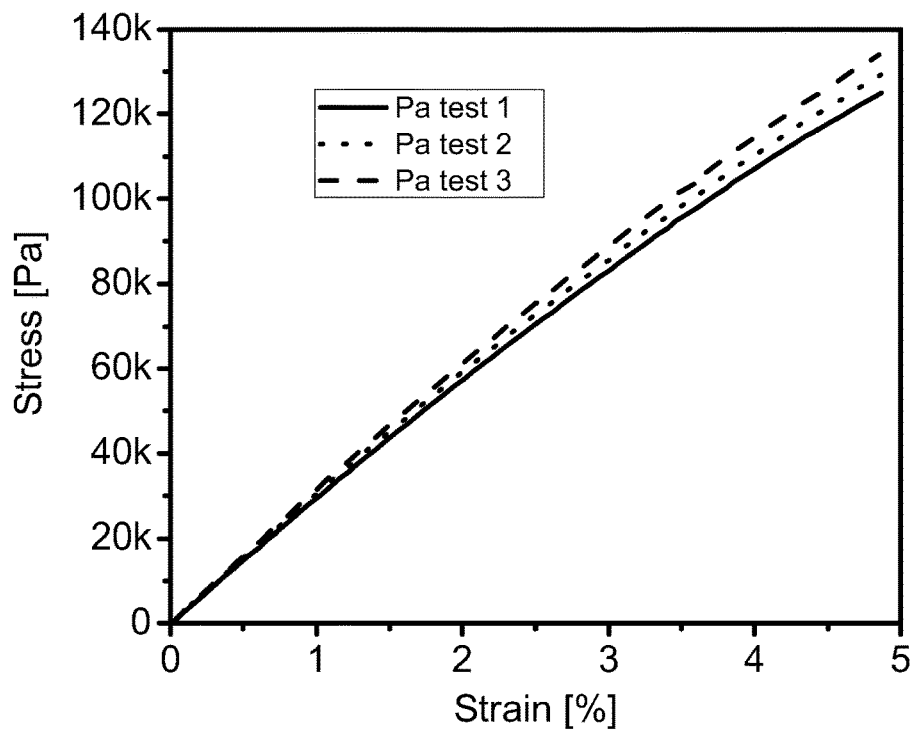
FIG. 18B illustrates a plot of repeating tensile tests within elastic region for the composite system of FIG. 18A.

The OA-capped ZnO in PDMS matrix has a lower modulus and higher strain at failure. It is possible that imbedded NPs loosen the PDMS polymer matrix network. Further, to confirm that the PDMS network was fully cured after imbedding the NPs, the tensile test was repeated on same film within its elastic region three times. There were 3 mins between each test, which allowed the material recovered to its original state. FIG. 18B shows the test results, for these three different tests. Because the behavior of the material was almost the same in all of the tests, the results indicated that the presence of NPs did not have any impediment on the curing process of the PDMS matrix. Thus, one can cast films with high inorganic content resulting in formation of colorless transparent materials with high refractive index and thermal conductivity. As described above, the percent solids in the formed PDMS matrix can be increase when stabilized ZnO nanoparticle was prepared with lower carbon number/molecular weight hexylamine and butylamine as the ligand. The difference in molecular weight between OA and HA is about 20%, and the OA in OA-capped ZnO is approximately 17 wt %.

Decreasing particle size affects the achievable filling fraction via the associated increasing content of the organic ligand phase rather than as an 'intrinsic' consequence of particle size. Therefore, significant improvement of, for example, thermal properties is difficult because it will require high levels of loading of filler particles. This might be disadvantageous for some applications. Therefore, in certain application, alternative means to accomplish a significant increase of, for example, thermal conductivity at lower content of ZnO or other particle fillers (with thermal conductivity in excess of $k=1$ $Wm^{-1}K^{-1}$) are required. Alternatively, or additionally, ways to increase the ZnO (or other particle) interparticle interactions are required.

E. Use of Particle Templates in Multi-Particle Systems

As described above, in a number of embodiments, systems, methods and compositions hereof provide for incorporations of high weight fractions of low molecular weight alkylamine stabilized zinc oxide nanoparticles that can form a stable dispersion in the precursors of a thermoset matrix thereby becoming an integral component in the final composite material and enhancing the physical properties of the formed composite material. For example, OA-capped ZnO NPs (5 nm) have been synthesized and directly mixed into a PDMS matrix precursor to achieve filling fractions of $f=0.1-0.7$ by weight. Generally, the system, methods and compositions hereof broadly provides procedures for preparing a dispersion of stable nanoparticles in a precursor of a polymer (for example, thermoset) matrix that allows uniform incorporation of the nanoparticles into the formed matrix. Control over properties including, but not limited to, refractive index and thermal conductivity in the formed composite are provided.

Significant improvement of thermal conductivity is difficult, however. In that regard, the small size of the ZnO nanoparticles makes is difficult to achieve high volume fraction of inorganic fillers. Interaction between particles is, therefore, limited. Interparticle interaction is important in controlling certain properties such as thermal conductivity.

In several embodiments, systems, methods and compositions hereof improve interparticle interaction (and thereby thermal conductivity) in a matrix material (for example, a polymeric matrix material such a polysiloxane/PDMS) by forcing the small particles into narrow interconnected spaces in the matrix. In a number of embodiments, a partitioning of the space is achieved within the precursors of the matrix. For example, a high weight fraction of a binary (or higher order) mixture of dispersed particles may randomly distributed in the precursor of a matrix such as a polysiloxane matrix wherein small particles are selectively constrained within interstitial regions of other (for example, larger particles) thereby increasing interparticle interactions of the small particles. In addition to or as an alternative to volume exclusion to control dispersion of selected particles, repulsive forces may, for example, be used. Repulsive forces or repulsion may, for example, arise from interaction between the groups tethered on the core of each type of particle or as a result of charge interaction between the types of particles. The binary (or higher order) particle template systems or methodologies hereof, may for example, be used in any composite (particle-filled) composition wherein it is desirable to increase interparticle interaction while, for example, reducing or minimizing particle loading.

Figure 19C:
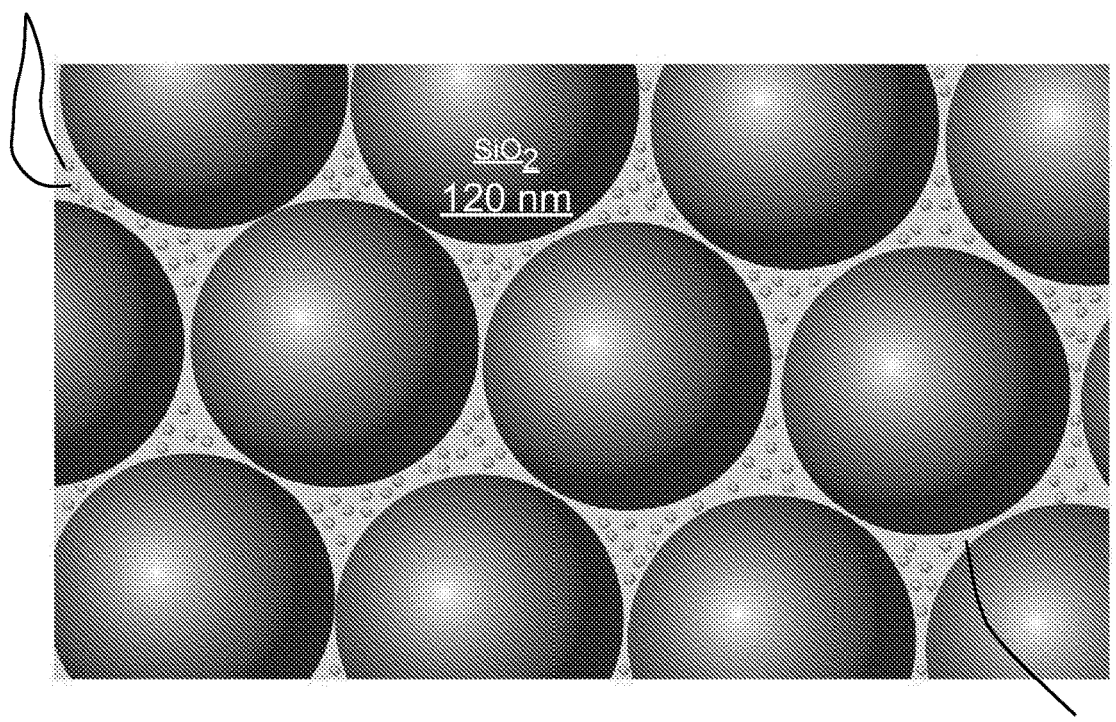
FIG. 19C illustrates schematically a representative embodiment of binary particle dispersants including 120 nm SiO$_2$ particles and 5 nm OA-capped ZnO particles within a matrix material including precursors for forming PDMS.
Figure 19D:
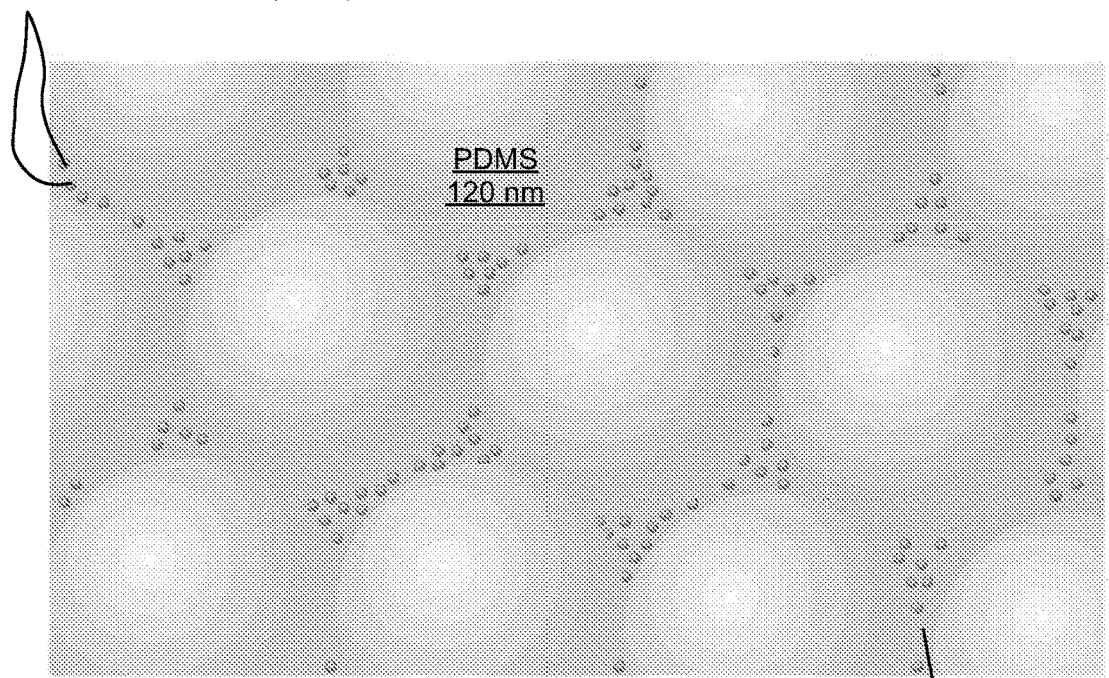
FIG. 19D illustrates schematically a representative embodiment of binary particle dispersants including PDMS rubber particles and 5 nm OA-capped ZnO particles within a matrix material including precursors for forming PDMS.
Figure 21:
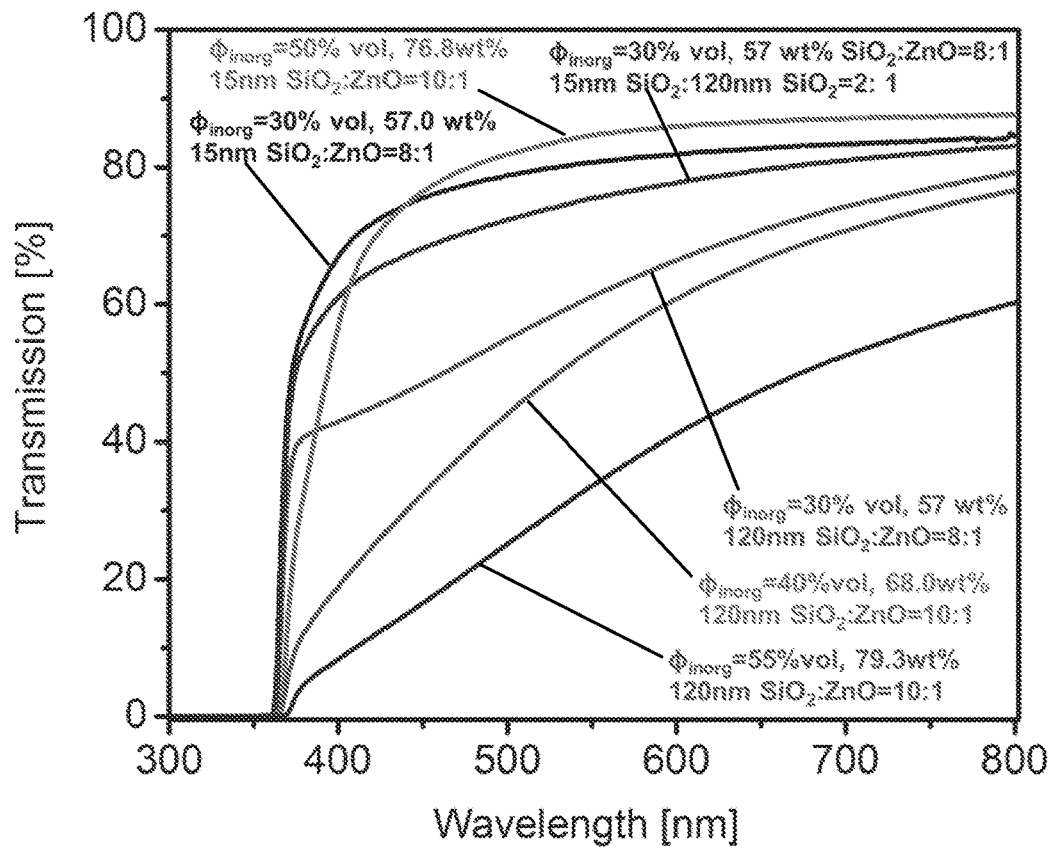
FIG. 21 illustrates a transmission vs wavelength plot for a series of binary particle dispersants (ZnO and SiO$_2$).

FIG. 19A shows a schematic of two representative binary blends of silica dioxide ($SiO_2$) particles (with a diameter of 120 nm and 15 nm, respectively) blended with 5 nm ZnO nanoparticles in a PDMS matrix, and the effect of using a binary blend on the distribution of the ZnO particles. $SiO_2$ particles, which are frequently employed as fillers in siloxane matrices, may increase the modulus of the PDMS matrix, while the volume constraints placed on the ZnO nanoparticles improves particle (for example, nanoparticle) interactions and thereby the thermal conductivity. During a number of studies hereof, it was further determined that the use of such a binary (or higher order) mixture of nanoparticles also assisted in improving the transparency of the formed composite films at higher inorganic fractions. As illustrated in the photographs in FIG. 20, high transparency was obtained with up to 77 wt % inorganic content with small silica particles, and up to 68% with larger silica particles (as described in connection with FIG. 19A). A transmission vs. wavelength plot for the samples of FIG. 20 is shown in FIG. 21. Samples with only 15 nm $SiO_2$ exhibited high transmission above 500 nm wavelength. While transmission is lower for samples containing 120 nm $SiO_2$ particles, such samples still exhibited ~60% transmission above 800 nm wavelength. A ternary blend, with both 15 nm and 120 nm $SiO_2$ exhibited excellent transmission. The samples were also characterized by UV-vis and heat flow meter to obtain the thermal conductivity. Samples with 40 vol % and 55 vol % inorganic particles provided >0.5 W/mK.

The increase of thermal conductivity was achieved at relatively low loading levels of ZnO. In particular, a PDMS/$SiO_2$/ZnO composite system was prepared with a total inorganic fraction of 55% by volume. The volume fraction was 50% $SiO_2$ and 5% ZnO. The thermal conductivity was measured as $k=0.64$ $Wm^{-1}K^{-1}$. This result is in contrast to a 50 vol % $SiO_2$ composite which had only a moderate increase of thermal conductivity to approx. 0.3 $Wm^{-1}K^{-1}$ and a sample with 15 vol % ZnO only displayed a thermal conductivity of 0.28 $Wm^{-1}K^{-1}$ (the PDMS matrix has 0.23 $Wm^{-1}K^{-1}$). Thus, in the case of the binary $SiO_2$/ZnO composite, a much more pronounced increase of the thermal conductivity was observed despite the low inorganic fraction, thereby confirming the benefit of utilization of a binary mixture of particles where the one type of larger particles cause the smaller particles to migrate into a defined volume; that is, in the interconnected interstitial areas between larger particles in this example.

In the case of a matrix that is optically transparent, the particles used to force particle interaction between the functionalized nanoparticles hereof may, for example, be transparent and have a refractive index matched to the matrix material, as discussed in *Advanced Materials* 2007, 19, 4486, *Langmuir* 2014, 30, 14434. Such particles in the binary (or higher order) mixture of matrix modifying agents hereof may, for example, be inorganic particles selected for their thermal conductivity properties or low $T_g$ particles selected for their matrix toughening properties. An example, of a low $T_g$ material that can be used in, for example, polysiloxanes hereof is a PDMS particle prepared, for example, by crosslinking suitable precursors in a miniemulsion or suspension system to provide spherical particles that can be distributed in a siloxane precursor mixture along with the ZnO nanoparticles (see FIG. 19B). Representative examples of binary particle systems hereof include, for example, a mixture of ~120 nm $SiO_2$ particles and ZnO or a mixture of PDMS nanogel particles and ZnO to, for example, increase the modulus and toughness of a densely crosslinked PDMS matrix. Furthermore, a ternary mixture of, for example, ~120 nm $SiO_2$ particles, PDMS nanogel particles and ZnO nanoparticles can be added to further control polysiloxane matrix film properties.

EXAMPLES AND DISCUSSION OF EXAMPLES

Materials.

All monomers: (2-trimetylsiloxy)ethyl methacrylate (HEMA-TMS, Scientific Polymer Products), tert-butyl acrylate (tBA, 98% Aldrich), methyl methacrylate (MMA, 99%, Aldrich), styrene (S, 99%, Aldrich), acrylonitrile (AN, 99%, Alrich), and divinylbenzene (DVB, 80%, Alrich) were purified by passing through a column filled with basic alumina to remove the inhibitor prior to use. Copper (I) bromide (CuBr, 98%, Acros) was purified using a literature procedure, copper (II) chloride ($CuCl_2$, 99.9%), copper (I) chloride (CuCl, 99%) 2-bromoisobutyryl bromide (2-BiB, 98%), ethoxyisobutyryl bromide (EBiB, 98%), potassium disulfate ($K_2S_2O_7$, 99%), triethylamine (TEA), 4-(dimethylamino) pyridine (DMAP, 99%), N,N,N',N'',N''-Pentamethyldiethylenetriamine (PMDETA, 99%) were purchased from Aldrich and used as received. Tris[(2-pyridyl)methyl]amine (TPMA) was synthesized according to the previously published procedure. Tris(2-dimethylaminoethyl)amine ($Me_6TREN$, 99%, Alfa), and zinc 2-ethylhexanoate ($Zn(EH)_2$, 80% in mineral spirits, Alfa), N-(2-hydroxyethyl) phthalimide (NHP, 99%, Acros), hydrochloric acid (HCl, 36.5-38.0%, Sigma), zinc oxide nanopowder (ZnO, 99.95%, 18 nm, US-Nano), zinc nitrate hexahydrate ($Zn(NO_3)_2$, 98%, Aldrich), sodium hydroxide (NaOH, 98%, Aldrich), trifluoroacetic acid (TFA, 98%, Alfa), anisole (99%, Aldrich), methylene chloride (DCM, 99.5%, Fisher) tetrahydrofuran (THF, 99%, VWR), methanol (99%, VWR), hexane (99%, VWR), acetone (99%, VWR), N,N-dimethylformamide (DMF, 99%, VWR), zinc oxide dispersion(40 wt. % in butyl acetate, Aldrich), α-bromoisobutyryl bromide (2-BiB, Aldrich), ethyl 2-bromoisobutyrate (EBiB, 98%, Aldrich), ethyl 2-bromophenylacetate (EBPA, 97%, Aldrich), N,N,N',N'',N''-pentamethyldiethylenetriamine (PMDETA, Aldrich), copper(II) bromide ($CuBr_2$, 99%, Aldrich), triethylamine (TEA, 98%, Aldrich), diphenyl ether (DPE, 99%, Aldrich), zinc acetate (Zn(OAc)2, 99.99%, Aldrich), tin(II) 2-ethylhexanoate ($Sn(EH)_2$, 95%, Aldrich), 2,2'-azobis(2-methylpropionitrile) (AIBN, 98%, Aldrich), and octylamine (OA, 99%, Aldrich) were used as received without further purification.

Instrumentation.

Monomer conversion was measured using $^1H$ NMR spectroscopy in $CDCl_3$, in a Bruker Avance 300 MHz spectrometer at room temperature. Molecular weight and molecular weight distribution were determined by GPC in THF as eluent with flow rate 1 ml/min. The amount of organic fraction in polymer-modified nanoparticles was measured using TA Instruments TGA 2950 thermogravimetric analyzer. Nanoparticles were dispersed in solvents using Misonix S-4000 probe sonicator. Nanoparticles were imaged using with transmission electron microscopy (TEM) using a JEOL 2000 EX electron microscope operated at 200 kV. Images were acquired using a Gatan Orius SC600 high-resolution camera. To confirm results obtained from TEM, dynamic light scattering (DLS) using a Malvern Zetasizer Nano ZS was also employed to determine volume-weighted average hydrodynamic radius and distribution. The particles were suspended in filtered THF or DMF (220 nm PTFE filter) at micro concentrations. To characterize the structure and crystallinity, a Philips X'Pert (Philips Analytical, Netherlands) X-ray diffractometer (XRD) (Cu Kα radiation) was operated at 45 kV and 40 mA in grazing incidence mode. The fraction of inorganic content was measured by thermogravimetric analysis (TGA), TA Instrument 2950, and the data was analyzed with TA Universal Analysis. The heating procedure involved 4 steps: 1) samples were placed on a Platinum pan and the temperature jumped to 120° C. in air atmosphere; 2) hold at 120° C. for 10 mins; 3) ramp up at a rate of 20° C./min to 800° C.; 4) hold for 5 mins. The TGA plots were normalized to the total weight after holding at 120° C. The grafting densities of hybrid particles were calculated by the following equation:

$$\sigma_{TGA} = \frac{(1 - f_{ZnO})N_A \rho_{ZnO} d}{6 f_{ZnO} M_n} \quad (3)$$

where is the inorganic fraction measured by TGA after exclusion of any residual solvent; $N_A$ is the Avogadro number; e.g. for the density of zinc oxide NPs; d is the average diameter of ZnO NPs; $M_n$ is the overall number average MW of polymer brushes. Base-resistant stainless steel crucibles were purchased from Thomas Scientific.

The glass transition temperature ($T_g$) of PSAN-capped ZnO in PMMA matrix with different inorganic content were measured by differential scanning calorimetry (DSC) with TA Instrument QA-2000. The same procedure was run three times, each involving the following steps: 1) hold at 25° C. for 5 mins; 2) jump up to 150° C. at a rate of 10° C./min; 3) hold for 5 mins; 4) cool down to 25° C. The DSC data were analyzed with TA Universal Analysis and the $T_g$ was directly acquired.

UV-Vis Spectrophotometry. The light transmission of the bulk films was determined using a Varian 50 Bio UV-Vis Spectrophotometer over the wavelength range from 300 nm to 800 nm. According to Beer-Lambert's Law, the transmittance of an electromagnetic wave through a substrate has a logarithmic dependence on the distance the lightwave travels through the materials (i.e. the thickness of the film, 1). It is expressed as $T=I/I_0 \sim e^{-l}$. To quantitatively compare the transparency of films with different thickness, the measured data were normalized to equal thickness using the described logarithmic relationship. In this study, the transmittance was normalized to 300 μm.

Ellipsometry. The RI of the thin films was measured using AutoEL-II Automatic Ellipsometer equipped with a helium-neon laser (λ=632.8 nm). The angle of incidence was fixed at 70° and a two homogeneous layer film model (silica+nanocomposite) was utilized for the analysis. At least 5 different spots were measured for each film.

Nanoindentation. The mechanical properties (elastic modulus and hardness) of the bulk films were measured using MTS Nanoindenter XP with a nanoscopic diamond-based Berkovich tip. The indentations were performed at a displacement rate of 0.05 nm per second up to a maximum load at 2 μm depth. The maximum load indentation was held for 10 s followed by the elastic recovery of the material. 100 indentations were performed on each film.

NMR and GPC. Monomer conversion was measured by NMR (300 MHz) with 32 scans. Molecular weight and molecular weight distribution were determined by gel permeation chromatography (GPC), conducted with a Waters 515 pump and Waters 2414 differential refractometer using PSS columns (Styrogel 105, 103, 102 Å) in THF as an eluent (35° C., flow rate of 1 mL min$^{-1}$). Linear polystyrene standards were used for calibration.

Elemental analysis (bromine content) was conducted by Midwest Microlab (IN);

Structure characterization of PMMA-g-ZnO. NPs Structural characterization was performed via transmission electron microscopy (TEM) using a JEOL 2000 EX electron microscope operated at 200 kV. The weight of the polymer brushes grafted from particles was measured by thermogravimetric analysis (TGA).

Example 1: Alumina Surface Activation and Anchoring an Initiator

1 A) Activation of α-Alumina Particles

The particles were activated by heating 2 g of particles in 100 ml of 2M NaOH solution or 48 wt % HF solution at 70° C. for 12 h. The particles were then collected via centrifugation and washed with distilled water via 3 repetitive centrifugation and sonication cycles, and then left to air dry overnight.

Activation of 1 g of particles by 15 ml of saturate (ca. 20M) aqueous solution of NaOH was carried out in stainless steel cup at 70° C. for 12 h. Activation of 1 g of particles in 10 ml of molten NaOH and molten $K_2S_2O_7$ was carried out in stainless steel cup at 500° C. for 15, 30, 60 and 180 min. The particles were collected via centrifugation and washed via repetitive centrifugation and sonication cycles with 2M HCl solution, 2M NaOH solution and distilled water (×3). Then the particles were left to air dry overnight.

The particles were then modified with 2-BiB, an ATRP initiator. The modification was carried out by stirring 1 g of particles in 50 ml of dry THF in presence of 10 ml of TEA, 5 ml of 2-BiB and catalytic amounts of DMAP at room temperature for 12 h. The particles were collected via centrifugation, washed with THF and methanol (×3) via repetitive centrifugation and sonication cycles, and left in air to dry overnight.

1 B) Grafting PMMA Brushes from Activated Alumina Surface.

Poly(methyl methacrylate) brushes were grafted from the surface of initiator-modified alumina nanoparticles using published procedures. The polymer grafted particles were separated by centrifugation. The supernatant was passed through an alumina column and injected into a GPC to measure the molecular weight and molecular weight distribution of the free polymer in solution. The centrifuged particles were washed with THF via sonication and centrifugation to remove all traces of free polymer and organic impurities. The particles were re-dispersed in THF and precipitated by addition to methanol to remove trace copper salts. After drying in air, the solid particles were characterized by TGA, DLS and TEM.

Example 2: The Above Series of Reactions were Repeated

2 A) Samples prepared with activation of the alumina carried out in molten NaOH for 15 min, 30 min, 60 min, and 180 min. In general, the results are consistent with each other, the grafting densities are similar and do not depend on activation time. GPC and TGA data combined suggest that the grafting density of PMMA on alumina surface is 0.039 chains/nm$^2$, which is very close to the result obtained after activation in glassware with further HF treatment (0.04 chains/nm$^2$). In general, it can be concluded, that activation in stainless steel cup is as efficient as activation in glassware with further HF treatment. The results are very consistent and reproducible. It was shown once again, that the grafting density doesn't depend on activation time in NaOH, carried out in either stainless steel or glass.

Example 3: "Grafting From" Using ARGET ATRP

The final grafting from polymerization was carried out under ARGET ATRP conditions with tin diethylhexanoate ($Sn^{II}(EH)_2$) as the reducing agent and tris(2-pyridylmethyl)amine (TPMA) as the ligand, as this ligand forms a more active catalyst complex. The ratio of reagents for the grafting from polymerization was: MMA:Al$_2$O$_3$—Br:EBIB:MMA:CuBr:Sn:TPMA:Anisole:DMF=1 mole(2 g): 1:400:0; 05:0.15:0.25:50% vol: 0.2 ml. Reaction temperature T=60° C. Conversion of MMA was 31% after 7 h. The MW of PMMA was 51,000, Đ=1.37. Weight loss by TGA was 28%. GPC and TGA data combined suggest that the grafting density of PMMA on alumina surface is 0.054 chains/nm$^2$. This is consistent with previously obtained results reported in Tables 2 and 3. With this grafting density, the particles are still stable in dispersion and have very good film forming capability.

Example 3B Preparation of 12-(2-Bromoisobutyramido)Dodecanoic Acid (BiBADA) as Universal Tetherable Initiator The procedure used for the preparation of 12-(2-bromoisobutyramido)dodecanoic acid is shown in the following schematic.

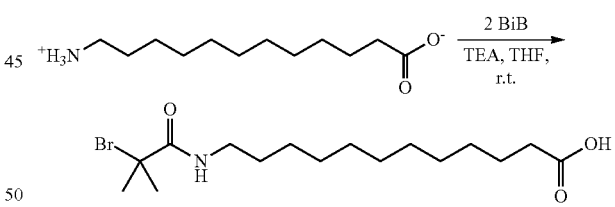

After amidation of 12-aminodedecanoic acid, the crude product was dissolved in ethyl ether and mixed with 0.5 M HCl; the mixture was stirred vigorously then ethyl ether was allowed to evaporate under airflow; a wax-like white solid was collected after the aqueous solution was decanted. These steps were repeated three times to ensure removal of any water-soluble impurities. $^1$H NMR showed acceptable purity after the purification. The general procedure of surface modification was as follows: in a 0.05 g/mL dispersion of inorganic nanoparticles in THF, BiBADA, five molecules per nm$^2$, was added; the mixture was probe sonicated for 5 min at amplitude 70; the pre-dispersed mixture was transferred to a sonication bath and let proceed for 24 h; the resulting dispersion was washed with THF in 3 centrifuge-sonication cycles.

Grafting from Using SARA:

SARA ATRP was used to simplify reaction setup. A typical reaction condition follows [MOX-Br, assuming 1 Br/nm$^2$]$_0$/[MMA]$_0$/[CuBr$_2$]$_0$/[Me$_6$TREN]=1:1000:0.2:0.5; Ø1 mm×1 cm copper wire; 50 vol % anisole; r.t (In the case of α-Al$_2$O$_3$, only 0.2 equiv. of initiator-modified particle was added due to incorrect labeling of particle concentration from the supplier). The reactions were followed for ~24 h.

Three new nanoparticles, TiO$_2$ (15 nm, anatase), CuO (40 nm), and ZrO$_2$ (40 nm), were purchased from US-Nano and studied. Both TiO$_2$ and ZrO$_2$ were etched with HF because of limited selection of stable salts. CuO was etched with HCl. The detached polymer from PMMA-g-TiO$_2$ was determined to be 7.24×10$^4$ and 1.25 in M$_n$ and M$_w$/M$_n$, respectively.

The data of SI-ATRP from BiBADA are summarized in Table 10. Additional TEM images were taken to support our observations. Two polymerizations of butyl acrylate(BA) from TiO$_2$ and ZrO$_2$ were performed to show better control of polymerization and test the results of polymerizations of MMA. A new batch of metal oxide nanoparticles, including Mn$_2$O$_3$, Co$_3$O$_4$, NiO, and SnO$_2$ was purchased and modified with BiBADA. Indeed a number of other transition metal oxides are commercially available for functionalization and "grafting from" or "linking to" including Y, Mo, Hf, W, Bi, La, Ce, Pr, Nd, Sm, Eu, Gd, Tb, Dy, and Er. As shown in Table 10, in most instances, polymers with a narrow M$_w$/M$_n$ were obtained. However, on certain substrates control over polymerization was poor. It is not clear whether it is a result of the interaction between Cu complexes and metal oxides or the interference by leached metal cations. Otherwise, the irregularity of surface curvature may also contribute to a broad molecular weight distribution. Nevertheless it was demonstrated that the BiBADA initiator worked for most of the metal oxide nanoparticles. The results were even more meaningful as functional nanoparticles, such as barium titanate (BTO) and indium tin oxide (ITO) were successfully modified. The target DP for the BTO reaction was set slightly higher to ensure sufficient dilution as the particles were very big in size and small in specific surface area.

TABLE 10

Summary of SI-ATRP from metal oxide nanoparticles modified with BiBADA

| Entry | Sample No. | Particle | Diameter | Monomer | M$_n$ | M$_w$/M$_n$ | σ (nm$^{-2}$) |
|---|---|---|---|---|---|---|---|
| 1 | JY-6-91 | MgO | 20 nm | MMA | 1.32 × 10$^5$ | 1.60 | 0.08 |
| 2 | JY-6-88$^a$ | α-Al$_2$O$_3$ | 30 nm | MMA | 2.87 × 10$^5$ | 1.25 | 0.17 |
| 3 | JY-7-75 | α-Al$_2$O$_3$ | 30 nm | MMA | 2.37 × 10$^5$ | 2.10 | 0.06 |
| 4 | JY-7-90 | α-Al$_2$O$_3$ | 30 nm | BA | 2.42 × 10$^4$ | 1.24 | TBD |
| 5 | JY-7-10 | TiO$_2$ | 15 nm | MMA | 7.24 × 10$^4$ | 1.25 | 0.03 |
| 6 | JY-7-22 | TiO$_2$ | 15 nm | BA | 6.73 × 10$^3$ | 1.23 | 0.15 |
| 7 | JY-7-27 | Mn$_2$O$_3$ | 30 nm | MMA | N/A | N/A | N/A |
| 8 | JY-7-55$^b$ | Mn$_2$O$_3$ | 30 nm | MMA | N/A | N/A | N/A |
| 9 | JY-7-28 | Co$_3$O$_4$ | 10-30 nm | MMA | 1.03 × 10$^5$ | 1.83 | 0.14 |
| 10 | JY-7-32 | NiO | 10-20 nm | MMA | N/A | N/A | N/A |
| 11 | JY-7-54$^b$ | NiO | 10-20 nm | MMA | 7.69 × 10$^4$ | 1.28 | 0.14 |
| 12 | JY-7-12 | CuO | 25-55 nm | MMA | N/A | N/A | N/A |
| 13 | JY-7-52$^b$ | CuO | 25-55 nm | MMA | N/A | N/A | N/A |
| 14 | JY-6-84 | ZnO | 18 nm | MMA | 8.77 × 10$^4$ | 1.33 | 0.17 |
| 15 | JY-7-83 | Y$_2$O$_3$ | 10 nm | MMA | 1.66 × 10$^5$ | 1.72 | 0.24 |
| 16 | JY-7-91 | Y$_2$O$_3$ | 10 nm | BA | 2.55 × 10$^4$ | 1.16 | TBD |
| 17 | JY-7-15 | ZrO$_2$ | 40 nm | MMA | 5.56 × 10$^4$ | 1.52 | 0.15 |
| 18 | JY-7-20 | ZrO$_2$ | 40 nm | BA | 1.97 × 10$^4$ | 1.25 | 0.30 |
| 19 | JY-7-84 | MoO3 | 13-80 nm | MMA | N/A | N/A | TBD |
| 20 | JY-7-82 | In$_2$O$_3$ | 20-70 nm | MMA | 1.40 × 10$^5$ | 1.49 | 0.20 |
| 21 | JY-7-80 | ITO (90:10) | 20-70 nm | MMA | 1.23 × 10$^5$ | 1.92 | 0.11 |
| 22 | JY-7-92 | ITO (90:10) | 20-70 nm | BA | TBD | TBD | TBD |
| 23 | JY-7-34 | SnO$_2$ | 35-55 nm | MMA | N/A | N/A | N/A |
| 24 | JY-7-86$^b$ | SnO$_2$ | 35-55 nm | MMA | TBD | TBD | TBD |
| 25 | JY-7-78 | Sb$_2$O$_3$ | 80-200 nm | MMA | 3.66 × 10$^5$ | 1.93 | 0.14 |
| 26 | JY-7-81$^c$ | BTO | 200 nm | MMA | 1.85 × 10$^5$ | 2.38 | 0.43 |
| 27 | JY-7-79 | La$_2$O$_3$ | 10-100 nm | MMA | N/A | N/A | N/A |
| 28 | JY-7-93$^b$ | La$_2$O$_3$ | 10-100 nm | MMA | 6.35 × 10$^4$ | 1.23 | TBD |
| 29 | JY-7-76 | CeO$_2$ | 10 nm | MMA | 6.88 × 10$^4$ | 1.27 | 0.13 |
| 30 | JY-7-85 | WO3 | 60 nm | MMA | TBD | TBD | TBD |

$^a$[MMA]$_0$/[Al$_2$O$_3$—Br]$_0$ = 5000.
$^b$Modified with BiBADAm.
$^c$[MMA]$_0$/[BTO—Br]$_0$ = 3000.

Both PMMA-g-TiO$_2$ and PMMA-g-ZrO$_2$ dispersions displayed excellent stability, indicating successful polymer modification. However, the PMMA-g-CuO hybrid particle was rather unstable in THF. The unsuccessful grafting may be ascribed to possible Cu(II) leaching during the reaction resulting in a low Cu(I)/Cu(II) ratio. Observation from $^1$H NMR supports such hypothesis, as only 4.1% conversion was observed in the 24 h reaction. In contrast, SI-ATRP from TiO$_2$ and ZrO$_2$ had conversions of 32.6% and 95.9% conversion, respectively. The reason for significant acceleration in the reaction from ZrO$_2$ is unclear. Probably, the high Young's modulus of the ZrO$_2$ nanocrystals abraded the copper wire, inducing much higher surface area.

The same THF dispersions were studied with DLS to determine the hydrodynamic size distributions. PMMA-g-ZrO$_2$ displayed the best dispersability, while PMMA-g-TiO$_2$ was slightly better than PMMA-g-CuO and it was observed that this novel tetherable initiator worked for Fe$_3$O$_4$, ZnO, and α-Al$_2$O$_3$, but not for MgO. Therefore, we can have a preliminary conclusion based on hard-soft acid-base theory that BiBADA had stronger affinity to the oxides of softer acids. However, CuO might be an exception due to potential Cu(II) leaching, as Zn(II) is supposed to be harder than Cu(II).

Grafting from both ZnO and α-Al$_2$O$_3$ was successful. Especially, the dispersability of α-Al$_2$O$_3$-g-PMMA was unprecedentedly good. Substitution of MMA with BA resulted in much slower reactions and improved control of polymerization and in both cases the graft densities increased, however, the dispersability seemed slightly higher, probably because of the lower molecular weight of the grafted poly brushes.

Example 4: Synthesis of Polymer-g-ZnO Nanoparticles by "Grafting-From"

4 A) Poly(methyl methacrylate) (PMMA) and poly(styrene-co-acrylonitrile) (PSAN) grafted ZnO nanoparticles were synthesized in two steps using "standard ATRP procedures.

In the first step, initiator functionalized ZnO (ZnO—Br) nanoparticles were synthesized by the following procedure: 25 mL of ZnO dispersion (10 g ZnO in butyl acetate) were dissolved in 200 mL of dry THF in a round bottom flask, and TEA (5.14 mL, 37 mmol) was then added to the solution. The flask was sealed, transferred to an ice bath and stirred. 2-BiB (4.56 mL, 37 mmol) was then slowly added, drop by drop, to the solution. The flask then was stirred for another 48 h at room temperature. The product was washed 3 times with cold methanol and dried in air for 24 h. After removal of all solvent, ZnO—Br NPs were obtained.

4 B) Synthesis of PMMA or PSAN Using Activators Generated by Electron Transfer (AGET) ATRP from ZnO—Br.

The polymer brushes were grafted from the surface of initiator-modified zinc oxide nanoparticles as follows: 1.0 g ZnO—Br nanoparticles, Me$_6$TREN (0.038 g, 0.143 mmol), 30 M solution of CuBr$_2$ in DMF (1 mL, 0.030 mmol), anisole (10 mL), MMA (10 mL, 95 mmol) or St (10.5 mL, 95 mmol) and AN (3.7 mL, 57 mmol) were placed in 50 mL Schlenk flask equipped with a magnetic stir bar. The flask was sealed, and the resulting solution was bubbled with N$_2$ for 30 minutes. 15 mM of a solution of tin(II) 2-ethylhexanoate (Sn(EH)$_2$) in anisole (1 mL, 0.015 mmol) was added to the flask to reduce a fraction of the CuBr$_2$. The flask was then immersed to an oil bath set at 70° C., and the reaction mixture was kept under these conditions for the desired time, MMA system for 1 h, and the SAN system for 24 h. The reaction mixture was exposed to air to stop the reaction. Products were precipitated by addition of the solution to cold methanol. The samples were then centrifuged, and the products were redissolved in THF, the resulting solution was cloudy and unstable. The samples were then centrifuged again to remove the insoluble impurities, which were non-functionalized pristine ZnO nanoparticles. The resulted solutions then were concentrated and precipitated by addition to methanol. Solid products were dried in air for the further characterizations.

4 C) General Procedure for Cleavage of Polymer Brushes from Nanoparticles.

2 mL of 36.5-38.0% HCl(aq.) solution were added to a 2 mL of solution of the particles in THF (ca. 10 mg mL$^{-1}$), and the reaction was allowed to stir at room temperature (r.t.) for 30 min. The cleaved polymer was isolated by precipitation in cold methanol to remove the zinc salt and acid, after filtration the remaining methanol was evaporated into the air.

Example 5: Synthesis of Polymer-g-ZnO Nanoparticles by "Grafting-Onto"

5 A) Synthesis of PMMA-b-PAA Di-Block Copolymer.

The PMMA-Br macroinitiator was synthesized using activators regenerated by electron transfer (ARGET) ATRP as described above in example 3. The PMMA-Br macroinitiator was isolated by precipitation in methanol. PMMA-Br (2.0 g, 0.34 mmol), tBA (1.5 mL, 10 mmol), CuBr$_2$ (0.4 mg, 0.002 mmol), Me$_6$TREN (0.005 mL, 0.02 mmol), and anisole (6.0 mL) were mixed in a Schlenk flask. The reaction mixture was degassed by N$_2$ bubbling for 15 min and then transferred to an oil bath set at 60° C. The reaction was stirred for 2 h and quenched by addition of 5 mL THF and exposure to air. The mixture was passed through a flash column filled with neutral alumina to remove all traces of catalyst. 2.0 g of the PMMA-b-PtBA diblock copolymer was dissolved in 20 mL DCM. While the solution was vigorously stirred, 2.0 mL of TFA was added slowly to the reaction. The reaction was stirred at room temperature for 48 h. PMMA-b-PAA was formed as a translucent solid after removal of solvent and acids in vacuo.

5 B) Synthesis of a PAA-b-PSAN Block Copolymer.

A PtBA macroinitiator was synthesized using the following procedure. EBiB (1.0 g, 6.8 mmol), tBA (10.0 mL, 68.2 mmol), CuBr$_2$ (7.6 mg, 0.03 mmol), Me$_6$TREN (0.091 mL, 0.34 mmol), and anisole (10 mL) were mixed in a Schlenk flask. The reaction mixture was degassed by N$_2$ bubbling for 40 min and transferred an oil bath set at 60° C. immediately. The reaction was stirred for 2 h and quenched by additional 30 mL THF and exposure to air. The mixture was passed through a flash column filled with neutral alumina to remove residual catalyst. The formed PtBA-Br (2.0 g, 0.95 mmol), S (16.4 mL, 142 mmol), AN (3.6 mL, 9.5 mmol), CuBr$_2$ (5.3 mg, 0.024 mmol), Me$_6$TREN (6.3 mg, 0.24 mmol) were mixed in a Schlenk flask. The reaction mixture was degassed by N$_2$ bubbling for 30 min. Meanwhile, Sn(EH)$_2$ (58 mg, 0.24 mmol) in anisole (5.5 mL) was degassed. The Sn(EH)$_2$ solution was injected into the reaction and the mixture were heated to 60° C. in an oil bath. The reaction was monitored with SEC and $^1$H NMR. At the desired conversion, the reaction was quenched by exposure to air and dilution with 15 mL THF. The mixture was passed through a flash column filled with neutral alumina to remove catalyst.

2.0 g of PtBA-b-PSAN diblock copolymer were dissolved in 20 mL DCM. While the solution was vigorously stirred, 2.0 mL of TFA was added slowly to the reaction. The reaction was stirred at room temperature for 48 h. PAA-b-PSAN was obtained as a translucent solid after removal of solvent and acids in vacuo.

5 C) "Grafting-Onto" ZnO Nanoparticles.

2.0 g ZnO nanopowder (US-Nano, 18 nm) and 2.0 g PAA-based diblock copolymer were dissolved in 20 mL THF. The mixture was predispersed with a Misonic S-4000 ultrasonic liquid processor with a #419 Microtip probe at amplitude=70 for 5 min with 1 s interval every second of sonication in an ice bath. The predipersed mixture was then sonicated in a Bransonic CPX1800H bath sonicator at 50° C. for 48 h. The polymer modified ZnO nanoparticles were obtained by centrifuging the white dispersion at 14,000 rpm for 5 min. The nanoparticles were redispersed into THF with a Vortex mixer and centrifuged for 3 cycles to remove the untethered polymer.

Example 6: Synthesis of PSAN-Capped ZnO by Ligand Exchange

6 A) Synthesis of Octylamine-Capped ZnO Nanocrystals.

ZnO nanoparticles were synthesized as reported by Epifani and Weber. *Chem. Mater.,* 2005, 17, (25), 6468 and *J. Mater. Chem. C* 2013, 1, (18), 3098. In a 250-mL three-neck flask equipped with a condenser and a thermometer, $Zn(EH)_2$ (80% in mineral spirits) (45 g, 100.8 mmol) was mixed with 80 mL of DPE and OA (90 mL, 503.97 mmol). The reaction mixture was stirred and heated to 175° C. under a $N_2$ atmosphere. The temperature is maintained for 45 minutes before heating the mixture to 230° C. for another 60 minutes. After cooling to room temperature, the nanoparticles were isolated by precipitation in cold methanol. The resulted products were dispersed in THF. A stock solution of 40 mg $mL^{-1}$ was used for further experiments.

6 B) Synthesis of PSAN Polymer Ligands.

Figure 22:
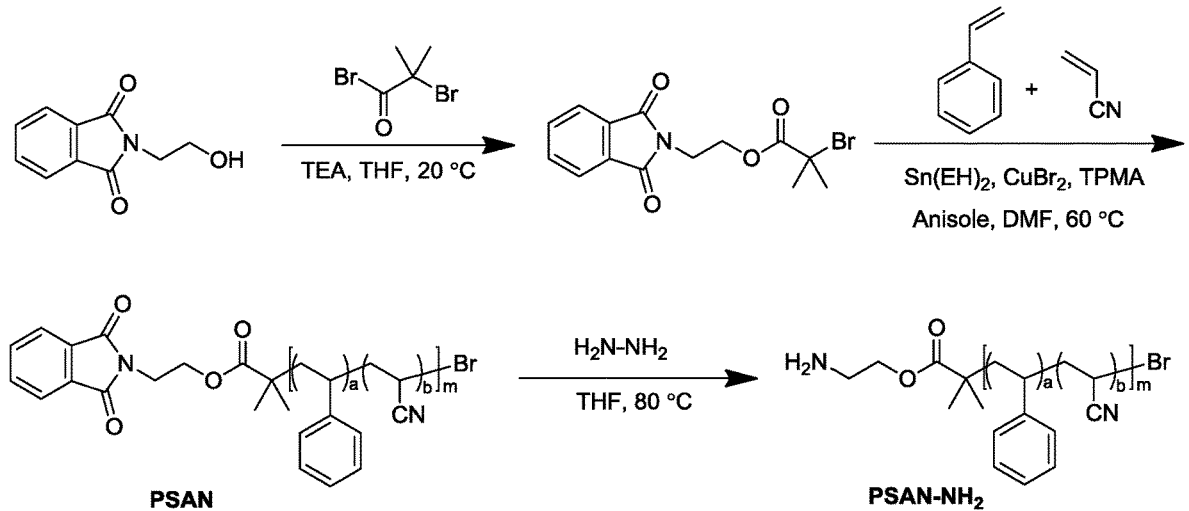
FIG. 22 illustrates a representative embodiment of synthesis of PSAN-NH$_2$ polymer ligands.

Synthesis of PSAN polymer ligands consists of three steps as shown in FIG. 22: a) the synthesis of the initiator, b) ATRP of PSAN and c) deprotection of amine end group. The initiator was synthesized as follows: N-hydroxyethylphthalimide (16.3 g, 81.96 mmol) and TEA (14.28 mL, 102.45 mmol) were dissolved in 200 mL dry THF in a 500 mL round bottom flask fitted with a stirring bar and the contents were stirred in an ice bath, 2-BiB (12.67 mL, 102.45 mmol) was then added drop by drop into the mixture. The flask was stirred for another 24 h under r.t. The mixture was then concentrated and the residue dissolved in 100 mL ethyl acetate. Then it was washed with saturated $NaHCO_3$ aqueous solution (200 mL) twice and brine solution once to remove salt and byproducts. The ethyl acetate was then removed by rotary evaporation.

6 C) Synthesis of PSAN Via ARGET ATRP.

The general ARGET ATRP procedure is described above. The polymerization was carried out with a ratio of St (16 mL, 139.85 mmol), AN (5.5 mL, 83.91 mmol). After the desired time the reaction mixture was exposed to air to stop the polymerization. The product was precipitated by addition to cold hexane, and dried in air. The synthesis and post-purification procedures in each ATRP reaction were similar to the procedures above but with different target degrees of polymerization. In the deprotection of amino end group step, PSAN ligands (8.3 g, 7 mmol, $M_n$=1,200 g/mol) was mixed with dry THF (150 mL) and hydrazine (1.08 mL, 34.5 mmol) in a 250 mL three-neck flask equipped with a condenser and a thermometer. The reaction mixture was stirred and heated to 80° C. under a $N_2$ atmosphere for 8 h. After cooling to room temperature, the non-soluble byproduct was removed by centrifugation. The resulting clear solution was concentrated by rotary evaporation. The product was isolated by precipitation in cold hexane and dried in air. The synthesis and post-purification procedures in other PSAN ligands were similar to the procedures above with the same molar ratio of PSAN/hydrazine. The results are shown in the following Table 6 above.

6 D) Synthesis of PSAN-Capped ZnO by Ligand Exchange.

In a general procedure for ligand exchange between $PSAN-NH_2$ ligand and OA ligand, a OA-capped ZnO stock solution in THF (40 mg $mL^{-1}$, 25 mL) was mixed with DPE (30 mL) and $PSAN-NH_2$ ligands ($M_n$=1,300 g/mol, 300 mg, 0.25 mmol) in a 100 mL two-neck flask equipped with a bubbler. The contents of the flask were bubbled with $N_2$ gas before and during the reaction. The reaction mixture was stirred and heated to 150° C. under a $N_2$ atmosphere. The temperature was maintained for 20 minutes to remove THF solvents. Next, the mixture was heated to 220° C. for another 2 h. After cooling to room temperature the nanoparticles were isolated by precipitation in cold hexane. Ligand exchange between OA and PSAN ligands was driven by the lower boiling point of OA, which is around 180° C. As mentioned before, OA-capped ZnO NPs were stable in THF or hexane for weeks, however, after the ligand exchange reaction, the PSAN-capped ZnO can be completely precipitated by addition to hexane. Compared to previous work using repeated "selective precipitation, centrifugation, dissolving" cycles, [*ACS Nano* 2014, 8, (6), 6114; *Macromolecules* 2015, 48, (15), 5323.] this procedure is a much simpler and more robust procedure. The resulting product can be quickly redissolved in THF and formed clear stable solution used for the further studies.

Several reactions were carried out with different ligands. The conditions are listed in Table 11.

TABLE 11

Summary of ligand exchange reactions of OA-capped ZnO with $PSAN-NH_2$ polymer ligands

| Entry | Ligand composition | $M_n$ [b] (g/mol) | Mass (mg) | Inorganic fraction[c] | Grafting density $(nm^{-2})$[d] |
|---|---|---|---|---|---|
| 1 | $PSAN-NH_2$ | 1,300 | 300 | 47% | 2.5 |
| 2 | $PSAN-NH_2$ | 2,000 | 500 | 36% | 2.4 |
| 3 | $PSAN-NH_2$ | 3,800 | 300 | 45% | 0.9 |
| 4 | $PSAN-NH_2$ | 3,800 | 900 | 28% | 1.9 |
| 5 | $PSAN-NH_2$ | 8,000 | 2000 | 19% | 1.5 |
| 6[e] | OA | 129 | — | 83% | 4.4 |

[a] 1 g OA-capped ZnO nanoparticles were used in all ligand exchange reactions.
[b] Determined by SEC and $^1$HNMR;
[c] determined by TGA;
[d] calculated from inorganic fraction and polymer molar mass assuming all nanoparticles are spherical;
[e] OA-capped ZnO was added here for comparison.

Example 7: Synthesis of PSAN-PAA-PDVB Star-Like Polymers

Figure 23:
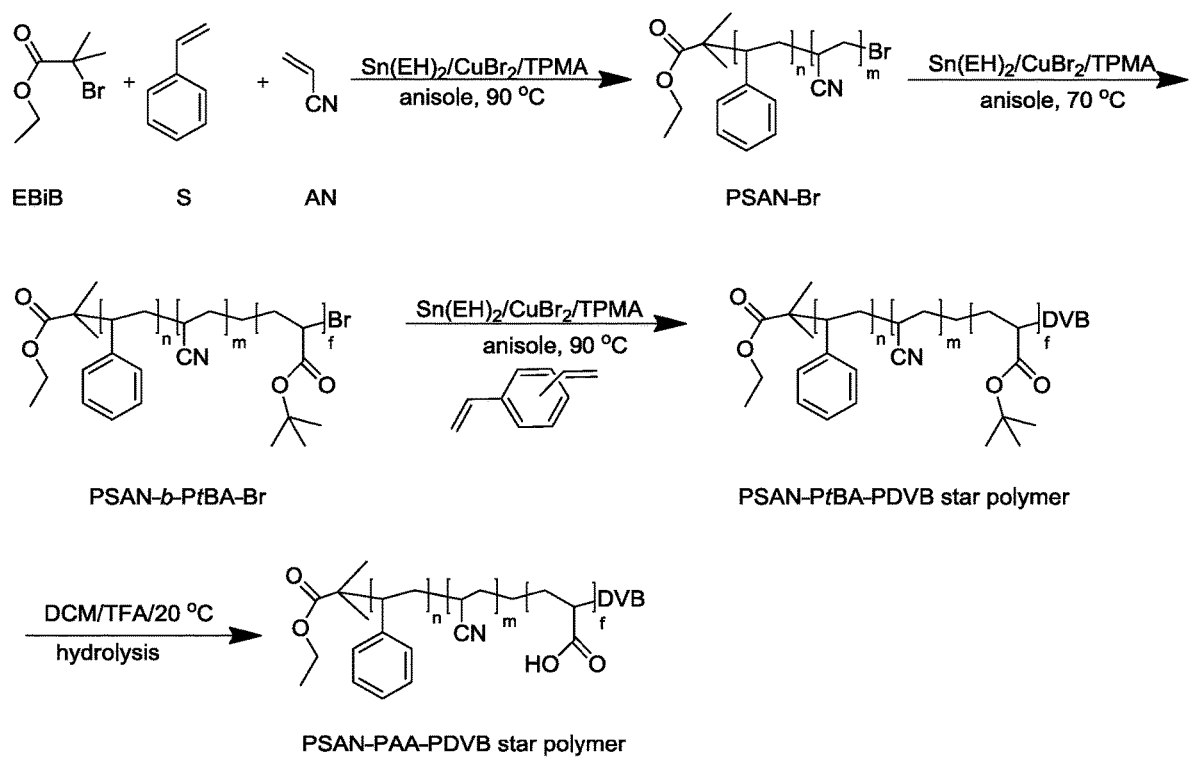
FIG. 23 illustrates a representative embodiment of synthesis of PSAN-PAA-PDVB star polymer templates.

The synthesis of PSAN-PAA-PDVB star-like polymers included four steps: a) synthesis of PSAN-Br macroinitiators (MIs), b) synthesis of PSAN-b-PtBA-Br block copolymer MIs, c) synthesis of PSAN-PtBA-PDVB star-like polymers, and d) hydrolysis of PSAN-PtBA-PDVB star polymers, as shown in FIG. 23.

7 A) Synthesis of PSAN-Br as MIs Via ARGET ATRP.

The ratio of reagents for the ARGET ATRP were: $CuBr_2$ (9.6 mg, 0.43 mmol), TPMA (627.2 mg, 2.1 mmol), Styrene (S) (60 mL, 540 mmol), acrylonitrile (AN) (20 mL, 324 mmol) and anisole (20 mL) and $Sn(EH)_2$ (0.17 mL) and anisole (10 mL) were used as the activator and the polymerization was carried out 70° C. The reaction mixture was kept under these conditions for the desired time and then it was exposed to air to stop the reaction. The product was precipitated by adding the reaction mixture to cold methanol to remove catalyst, and dried in air.

7 B) Synthesis of PSAN-b-PtBA-Br MIs by ARGET ATRP.

The ratio of reagents were: $PSAN_{70}$-Br initiator ($M_n$=5,800 g/mol, 10 g, 1.8 mmol), tBA (60 mL, 545 mmol), $CuBr_2$ (23.1 mg, 0.14 mmol), TPMA (150.5 mg, 0.68 mmol), and anisole (25 mL) and a 0.1 ml of a mixture of $Sn(EH)_2$ (0.59 mL) and anisole (10 mL) was added to the reaction flask to reduce some of the Cu(II) catalyst complex and initiate polymerization. Then the flask was immersed in a 70° C. oil bath At timed intervals, samples were withdrawn and diluted with THF for SEC (with PS calibration) and with $CDCl_3$ for NMR analysis. The reaction mixture was kept under these conditions for the desired time and then it was exposed to air to stop the reaction. Product was precipitated in a cold mixture of methanol/water (volume ratio=1:1) to remove catalyst, and dried under vacuum.

7 C) Synthesis of PSAN-PtBA-PDVB Star Copolymer by ARGET ATRP.

The ratio of reagents were $PSAN_{70}$-b-$PtBA_{40}$-Br MIs ($M_n$=11,000 g/mol, 12 g, 1.09 mmol), DVB (2.18 mL, 15.2 mmol), $CuBr_2$ (2.4 mg, 0.01 mmol), TPMA (31.6 mg, 0.11 mmol), and anisole (80 mL). 0.1 mL of the solution of $Sn(EH)_2$ (0.7 mL) in degassed anisole (10 mL) was injected into the reaction mixture to reduce a fraction of the $CuBr_2$/TPMA complex and initiate the polymerization. The reaction was exposed to air to stop the reaction after 20 h, and the unreacted MIs were removed by precipitation in cold methanol, and product were dried under vacuum.

7 D) Hydrolysis of PSAN-PtBA-PDVB Star Polymers.

2.0 g of PSAN-PtBA-PDVB star polymers were dissolved in 20 mL DCM, 2.0 mL of TFA was added slowly to the reaction while the solution was vigorously stirred. The reaction was stirred at room temperature for 48 h. PSAN-PAA-PDVB star polymer was obtained as a white solid after precipitation from hexane and removal of solvent and acids under vacuum.

7 E) Synthesis of PSAN-Capped ZnO Nanoparticles within the Star Polymer Templates.

The PSAN-PAA-PDVB star polymers were used as templates for formation of ZnO nanoparticles. 100 mg PSAN-PAA-PDVB polymer was dissolved in a 10 ml DMF followed by addition of appropriate amounts of ZnO precursors; $Zn(NO_3)_2$, $Zn(OAc)_2$, $Zn(EH)_2$, that were selectively incorporated into the inner PAA blocks. The molar ratio of AA units in the PAA blocks to precursors was set at 1:10 to ensure the complete loading of precursors into PAA domains. The mixture solutions were stirred at room temperature overnight. Then the mixture was refluxed at 180° C. for 5 h. The transparent ZnO nanocomposites DMF solution was obtained after removing the precipitation.

Polymerization conditions: [tBA]:[BiBEM]:[CuBr]:[$CuBr_2$]:[dNbpy]=500:1:0.61:0.015:1.25, 70° C., 10 vol. % anisole. The arms of the brush copolymer were then chain extended with a ratio of reagents: [S]:[BiBEM]:[CuBr]:[$CuBr_2$]:[PMDETA]=500:300:1:0.95:0.05:1, 70° C., 10 vol. % anisole.

Hydrolysis of the core t-BuA segments gave a brush copolymer with a PAA core with the % PAA=26.1%.

8 B) Loading Zn Precursors Inside of the Brush Polymers.

100 mg of the brush polymer was dissolved in 10 mL of DMF and the loading ratio of Zn precursor to PS-b-PAA brush copolymer to 10:1 in order to optimize loading efficiency. The loading time was adjusted to 12 h under vigorously stirring to confine the Zn precursors inside of P-b-PAA brush copolymer via coordination bond between Zn and —COOH while avoiding the diffusion of Zn precursor loaded inside P-b-PAA brush copolymer out into the solution. The addition of different amounts of benzyl alcohol to DMF after loading of Zn precursors in star copolymer induced collapse of the PS shell to form a more compact shell to confine the Zn precursor inside of PS-b-PAA brush. This was followed by hydrolysis of Zn(PAA) inside of brush macromolecule to form distributed ZnO NPs by refluxing the mixture at 180° C. for 5 hours. After refluxing the reaction mixture was centrifuged to remove the pure ZnO precipitation from the DMF solution. The free ZnO NPs can be removed by filtration because they cannot dissolve in toluene. The clear colorless toluene solution was passed through 0.45 um filter to prepare samples for TEM. The TEM images showed that we obtained NP with diameter of 3-5 nm, and we can see the whole area of the deposited film contains NPs, indicating the yield of the NPs is high. TEM imaging showed the presence of very well defined individual nanofibers with ZnO NPs inside of the brush with N=400 brush generating a nanofiber with a length of about 100 nm with NPs arrange along with the brush to form the nanofibers. These observations indicate that it is possible to control the aggregation of the nanofibers in a matrix and hence the thermal conductivity of the formed composite structure.

TABLE 12

Results of PSAN-PAA-PDVB star polymer templates

| Entry | composition | $M_{n, PSAN}^a$ (g/mol) | $M_{n, PAA}^a$ (g/mol) | $M_{n, star}^a$ (g/mol) | $M_w/M_n^a$ | $D_{h, star}^b$ (nm) | $D_{h, star+ZnO}^c$ (nm) | Amount of $ZnO^d$ | Diameter ZnO $(nm)^e$ |
|---|---|---|---|---|---|---|---|---|---|
| 1 | $PSAN_{70}$-$PAA_{40}$-PDVB | 5,800 | 11,000 | 67,800 | 1.88 | 16 ± 1.8 | 20 ± 2.2 | 11.7% | 3-5 |
| 2 | $PSAN_{70}$-$PAA_{70}$-PDVB | 5,300 | 13,000 | 60,600 | 3.0 | 18 ± 2.0 | 22 ± 1.8 | 17.2% | 3-5 |
| 3 | $PSAN_{70}$-$PAA_{90}$-PDVB | 6,000 | 17,000 | 61,300 | 3.0 | 20 ± 2.2 | 24 ± 2.3 | 27.5% | 3-5 |

$^a$Molecular weights and molecular weights distribution was measured by THF SEC using linear PS standards as calibration;
$^b D_h$ of PSAN-PAA-PDVB star polymer in DMF measured by DLS;
$^c D_h$ of PSAN-PAA-PDVB star polymer loading with ZnO NPs in DMF measured by DLS;
$^d$the amount of inorganic ZnO NPs of hybrid materials measured by TGA;
$^e$the diameter of ZnO NPs measured by TEM.

Example 8: Synthesis of ZnO/PS-b-PAA Brush Nanofibers

8 A) The procedure employed for the synthesis of PS-b-PAA brush copolymers is shown in FIG. 13. After synthesis of the backbone polymer and functionalization of the backbone with an ATRP initiator the synthesis of P(BiBEM-g-$PtBA_{51})_{202}$ was confirmed by analysis of the composition of product which matched the theoretical composition obtained from the kinetic curve of conversion and GPC traces.

Example 9: Synthesis of $TiO_2$/Brush Structures

A further series of brush templates were prepared for loading with titanium dioxide, $TiO_2$. Information of the brush templates used in this study is summarized in Table 13. The DP of PAA block remained about 50 in all templates, while the DP of backbone in linear the linear multifunctional macroinitiator samples that formed the backbone of the brush macromolecules was increased from 56 to 372.

TABLE 13

Structural parameters of brush templates

| Template ID [a] | Parameters [b] | | | | | |
|---|---|---|---|---|---|---|
| | $DP_{Backbone}$ | $DP_{PAA}$ | $DP_{PS}$ | $M_{n,\,theory}$ [d] | $M_{n,\,GPC}$ [e] | Đ [e] |
| $L_{56}\,A_{51}\,S_{73}$ | 56 | 51 | 73 | 812,000 | 319,000 | 1.30 |
| $L_{202}\,A_{51}\,S_{105}$ | 202 | 51 | 105 | 3,570,000 | 692,000 | 1.20 |
| $L_{372}\,A_{47}\,S_{92}$ | 372 | 47 | 92 | 5,900,000 | 845,000 | 1.15 |
| $B_{205}\,A_{53}\,S_{73}$ | 205 [c] | 53 | 73 | 12,000,000 | 951,000 | 1.52 |

[a] L = linear, B = branched.
[b] Calculated based on the monomer to initiator ratio and conversion determined by $^1$H NMR in each step.
[c] Averaged DP of repeat unit at each arm.
[d] Calculated based on molecular parameters.
[e] Determined by SEC using linear PMMA standards.

Nanostructures comprising titania nanoparticles were prepared by loading the brush templates with titanium (IV) 2-ethylhexanoate and refluxing at 180° C. in DMF. Transmission electron microscopy (TEM) images showed the anisotropic structure of the inorganic-polymer hybrids, indicating that the shape of the brush templates was preserved upon loading with the inorganic materials. For bottlebrushes with longer backbone ($L_{372}\,AA_{47}\,S_{92}$ and $L_{202}\,AA_{51}\,S_{105}$), anisotropic nanoparticles with a worm-like structure were observed in the TEM images. Good control over both width and length was established by the statistical analysis of TEM images (see Table 13), which indicated that all particles showed the same diameters, within experimental error, of about 10 nm as a result of the similar DPs of PAA blocks. The inorganic content was evenly distributed along the backbone. On the other hand, the average length of nanoparticles increased from 55 nm to 77 nm as the DP of backbone in the templates increased from 202 to 372. In contrast, the nanoparticles prepared using bottlebrushes with short backbone ($L_{56}\,AA_{51}\,S_{73}$) showed mostly spherically-shaped structures in TEM images. By comparing the length of nanoparticles afforded by different linear brush templates (see Table 13, entries 1-3), the contribution to the length in each backbone could be estimated. Assuming both ends to be hemispheres and the remaining parts to be cylinders, both ends contribute approximately 15 nm in total, while each DPs of backbone gives generates a segment length of 0.17 nm. Hence particles of specific lengths can be prepared using this data.

TABLE 14

TEM characterization of the length ($L_n$) and core diameter ($W_n$) of titania hybrid nanoparticles prepared from templates with different backbones.

| entry | Template ID | $L_n$ (nm) | $L_w/L_n$ [a] | $W_n$ (nm) | $W_w/W_n$ [a] |
|---|---|---|---|---|---|
| 1 | $L_{56}\,A_{51}\,S_{73}$ | 21.8 ± 0.4 | 1.12 | 10.3 ± 0.2 | 1.05 |
| 2 | $L_{202}\,A_{51}\,S_{105}$ | 54.6 ± 0.9 | 1.13 | 10.7 ± 0.2 | 1.05 |
| 3 | $L_{372}\,A_{47}\,S_{92}$ | 77 ± 1 | 1.12 | 11.4 ± 0.3 | 1.04 |
| 4 | $B_{205}\,A_{53}\,S_{73}$ | 47.9 ± 1.0 [b] | 1.09 | 10.6 ± 0.2 | 1.04 |

[a] Dispersity index of titania nanoparticles length or width obtained from TEM images.
[b] Average length of a single arm.

The weight fraction of the inorganic content was measured by thermogravimetric analysis (TGA). The weight fraction of inorganic content was higher than the theoretical value estimated by the assumption that four acrylic acid moieties bind one Ti atom (Table 14). This may, for example, be a result of the nucleation and growth process in the nanoreactor during the formation of nanoparticle. However, certain trends of inorganic content could be identified by comparison between nanoparticles prepared by different templates. The particles prepared using the templates with relatively longer PS chains as outer layers ($L_{202}\,AA_{51}\,S_{105}$ and $L_{372}\,AA_{47}\,S_{92}$) have lower weight fraction of the inorganic content (Table 15, entry 2 and 3).

TABLE 15

TGA results of inorganic content of titania nanoparticles

| entry | Template ID | Weight fraction of inorganic content [a] | Theoretical weight fraction of inorganic content [b] |
|---|---|---|---|
| 1 | $L_{56}\,AA_{51}\,S_{73}$ | 35% | 8% |
| 2 | $L_{202}\,AA_{51}\,S_{105}$ | 21% | 6% |
| 3 | $L_{372}\,AA_{47}\,S_{92}$ | 17% | 7% |
| 4 | $B_{205}\,AA_{53}\,S_{73}$ | 30% | 8% |

[a] Measured by TGA.
[b] Estimated by the assumption that four AA moieties bind one $TiO_2$.

Example 10: Preparation of Larger Nano-Particle Templates

Figure 24:
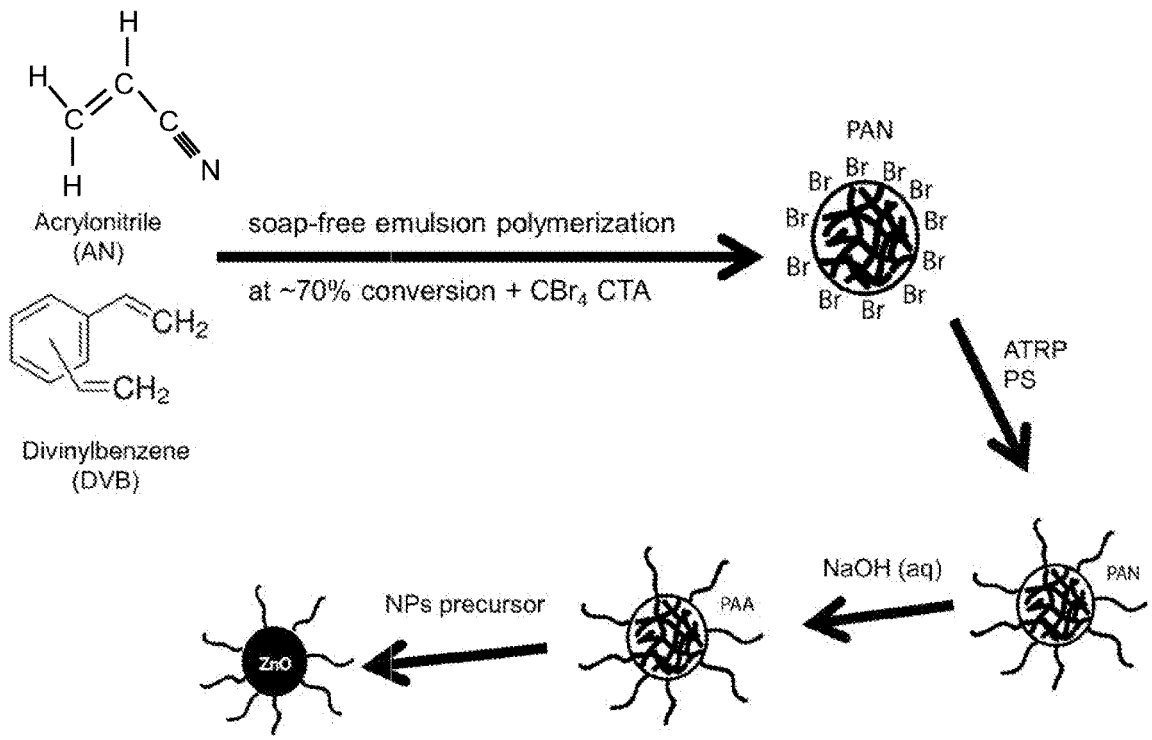
FIG. 24 illustrates schematically a representative embodiment of method of preparation of a functional particle by emulsion polymerization followed by grafting from ATRP of a shell comprising a (co)polymer compatible with the target matrix, followed by hydrolysis of the core of the particle and loading with precursor of selected inorganic core.

The general procedure employed for the preparation of larger templates for in situ formed zinc oxide nanoparticles is shown in FIG. 24. Preparation of a functional particle by emulsion polymerization was followed by a grafting from ATRP of a shell including a (co)polymer compatible with the target matrix. Polymerization was followed by hydrolysis of the core of the particle and loading with precursor of selected inorganic core.

Example 11: Fabrication of Thin and Bulk Films of ZnO/PMMA Hybrid Materials

The PSAN-capped ZnO NPs were dispersed in THF via sonication. The concentration was measured gravimetrically by air-drying 5 mL of the dispersion. Specific amounts of linear poly(methyl methacrylate) (PMMA, $M_n$=120,000) powder and PSAN/OA-capped ZnO NPs dispersion were mixed in order to cast films with a series of different weight fractions of ZnO. After stirring for 24 h, 500 µL of the homogeneous dispersions were diluted with 10 mL THF. Thin films (<100 nm) were prepared by spin casting the diluted solution on silica wafer at the rate of 3000 rpm. The remaining bulk dispersions were transferred into 1.2-inch-diameter cylindrical Teflon molds. After slowly evaporating solvent over 48 h at room temperature, transparent nano-composite films of thickness t~0.5 mm were formed. The residual solvent was removed from the bulk films by transferring it to a vacuum oven and slowly increasing the temperature at the rate of 10° C. per 24 h to 150° C. Four specific bulk film compositions were investigated to systematically to elucidate the effect of surface modification and the inorganic fraction on the thermo-mechanical and optical properties of the formed nanocomposite films. The results are summarized above, [110]-[113] for the four highest quality films.

DSC was employed to measure the Tg of these bulk films and compared to the value obtained for pure PMMA. The DSC of pure PMMA films Tg=103.3° C., while that of 05% PMMA/ZnO bulk films provided a Tg=98.5° C., due to the presence of 14 wt % PSAN; 10% PMMA/ZnO bulk films Tg=92.5° C. (32 wt % PSAN); and 29% PMMA/ZnO bulk films Tg=83.3° C. (40 wt % PSAN) respectively. This information indicates that as the content of PSAN in the composite matrix increase, the Tg of the bulk film will decrease, and there is only one single Tg in the plot, which means there is no polymer phase separation in the bulk composite films.

Example 12. Preparation of PPMS Composite Films

12 A) Reaction of TES-Vinyl@$Al_2O_3$+PPMS-(CH=$CH_2$)$_2$ (OE-6630 A)+PPMS-H (OE-6630 B). (10 wt % alumina)

A 1) Silane-modified alumina particles were prepared using the following procedure: 1 g of alumina particles was dispersed in 15 ml of solvent (ethanol or THF), then 0.3 ml of vinyltriethoxysilane or triethoxysilane was added dropwise. The reaction mixture was stirred at 60° C. for 12 h. The particles were then collected via centrifugation and washed via three repetitive centrifugation\sonication in THF cycles. The particles were then air-dried.

A 2) 0.05 g of TES-H@$Al_2O_3$ (the @ symbol indicates that the TES-H functional group is present on the surface of the $Al_2O_3$ particle) was dispersed in 0.5 ml of THF and sonicated for 30 min. Then 0.5 ml of PPMS-hydrosilane (OE-6630 B) was added and the mixture was vortexed then a further 0.5 ml of PPMS-divinyl was added and the mixture was vortexed again and cured at 100° C. for 60 min. Before curing the material was liquid. After curing the material was a solid resin that can be extracted from the flask. 30 and 50 wt % PPMS composites were successfully prepared using the THF method and the 50 wt % composite formed a semi-transparent film.

B 1) Preparation of PPMS-Dicarboxylic Acid:

2.0 g (0.58 mmol) MP153SP (PPMS, DP 25, Dow Corning), 0.49 g (1.7 mmol) V-501, and 0.12 mL (1.7 mmol) ethanedithiol are dissolved in 20 mL acetonitrile. The mixture was bubbled with nitrogen for 10 min and heated up to 80° C. After stirring at 80° C. overnight, the solvent was removed in vacuo and 50 mL ethyl acetate was added to dissolve the polymer. The solution was washed sequentially with water and brine, and dried over anhydrous sodium sulfate. The product was obtained after removal of the solvent.

In initial experiments, there were problems with preparation of good films. The inorganic particles did not mix well with PPMS components, so they were both dispersed in common solvent, THF. However, upon THF evaporation many bubbles formed in the films. The procedure was modified to obtain smooth bubble-free films and was further applied for preparation of all PPMS composites and it works quite well. The final procedure included: 1) dispersing inorganic particles (alumina, ZnO or silica) in THF in a sonicator bath for 60 min. Typically, 0.5 g of particles is dispersed in 2-3 ml of THF in a closed vial. 2) Addition of OE-6630 B component to the dispersion, followed by 30 sec vortexing. 3) Addition of OE-6630 A component (catalyst carrier), followed by 30 sec vortexing. 4) Transfer the mixture into circular Teflon mold, 25 or 35 mm in diameter, sealed with a Teflon film at the bottom. 5) Evaporation of THF over 4-12 h in open air at room T, or evaporation of THF at 70 C for 1 h. 6) Placing the mold with mixture to the oven preheated to 120 C for 4-12 h. 7) Removing the cured film from the mold.

B 2) Particle Modification with PPMS:

2.0 g ZnO nanopowder (US-Nano, 18 nm) and 2.0 g of the modified PPMS-dicarboxylic acid prepared above was mixed in 20 mL THF. The mixture was probe-sonicated for 5 min at amplitude 70. The resulting dispersion was left in a sonication bath at 50° C. for 48 h. The product was collected and washed with THF via 3 cycles of centrifugation and sonication redispersion. The DLS of the particles displayed aggregation at the upper limit of DLS. The aggregation of ZnO nanoparticles might be induced by bridge formation of the bifunctional PPMS. The total inorganic content of the material was measured via TGA to be 83.1%, which was converted to 76.5 wt % ZnO or $\sigma$=0.74 $nm^{-2}$.

B 3) Mold-Casting of Composite Films:

PPMS modified ZnO was mixed with OE6630 resin precursors, at ratio of A:B=1:4, in THF to provide an overall weight concentration of 300-350 mg/mL. The mixture was sonicated for 60 min to achieve a white dispersion. The dispersion was placed into a PTFE mold and the solvent was allowed to evaporate, the sample was transferred into 120° C. oven and cured overnight. No cracks were observed after solvent evaporation. However, cracks were observed after curing. It is believed that this may, for example, be a result of catalyst poisoning by carboxylic acid or amine. Additional Karstedt's catalyst may be added to the curing process.

Example 13. Preparation of PPMS Composite Films Via Ligand Exchange

Figure 25:
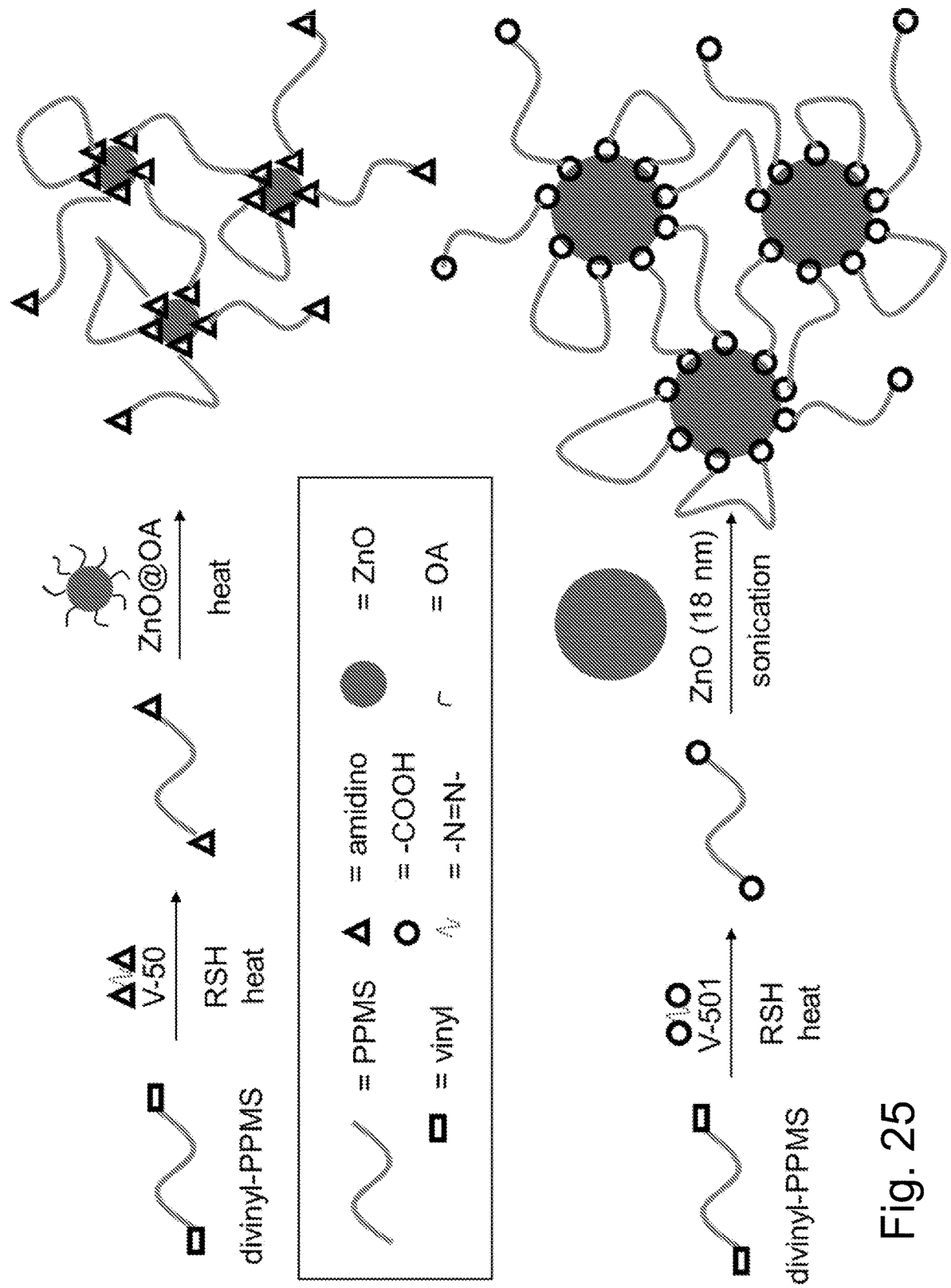
FIG. 25 illustrates schematically a representative embodiment of a method for ligand exchange during reaction with PPMS matrix forming reagents

OA-Capped ZnO NPs in PDMS Matrix:

The procedure employed for the preparation of PPMS composite films via ligand exchange is shown in FIG. 25. By imbedding PDMS and OA-capped ZnO in PDMS matrix, it is possible to cast solid and robust films. However, the transparency decreased significantly when filling fraction become higher. Table 16 lists the inorganic content (both weight and volume fraction are included) and thermal conductivity of PDMS and OA-capped ZnO in PDMS matrix. The results show that the thermal conductivity increased as the inorganic content increased. Therefore, to further increase thermal conductivity, one may increase the inorganic content of the mixture. However, because of the long chains on the surface of the nanoparticle, the inorganic content of PDMS-capped ZnO was limited to 57 wt % while the OA-capped ZnO could reach as high as 85 wt %.

TABLE 16

Inorganic content and thermal conductivity of composite films containing PDMS and OA-capped ZnO in a PDMS matrix.

| Sample | wt % ZnO | volume % ZnO | K W/m*K |
|---|---|---|---|
| LZ-40(PDMS-capped ZnO) | 15.5 | 3.2 | 0.2 |
| LZ-46(PDMS-capped ZnO) | 30 | 7.1 | 0.31 |
| LZ-54 | 40 | 10.6 | 0.33 |
| LZ-58 | 46 | 13.2 | 0.37 |

13 A) OA-capped ZnO NPs were synthesized using Zn(EH)$_2$ as ZnO NP precursor. The existence of large amount of excess OA in the solution prevents the aggregation of ZnO NPs and resulted in uniform size distribution (~5 nm). The synthesis was successful with high yield, high inorganic content (~85 wt %, measured by TGA) and high surface grafting density, calculated as 4.4/nm$^2$. The high inorganic content assists in increasing of thermal conductivity, and the small particle size reduces scattering losses and increase dispersion of nanocomposites in the matrix. However, small nanoparticle size results in large interfacial area may reduce thermal conductivity of composites.

13 B) After synthesis, the OA-capped ZnO NPs were dispersed in THF and the concentration of solids in the solution was measured gravimetrically by air-drying 2 mL of the dispersion. Then, specific amount of PDMS precursor and crosslinker were weighted and dissolved in 1 mL THF. The two components were well mixed by vortex mixture. After that, a predetermined amount of OA-capped ZnO was added into the mixture and vortex mixed for 5 min. Finally, 104 of catalyst, diluted in THF, (20 mg/mL) was added into the solution and vortex mixed for 3 min. The solution was then poured into a 3.5 cm TEFLON mold and solvent was allowed to evaporate at a low evaporation rate (with aluminum foil and Teflon paper covered the top) at room temperature over 96 h.

TABLE 17

Inorganic content and thermal conductivity of OA-capped ZnO in PDMS matrix.

| Sample | wt % ZnO | volume % ZnO | K W/m*K |
|---|---|---|---|
| LZ-99 | 41 | 11.02 | 0.25 |
| LZ-118 | 56.5 | 18.80 | 0.28 |
| LZ-119 | 54.8 | 17.77 | 0.28 |

Free-standing samples obtained from the procedures herein (with high inorganic content, up to 60 wt %) demonstrated significantly improved transparency which could be attributed to the improvement of the purification process after the synthesis. The thermal conductivity of the films was measured using the same instrument and same parameter settings Table 17 shows the results from thermal conductivity measurement and the corresponding inorganic content. The data indicate that the thermal conductivity increased to 0.28 W/m*K as the filling fraction is 56.5 wt %. However, when compared with previous data, no trend was observed between filling fraction and thermal conductivity.

Hexylamine (HA) and butylamine (BA) have a lower b.p. than octylamine (OA), (OA~130° C., HA~110° C., BA~80° C.). Therefore, a lower reaction temperature was applied for some of the reactions, especially BA, instead of 220° C., 190° C. was used. All the reactions were conducted with same molar ratio between the Zn precursors and amine surfactant 1:5, but the reaction temperature is different OA: 220° C., HA: 190° C., BA: 190° C. According to TEM, all of the products look uniform. The DLS shows usually OA-capped ZnO have larger size (from 6-8 nm), while the HA and BA particles shows smaller size (from 4-6 nm). Three reactions were carried out for each ligand and while there are some measurement errors or small aggregations during typically reactions, the products were dispersed in a bulk PDMS film and HA-capped ZnO and BA-capped ZnO cast high quality bulk films (PDMS matrix), which look similar to OA-capped ZnO NPs in PDMS. TEM showed that all ZnO particles were well-dispersed on the PDMS matrix and provide thermally stable films, i.e. no thermal degradation and furthermore the ZnO can be dispersed in densely crosslinked PDMS matrices.

When OA-capped ZnO is imbedded into the PDMS matrix, the refractive index of the composite material could be estimated by Maxwell Garnett theory for a binary system. The theory could be expressed as:

$$n_{eff}^2 = n_m^2\left[1 + \frac{3fx}{1-fx}\right] \quad (4)$$

where $$x = \frac{n_{NP}^2 - n_m^2}{n_{NP}^2 + 2n_m^2};$$

and n$_{NP}$ and n$_m$ represents the RI of the nanoparticles and matrix, respectively; f is the volume fraction of the imbedded nanoparticles.

HA- and BA-capped ZnO are expected to have higher RI compare to OA, since the alkyl chains are shorter, which means they can form thinner shell on the surface of ZnO. Therefore, after forming solutions of all the samples, (concentrations of capped-ZnO particles are all 30 mg/mL) three different thin films of OA-, HA-, BA-capped ZnO were prepared. The results are provided in Table 18,

TABLE 18

RI of OA-, HA- and BA-capped ZnO in PDMS matrix.

| | OA | | HA | | BA | |
| | Thickness | RI | Thickness | RI | Thickness | RI |
|---|---|---|---|---|---|---|
| | 66.3 | 1.568 | 51.8 | 1.627 | 59.1 | 1.603 |
| | 66 | 1.57 | 51.6 | 1.622 | 57.2 | 1.616 |
| | 64.4 | 1.573 | 50.1 | 1.625 | 56.6 | 1.614 |
| | | | 49.9 | 1.637 | 55.3 | 1.625 |
| | | | 50.9 | 1.626 | 56.2 | 1.621 |
| | | | 51.2 | 1.629 | 57.3 | 1.619 |
| | | | 50.8 | 1.636 | 58.7 | 1.614 |
| | | | 50.3 | 1.635 | 57.3 | 1.605 |
| | | | 50.5 | 1.639 | 57.8 | 1.614 |
| avg | 65.56666667 | 1.57033 | 50.7889 | 1.63067 | 57.2778 | 1.61456 |
| error | 1 | 0.002 | 1.1 | 0.009 | 2.1 | 0.011 |

Thickness is in nm, and RI measured by ellipsometer.

The results have larger error for RI measurement, which could indicate that there is something wrong with the measurement. Although HA- and BA-capped ZnO do exhibit a higher RI than OA-capped ZnO, the RI of OA-capped ZnO are lower than previous results and are also lower than the theoretical values. Nevertheless, in all instances the RI increased when the ZnO nanoparticles are added.

Example 14: Silica-PPMS Composites

Pristine and vinyl-modified silica particles with a diameter of 15 nm and 120 nm were dispersed/reacted with OE-6630 and PMV-HPM as matrix precursors. Table 19 provides results for the series of experiments. Solvents for the silica particles were methyl isobutyl ketone (MIBK) or tetrahydrofuran (THF).

TABLE 19

Pristine and vinyl-modified silica particles with a diameter of 15 nm and 120 nm dispersed/reacted with OE-6630 and PMV-HPM as matrix precursors

| Sample | PPMS matrix | Silica size | Silica solvent | Silica surface | Silica load, wt % | Result |
|---|---|---|---|---|---|---|
| AK-132 | OE-6630, 1A:4B | 15 | MIBK | pristine | 50 | solid, transp, brittle |
| AK-133 | OE-6630, 1A:4B | 120 | THF | pristine | 50 | solid, white, brittle |
| AK-134 | OE-6630, 1A:4B | 120 | THF | vinyl-TMS | 50 | solid, semitran, flex |
| AK-135 | OE-6630, 1A:4B | 15 | THF | vinyl-TMS | 50 | liquid, trans |
| AK-136 | PMV-9925 6:1 HPM-501 + cat (750 ppm). | 120 | THF | pristine | 50 | solid, white, cracked |
| AK-137 | PMV-9925 6:1 HPM-501 + cat (750 ppm). | 120 | THF | vinyl-TMS | 50 | solid, trans, flex |
| AK-138 | PMV-9925 6:1 HPM-501 + cat (750 ppm). | 15 | MIBK | pristine | 50 | solid, white, cracked |
| AK-139 | PMV-9925 6:1 HPM-501 + cat (750 ppm). | 15 | THF | vinyl-TMS | 50 | solid, trans, flex |
| AK-140 | OE-6630, 1A:4B | 15 | THF | vinyl-TMS | 75 | solid, white, brittle |
| AK-141 | OE-6630, 1A:4B | 120 | THF | vinyl-TMS | 75 | liquid, semitrans |
| AK-142 | OE-6630, 1A:4B | 15 | MIBK | pristine | 75 | solid, trans, brittle |
| AK-143 | PMV-9925 6:1 HPM-501 + cat (750 ppm). | 15 | THF | vinyl-TMS | 75 | solid, trans, flex |
| AK-144 | PMV-9925 6:1 HPM-501 + cat (750 ppm). | 120 | THF | vinyl-TMS | 75 | solid, trans, brittle |

The results of Table 19 indicate that functionalization of the silica particles provides a method for preparation of crack- and bubble-free siloxane composites with high inorganic content (50-75 wt %).

Example 16: Binary Blends of Larger SiO₂ nm Particles with 5 nm ZnO Particles in a PDMS Matrix Blends of 120 nm $SiO_2$ and 15 nm $SiO_2$ particles with 5 nm ZnO in the precursors of PDMS matrix were prepared in the presence and absence of THF as a solvent. The results are summarized in the following table and show that at 40 vol % and 55 vol % thermal conductivity was enhanced in the presence of a binary mixture of particles and was greater than 0.5 W/mK.

TABLE 20

Binary mixtures for particle template creation.

| Sample | Composition | φ (wt %) | φ (vol %) | Thickness mm | K W/m*K |
|---|---|---|---|---|---|
| 1 | 120 nm $SiO_2$:ZnO = 10:1 | 68% | 40 | 0.75 | 0.51 |
| 2 | 120 nm $SiO_2$:ZnO = 10:1 | 68% | 40 | 0.7 | 0.49 |
| 3 | 120 nm $SiO_2$:ZnO = 10:1 | 79% | 55 | 0.65 | 0.54 |
| 4 | 120 nm $SiO_2$:ZnO = 10:1 | 79% | 55 | 0.6 | 0.64 |
| 5 | 120 nm $SiO_2$:ZnO = 8:1 | 57% | 30 | 0.6 | 0.39 |
| 6 | $SiO_2$:ZnO = 8 15 nm $SiO_2$:120 nm $SiO_2$ = 2 | 57% | 30 | 0.6 | 0.34 |
| 7 | Pure ZnO | 50% | 18 | 0.85 | 0.29 |

The light transmission values are shown in FIG. 21. The binary blends can be separated into three systems, a) the 15 nm silica with 5 nm ZnO system, which have the highest transmission; b) the mixture of all three different NPs, in which, after adding the larger 120 nm silica particles, the transparency of the film decrease, even at same weight percentage of inorganic content and c) 120 nm silica with ZnO NPs systems, which have the lowest transmission in FIG. 21, wherein even at 55 vol % the film still has about 60% transmission at 800 nm wavelength.

What is claimed is:

1. A composition formed by dispersing at least a plurality of first particles and a plurality of second particles within a matrix material comprising a polymeric material or a precursor for the polymeric material, the second particles being different from the first particles, each of the plurality of second particles comprising a core comprising a metal oxide or a metal and a plurality of groups tethered to the core, the plurality of groups tethered to the core increasing dispersability of the second particles within the matrix material as compared to the unmodified core or comprising functionality to react with at least one component of the matrix material, wherein the plurality of first particles interacts with the plurality of second particles to determine a spatial distribution of the plurality of second particles within the matrix material via at least one of (i) volume exclusion, and each of the plurality of second particles is positioned within the matrix material within interstitial space defined by the plurality of the first particles or (ii) repulsion, and, in the case that the matrix material comprises the precursor for the polymeric material, the precursor for the polymeric material being converted to the polymeric material subsequent to dispersing the plurality of first particles and the plurality of second particles therein.

2. The composition of claim 1 wherein the groups tethered to the cores of the second particles are $C_3$-$C_{18}$ alkylamino groups.

3. The composition of claim 1 wherein the core of each of the plurality of second particles comprises at least one of titanium, zirconium, iron, lead, zinc, gold, silver, platinum, tin, aluminum, barium, cadmium, calcium, copper, magnesium, selenium, antimony, lanthanum, ytterbium, tungsten, indium, cerium or iridium or an oxide thereof.

4. The composition of claim 1 wherein at least one of the cores of each of the plurality of second particles comprises at least one of aluminum oxide, titanium oxide, zirconium oxide, iron oxide, or zinc oxide.

5. The composition of claim 1 wherein the core of each of the plurality of second particles has a thermal conductivity k greater than 1 W/mK.

6. The composition of claim 1 wherein an average diameter of the plurality of first particles is greater than 20 nm and an average diameter of the plurality of second particles is less than 20 nm.

7. The composition of claim 1 wherein the tethered groups on the cores of the second particles comprise a copolymer compatible with or reactive with the matrix material to enhance dispersion of particles therein.

8. The composition of claim 7 wherein the second particles are formed via formation of the core of the second particles within a plurality of chains of the copolymer via addition of a precursor comprising a metal to the copolymer that interacts with at least one of the plurality of chains of the copolymer via one or more functional groups on the at least one of the plurality of chains of the copolymer, wherein metal of the precursor is converted to a metal oxide after addition of the precursor to the plurality of chains of the copolymer.

9. The composition of claim 8 wherein the copolymer comprises a phase separated macromolecule wherein one phase can interact with the precursor.

10. The composition of claim 9 wherein the copolymer comprises an inner segment interactive with the precursor of the inorganic core and an outer segment compatible or reactive with the matrix material.

11. The composition of claim 10 wherein the chains of the copolymer are extending chains of a star macromolecule, a linear brush macromolecule or a branched brush macromolecule.

12. The composition of claim 11 wherein the second particles comprise a corona of one of the chains of the copolymer grafted to the core.

13. The composition of claim 1 wherein the core comprises a metal oxide and groups are tethered on a surface of the metal oxide via a grafting from process, a grafting to process, or a ligand exchange process.

14. A composition formed by dispersing at least a plurality of first particles, a plurality of second particles and a plurality of third particles within a matrix material comprising a polymeric material or a precursor for the polymeric material, the second particles being different from the first particles, the third particles being different from the first particles and the second particles, wherein interaction between the plurality of second particles and the plurality of first particles and the plurality of third particles determines a spatial distribution of the plurality of second particles within the matrix material and wherein each of the plurality of the second particles comprise a core comprising a metal oxide, a metal or silica and a plurality of groups tethered to the core, the plurality of groups tethered to the core increasing dispersability of the second particles within the matrix material as compared to the unmodified core or comprises functionality to react with at least one component of the matrix material.

15. The composition of claim 14 wherein the groups tethered to the cores of the second particles are $C_3$-$C_{18}$ alkylamino groups.

16. The composition of claim 14 wherein the matrix material is a precursor material for a siloxane polymer or a precursor for an acrylic polymer.

17. The composition of claim 16 wherein the composition is a component of a phosphor conversion matrix.

18. The composition of claim 14 wherein the matrix material is a precursor material for a siloxane polymer or a thermoplastic polymer.

19. The composition of claim 14 wherein at least one of the first particles or the third particles comprise $SiO_2$, polydimethylsiloxane, poly(styrene-acrylonitrile) or poly(alkyl methacrylate).

20. The composition of claim 14 wherein at least one of the first particles or the third particles comprise a core comprising $SiO_2$ and one or more groups tethered to the core.

21. The composition of claim 14 wherein the second particles are present in a sufficient volume fraction so that the composition has a thermal conductive greater than 0.5 W/mK.

22. A composition formed by dispersing at least a plurality of first particles within a matrix material comprising a polymeric material or a precursor for the polymeric material and dispersing at least a plurality of second particles within the matrix material, the second particles being different from the first particles, wherein interaction between the at least a plurality of second particles and the at least a plurality of first particles determines a spatial distribution of the plurality of second particles within the matrix material, wherein each of the plurality of the second particles comprises a core comprising α-alumina and a plurality of groups tethered to the core, the plurality of groups tethered to the core increasing dispersability of the second particles within the matrix material as compared to the unmodified core or comprising functionality to react with at least one component of the matrix material.

23. The composition of claim 22 wherein the surface of core is formed by functionalization of α-alumina in a strong acid, a saturated solution of a base or a molten base.

24. The composition of claim 23 wherein particles of α-alumina are functionalized by treatment with a saturated aqueous solution of MOH or molten MOH to increase the concentration of hydroxyl groups on a surface thereof or through reaction with molten $M_2S_2O_7$, to form sulfate groups on the surface thereof, which are then converted to hydroxyl groups, and the hydroxyl groups are subsequently converted to a functionality capable of initiating a polymerization to form grafted polymer chains, wherein M is a group 1 or group 2 metal atom.

25. The composition of claim 24 wherein the surface hydroxyl groups are reacted with reagents including one or more groups reactive with the hydroxyl groups and further comprising functionality to initiate a reversible deactivation radical polymerization.

26. A method of forming a composition, comprising: dispersing at least a plurality of first particles within a matrix material comprising a polymeric material or a precursor for the polymeric material and dispersing at least a plurality of second particles with the matrix, the second particles being different from the first particles, each of the at least a plurality of second particles comprising a core comprising a metal oxide or a metal and a plurality of groups tethered to the core, the plurality of groups tethered to the core increasing dispersability of the second particle within the matrix material as compared to the unmodified core or comprising functionality to react with at least one component of the matrix material, wherein the at least a plurality of first particles interact with the at least a plurality of second particles to determine a spatial distribution of the plurality of second particles within the matrix material via at least one of (i) volume exclusion, and each of the at least plurality of second particles is positioned with the matrix material within interstitial space defined by the plurality of the first particles or (ii) repulsion, and, in the case that the matrix material comprises the precursor for the polymeric material, the method further comprises converting the precursor for the polymeric material to the polymeric material subsequent to dispersing the plurality of first particles and the plurality of second particles therein.

* * * * *